(12) United States Patent
Kamada et al.

(10) Patent No.: US 12,219,852 B2
(45) Date of Patent: Feb. 4, 2025

(54) DISPLAY DEVICE, DISPLAY MODULE, AND ELECTRONIC DEVICE INCLUDING A LIGHT-RECEIVING ELEMENT AND LIGHT-EMITTING ELEMENTS

(71) Applicant: Semiconductor Energy Laboratory Co., Ltd., Kanagawa-ken (JP)

(72) Inventors: Taisuke Kamada, Saitama (JP); Daisuke Kubota, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 652 days.

(21) Appl. No.: 17/422,527

(22) PCT Filed: Jan. 6, 2020

(86) PCT No.: PCT/IB2020/050044
§ 371 (c)(1),
(2) Date: Jul. 13, 2021

(87) PCT Pub. No.: WO2020/148600
PCT Pub. Date: Jul. 23, 2020

(65) Prior Publication Data
US 2022/0115446 A1    Apr. 14, 2022

(30) Foreign Application Priority Data

Jan. 18, 2019 (JP) .................................. 2019-006569
Jul. 17, 2019 (JP) .................................. 2019-132202

(51) Int. Cl.
*H10K 59/38* (2023.01)
*H10K 50/858* (2023.01)
(Continued)

(52) U.S. Cl.
CPC ........... *H10K 59/38* (2023.02); *H10K 50/858* (2023.02); *H10K 50/865* (2023.02); *H10K 59/122* (2023.02)

(58) Field of Classification Search
CPC ...... H10K 59/38; H10K 59/40; H10K 59/122; H10K 50/858; H10K 50/865; H10K 59/351; H01L 27/146; Y02F 10/549; G02B 5/201
See application file for complete search history.

(56) References Cited

U.S. PATENT DOCUMENTS 7,586,254 B2 *  9/2009  Kwak .................. H10K 59/128
                                                    313/506
7,679,283 B2 *  3/2010  Nimura ................ H10K 59/128
                                                    313/506
(Continued)

FOREIGN PATENT DOCUMENTS

CN        103000655 A        3/2013
CN        103022072 A        4/2013
(Continued)

OTHER PUBLICATIONS

International Search Report (Application No. PCT/IB2020/050044) Dated Mar. 24, 2020.
(Continued)

*Primary Examiner* — Khiem D Nguyen
(74) *Attorney, Agent, or Firm* — Husch Blackwell LLP

(57) ABSTRACT

A display device having a light detection function is provided. A highly convenient display device is provided. The display device includes a light-receiving element, a first light-emitting element, and a second light-emitting element in a display portion. The light-receiving element includes a first pixel electrode, an active layer, and a common electrode. The first light-emitting element includes a second pixel electrode, a first light-emitting layer, and the common
(Continued)

electrode. The second light-emitting element includes a third pixel electrode, a second light-emitting layer, and the common electrode. The active layer includes an organic compound. The active layer is positioned between the first pixel electrode and the common electrode. The first light-emitting layer is positioned between the second pixel electrode and the common electrode. The second light-emitting layer is positioned between the third pixel electrode and the common electrode. The first light-emitting layer is further positioned between the first pixel electrode and the common electrode and/or between the third pixel electrode and the common electrode.

20 Claims, 22 Drawing Sheets

(51) Int. Cl.
*H10K 50/86* (2023.01)
*H10K 59/122* (2023.01)

(56) References Cited

U.S. PATENT DOCUMENTS

| | | | | |
|---|---|---|---|---|
| 8,058,657 | B2* | 11/2011 | Lee | H10K 59/13 |
| | | | | 438/30 |
| 8,212,280 | B2* | 7/2012 | Ikeda | H10K 59/122 |
| | | | | 257/639 |
| 8,288,780 | B2* | 10/2012 | Yang | H10K 59/124 |
| | | | | 313/506 |
| 8,520,114 | B2 | 8/2013 | Cok et al. | |
| 8,729,528 | B2 | 5/2014 | Klem et al. | |
| 8,742,398 | B2 | 6/2014 | Klem et al. | |
| 9,004,972 | B2* | 4/2015 | Choi | H05B 33/04 |
| | | | | 313/506 |
| 9,054,262 | B2 | 6/2015 | Lewis et al. | |
| 9,155,498 | B2 | 10/2015 | Akiyama | |
| 9,167,994 | B2 | 10/2015 | Akiyama | |
| 9,214,505 | B2 | 12/2015 | Higo et al. | |
| 9,245,934 | B2* | 1/2016 | Chung | H10K 50/82 |
| 9,349,970 | B2 | 5/2016 | Klem et al. | |
| 10,032,834 | B2 | 7/2018 | Udaka et al. | |
| 10,217,803 | B2* | 2/2019 | Ryu | H10K 59/121 |
| 2008/0252223 | A1* | 10/2008 | Toyoda | G09G 3/3225 |
| | | | | 315/169.3 |
| 2012/0307123 | A1 | 12/2012 | Cok et al. | |
| 2013/0062635 | A1* | 3/2013 | Higo | H10K 59/353 |
| | | | | 257/E33.061 |
| 2013/0075761 | A1* | 3/2013 | Akiyama | H10K 65/00 |
| | | | | 257/E31.095 |
| 2014/0028176 | A1* | 1/2014 | Kang | F21V 11/00 |
| | | | | 445/24 |
| 2016/0174847 | A1* | 6/2016 | Tsuchiya | A61B 5/0082 |
| | | | | 600/476 |
| 2017/0133438 | A1 | 5/2017 | Seo | |
| 2017/0330920 | A1 | 11/2017 | Tanaka et al. | |

FOREIGN PATENT DOCUMENTS

| | | |
|---|---|---|
| CN | 103582948 A | 2/2014 |
| CN | 104157665 A | 11/2014 |
| CN | 105708413 A | 6/2016 |
| EP | 2 483 925 | 8/2012 |
| EP | 2 568 505 A2 | 3/2013 |
| EP | 2 715 791 | 4/2014 |
| EP | 3 035 244 A1 | 6/2016 |
| JP | 2006-089597 A | 4/2006 |
| JP | 2008-262176 A | 10/2008 |
| JP | 2010-257672 A | 11/2010 |
| JP | 2013-506302 | 2/2013 |
| JP | 2013-058423 A | 3/2013 |
| JP | 2013-073965 A | 4/2013 |
| JP | 2014-197522 A | 10/2014 |
| JP | 2014-527321 | 10/2014 |
| JP | 2016-112279 A | 6/2016 |
| JP | 6118606 | 4/2017 |
| JP | 2018-037356 A | 3/2018 |
| KR | 2013-0028655 A | 3/2013 |
| KR | 2013-0033278 A | 4/2013 |
| KR | 2014-0041511 A | 4/2014 |
| TW | 201307947 | 2/2013 |
| TW | 201316495 | 4/2013 |
| TW | 201603262 | 1/2016 |
| WO | WO 2011/041407 A1 | 4/2011 |
| WO | WO 2011/041421 A1 | 4/2011 |
| WO | WO 2012/166162 A1 | 12/2012 |
| WO | WO-2014/024582 | 2/2014 |
| WO | WO-2015/144298 | 10/2015 |
| WO | WO 2020/053692 A1 | 3/2020 |

OTHER PUBLICATIONS

Written Opinion (Application No. PCT/IB2020/050044) Dated Mar. 24, 2020.

Taiwanese Office Action (Application No. 109100278) Dated Oct. 30, 2023.

* cited by examiner

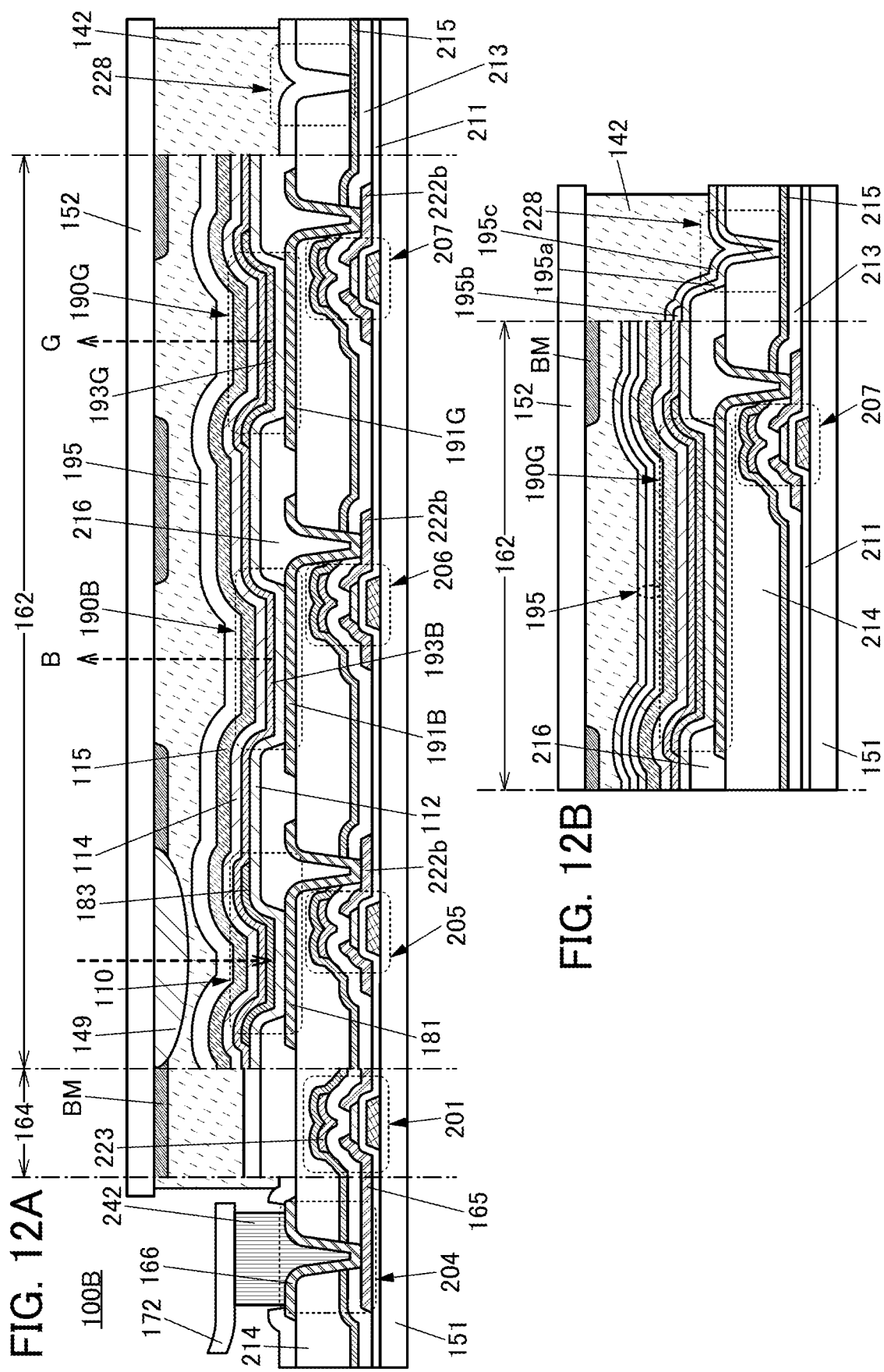

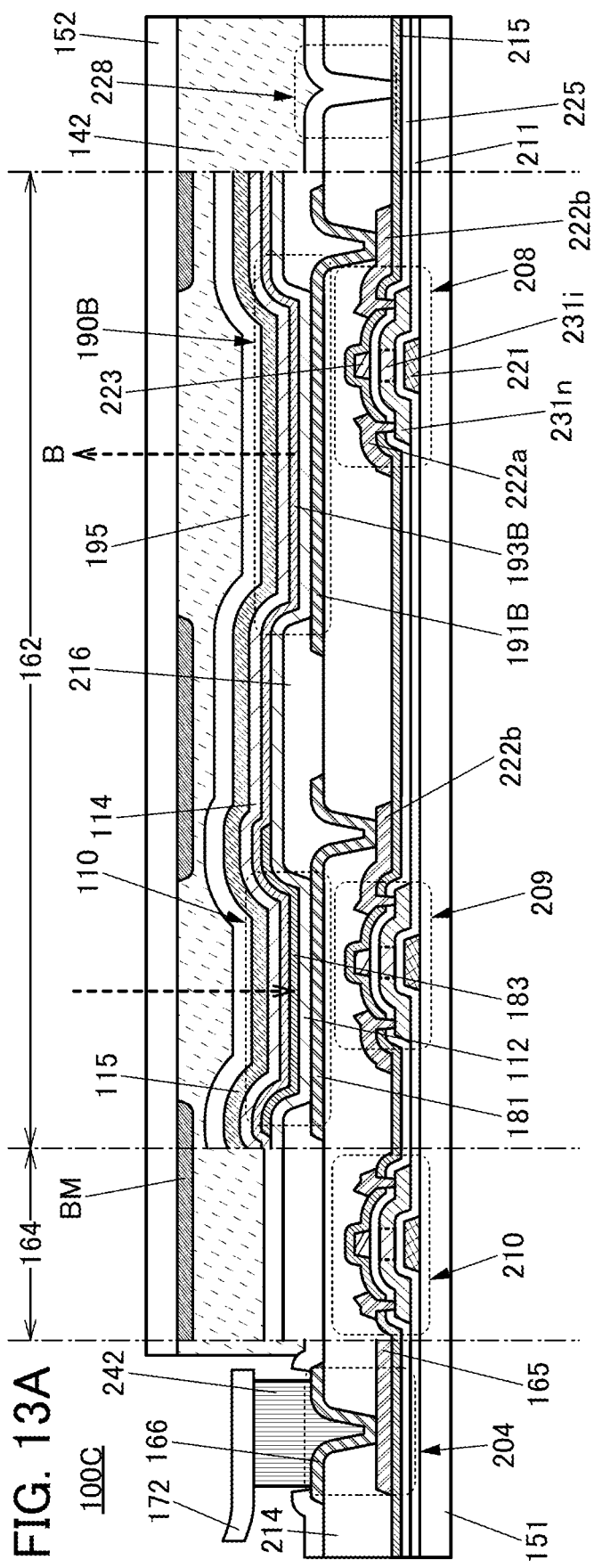
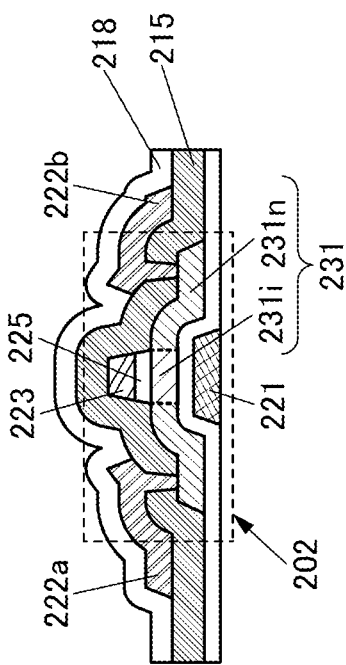
FIG. 13A
FIG. 13B

DISPLAY DEVICE, DISPLAY MODULE, AND ELECTRONIC DEVICE INCLUDING A LIGHT-RECEIVING ELEMENT AND LIGHT-EMITTING ELEMENTS

This application is a 371 of international application PCT/IB2020/050044 filed on Jan. 6, 2020 which is incorporated herein by reference.

TECHNICAL FIELD

One embodiment of the present invention relates to a display device, a display module, and an electronic device. One embodiment of the present invention relates to a display device including a light-receiving element and a light-emitting element.

Note that one embodiment of the present invention is not limited to the above technical field. Examples of the technical field of one embodiment of the present invention include a semiconductor device, a display device, a light-emitting device, a power storage device, a memory device, an electronic device, a lighting device, an input device (e.g., a touch sensor), an input/output device (e.g., a touch panel), a driving method thereof, or a manufacturing method thereof.

BACKGROUND ART

In recent years, application of display devices to a variety of uses has been expected. Examples of uses for a large display device include a television device for home use (also referred to as a TV or a television receiver), digital signage, and a PID (Public Information Display). In addition, a smartphone and a tablet terminal including a touch panel are being developed as portable information terminals.

Light-emitting devices including light-emitting elements have been developed, for example, as display devices. Light-emitting elements (also referred to as EL elements) utilizing an electroluminescence (hereinafter referred to as EL) phenomenon have features such as ease of reduction in thickness and weight, high-speed response to an input signal, and driving with a direct-current low voltage source, and have been used in display devices. For example, Patent Document 1 discloses a flexible light-emitting device including an organic EL element.

REFERENCE

Patent Document

[Patent Document 1] Japanese Published Patent Application No. 2014-197522

SUMMARY OF THE INVENTION

Problems to be Solved by the Invention

An object of one embodiment of the present invention is to provide a display device having a light detection function. An object of one embodiment of the present invention is to provide a highly convenient display device. An object of one embodiment of the present invention is to provide a multi-functional display device. An object of one embodiment of the present invention is to provide a display device with a high aperture ratio. An object of one embodiment of the present invention is to provide a display device with high definition. An object of one embodiment of the present invention is to provide a novel display device.

An object of one embodiment of the present invention is to improve the manufacturing yield of a display device having a light detection function. An object of one embodiment of the present invention is to reduce the number of steps for a display device having a light detection function. An object of one embodiment of the present invention is to reduce the manufacturing cost of a display device having a light detection function.

Note that the description of these objects does not preclude the existence of other objects. One embodiment of the present invention does not need to achieve all the objects. Other objects can be derived from the descriptions of the specification, the drawings, and the claims.

Means for Solving the Problems

A display device of one embodiment of the present invention includes a light-receiving element, a first light-emitting element, and a second light-emitting element in a display portion. The light-receiving element includes a first pixel electrode, an active layer, and a common electrode. The first light-emitting element includes a second pixel electrode, a first light-emitting layer, and the common electrode. The second light-emitting element includes a third pixel electrode, a second light-emitting layer, and the common electrode. The active layer includes an organic compound. The active layer is positioned between the first pixel electrode and the common electrode. The first light-emitting layer is positioned between the second pixel electrode and the common electrode. The second light-emitting layer is positioned between the third pixel electrode and the common electrode. The first light-emitting layer is further positioned between the first pixel electrode and the common electrode and/or between the third pixel electrode and the common electrode.

A display device of one embodiment of the present invention includes a light-receiving element and a first light-emitting element in a display portion. The light-receiving element includes a first pixel electrode, an active layer, a first light-emitting layer, and a common electrode. The first light-emitting element includes a second pixel electrode, the first light-emitting layer, and the common electrode. The active layer includes an organic compound. The active layer is positioned between the first pixel electrode and the common electrode. The first light-emitting layer is positioned between the first pixel electrode and the common electrode and between the second pixel electrode and the common electrode.

In the display device having the above structure, it is preferable that the display portion further include a second light-emitting element. It is preferable that the second light-emitting element include a third pixel electrode, the first light-emitting layer, a second light-emitting layer, and the common electrode. It is preferable that the first light-emitting layer and the second light-emitting layer be each positioned between the third pixel electrode and the common electrode. It is preferable that the first light-emitting element emit light emitted by the first light-emitting layer. It is preferable that the second light-emitting element emit light emitted by the second light-emitting layer.

Alternatively, in the display device having the above structure, it is preferable that the first light-emitting element further include the active layer. It is preferable that the active layer be positioned between the second pixel electrode and the common electrode.

A display device of one embodiment of the present invention includes a light-receiving element, a first light-emitting element, a second light-emitting element, a first coloring layer, and a second coloring layer in a display portion. The light-receiving element includes a first pixel electrode, an active layer, and a common electrode. The first light-emitting element includes a second pixel electrode, a first light-emitting layer, and the common electrode. The second light-emitting element includes a third pixel electrode, the first light-emitting layer, and the common electrode. The active layer includes an organic compound. The active layer is positioned between the first pixel electrode and the common electrode. The first light-emitting layer is positioned between the second pixel electrode and the common electrode and between the third pixel electrode and the common electrode. Light emitted by the first light-emitting element is extracted from the display portion through the first coloring layer as light of a first color. Light emitted by the second light-emitting element is extracted from the display portion through the second coloring layer as light of a second color.

In the display device having the above structure, it is preferable that the first light-emitting element and the second light-emitting element further include a second light-emitting layer. It is preferable that the second light-emitting layer be positioned between the second pixel electrode and the common electrode and between the third pixel electrode and the common electrode. It is preferable that the first light-emitting layer and the second light-emitting layer emit light with different wavelengths.

In the display device having the above structure, it is preferable that the display portion further include a third light-emitting element and a third coloring layer. It is preferable that the third light-emitting element include a fourth pixel electrode, a third light-emitting layer, and the common electrode. It is preferable that the third light-emitting layer be positioned between the second pixel electrode and the common electrode, between the third pixel electrode and the common electrode, and between the fourth pixel electrode and the common electrode. It is preferable that light emitted by the third light-emitting element be extracted from the display portion through the third coloring layer as light of a third color.

In the display device having any of the above structures, it is preferable that the light-receiving element and the first light-emitting element further include a common layer. It is preferable that the common layer be positioned between the first pixel electrode and the common electrode and between the second pixel electrode and the common electrode.

In the display device having any of the above structures, it is preferable that the display portion further include a bank. The bank preferably covers an end portion of the first pixel electrode and an end portion of the second pixel electrode. The bank preferably has a function of electrically isolating the first pixel electrode and the second pixel electrode. The bank preferably has a function of absorbing at least part of light emitted by the first light-emitting element.

In the display device having any of the above structures, it is preferable that the display portion further include a colored layer. It is preferable that the colored layer include a portion in contact with one or both of a top surface and a side surface of the bank. It is preferable that the colored layer include a color filter or a black matrix.

In the display device having any of the above structures, it is preferable that the display portion further include a lens. The lens preferably includes a portion overlapping with the light-receiving element. Light transmitted through the lens preferably enters the light-receiving element. It is preferable that the display portion further include a light-blocking layer. An end portion of the light-blocking layer preferably overlaps with an end portion of the lens. The light-blocking layer preferably overlaps with the bank.

In the display device having any of the above structures, the display portion preferably has flexibility.

One embodiment of the present invention is a module including the display device having any of the above structures, where a connector such as a flexible printed circuit (hereinafter also referred to as FPC) or a TCP (Tape Carrier Package) is attached or an integrated circuit (IC) is implemented by a COG (Chip On Glass) method, a COF (Chip On Film) method, or the like.

One embodiment of the present invention is an electronic device including the above module and at least one of an antenna, a battery, a housing, a camera, a speaker, a microphone, and an operation button.

Effect of the Invention

One embodiment of the present invention can provide a display device having a light detection function. One embodiment of the present invention can provide a highly convenient display device. One embodiment of the present invention can provide a multifunctional display device. One embodiment of the present invention can provide a display device with a high aperture ratio. One embodiment of the present invention can provide a display device with high definition. One embodiment of the present invention can provide a novel display device.

One embodiment of the present invention can improve the manufacturing yield of a display device having a light detection function. One embodiment of the present invention can reduce the number of steps for a display device having a light detection function. One embodiment of the present invention can reduce the manufacturing cost of a display device having a light detection function.

Note that the description of the effects does not preclude the existence of other effects. One embodiment of the present invention does not need to have all the effects. Other effects can be derived from the descriptions of the specification, the drawings, and the claims.

BRIEF DESCRIPTION OF THE DRAWINGS

FIG. 12A and FIG. 12B are cross-sectional views showing display device examples.

FIG. 13A is a cross-sectional view showing a display device example. FIG. 13B is a cross-sectional view showing a transistor example.

MODE FOR CARRYING OUT THE INVENTION

Figure 1A:
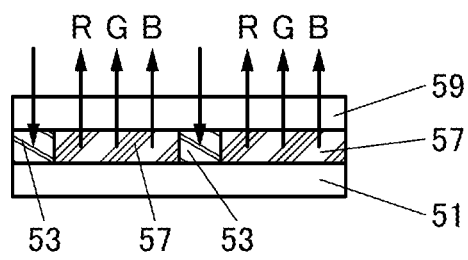
FIG. 1A to FIG. 1D are cross-sectional views showing display device examples.

Embodiments are described in detail with reference to the drawings. Note that the present invention is not limited to the following description, and it will be readily appreciated by those skilled in the art that modes and details of the present invention can be modified in various ways without departing from the spirit and scope of the present invention. Thus, the present invention should not be construed as being limited to the description in the following embodiments.

Note that in structures of the present invention described below, the same portions or portions having similar functions are denoted by the same reference numerals in different drawings, and a description thereof is not repeated. Furthermore, the same hatch pattern is used for the portions having similar functions, and the portions are not especially denoted by reference numerals in some cases.

In addition, the position, size, range, or the like of each structure illustrated in drawings does not represent the actual position, size, range, or the like in some cases for easy understanding. Therefore, the disclosed invention is not necessarily limited to the position, size, range, or the like disclosed in the drawings.

Note that the term "film" and the term "layer" can be interchanged with each other depending on the case or circumstances. For example, the term "conductive layer" can be changed into the term "conductive film". As another example, the term "insulating film" can be changed into the term "insulating layer".

Embodiment 1

In this embodiment, a display device of one embodiment of the present invention will be described with reference to FIG. 1 to FIG. 13.

In a display device of this embodiment, a display portion includes light-receiving elements and light-emitting elements. The display device of this embodiment includes the light-emitting elements arranged in a matrix in the display portion and can display an image on the display portion. Furthermore, the light-receiving elements are arranged in a matrix in the display portion, and the display portion has one or both of an image capturing function and a sensing function. The display portion can be used as an image sensor or a touch sensor. That is, by detecting light with the display portion, an image can be captured and the approach or contact of an object (e.g., a finger or a stylus) can be detected. Furthermore, in the display device of this embodiment, the light-emitting elements can be used as a light source of the sensor. Accordingly, a light-receiving portion and a light source do not need to be provided separately from the display device; hence, the number of components of an electronic device can be reduced.

When the object reflects light emitted by the light-emitting element included in the display portion, the light-receiving element can detect the reflected light; thus, the display device of this embodiment can perform image capturing and detection of touch (and even approach) even in a dark place.

The display device of this embodiment has a function of displaying an image with use of the light-emitting element. That is, the light-emitting element functions as a display element.

As the light-emitting element, an EL element such as an OLED (Organic Light Emitting Diode) or a QLED (Quantum-dot Light Emitting Diode) is preferably used. Examples of a light-emitting substance contained in the EL element include a substance emitting fluorescence (a fluorescent material), a substance emitting phosphorescence (a phosphorescent material), an inorganic compound (such as a quantum dot material), and a substance exhibiting thermally activated delayed fluorescence (a thermally activated delayed fluorescence (TADF) material). Alternatively, an LED such as a micro-LED (Light Emitting Diode) can be used as the light-emitting element.

The display device of this embodiment has a function of detecting light with use of the light-receiving element.

When the light-receiving element is used as an image sensor, the display device of this embodiment can capture an image using the light-receiving element.

For example, data on a fingerprint, a palm print, an iris, or the like can be acquired with the image sensor. That is, a biological authentication sensor can be incorporated into the display device of this embodiment. When the display device incorporates a biological authentication sensor, the number of components of an electronic device can be small as compared to the case where a biological authentication sensor is provided separately from the display device; thus, the size and weight of the electronic device can be reduced.

In addition, data on facial expression, eye movement, change of the pupil diameter, or the like of a user can be acquired with the image sensor. By analysis of the data, data on the user's physical and mental state can be acquired. Changing the output contents of one or both of display and sound on the basis of the data allows the user to safely use a device for VR (virtual reality), AR (augmented reality), or MR (mixed reality), for example.

When the light-receiving element is used as a touch sensor, the display device of this embodiment can detect the approach or contact of an object with use of the light-receiving element.

As the light-receiving element, a PN photodiode or a PIN photodiode can be used, for example. The light-receiving element functions as a photoelectric conversion element that detects light entering the light-receiving element and generates charge. The amount of generated electric charge depends on the amount of incident light.

It is particularly preferable to use an organic photodiode including a layer containing an organic compound as the light-receiving element. An organic photodiode, which is easily made thin, lightweight, and large in area and has a high degree of freedom for shape and design, can be used in a variety of display devices.

In one embodiment of the present invention, organic EL elements are used as the light-emitting elements, and organic photodiodes are used as the light-receiving elements. The organic EL elements and the organic photodiodes can be formed over one substrate. Thus, the organic photodiodes can be incorporated in the display device including the organic EL elements.

If all the layers of the organic EL elements and the organic photodiodes are formed separately, the number of deposition steps becomes extremely large. Since a large number of layers of the organic photodiodes can have structures in common with the organic EL elements, concurrently depositing the layers that can have a common structure can inhibit an increase in the number of deposition steps. Even when the number of times of deposition is the same, reducing the number of layers deposited only in some elements can reduce the influence of deviation of a deposition pattern and the influence of dust (including small foreign substances called particles) attached to a deposition mask (e.g., a metal mask), for example. Thus, the yield in the manufacture of the display device can be increased.

In the display device of one embodiment of the present invention, a light-emitting layer included in a first light-emitting element exhibiting a first color is shared with one or both of a light-receiving element and a second light-emitting element exhibiting a second color. This can reduce the number of layers which are formed separately for the light-receiving element, the first light-emitting element, and the second light-emitting element and can increase the manufacturing yield of the display device.

In addition, at least one of a hole-injection layer, a hole-transport layer, an electron-transport layer, and an electron-injection layer is preferably a common layer for the light-receiving element, the first light-emitting element, and the second light-emitting element. This can reduce the number of times of deposition and the number of masks and can reduce the number of manufacturing steps and the manufacturing cost of the display device. Note that the function of the layer shared by the light-receiving element, the first light-emitting element, and the second light-emitting element might differ between the light-emitting elements and the light-receiving element. In this specification, the name of a component is based on its function in the light-emitting element. For example, a hole-injection layer functions as a hole-injection layer in the light-emitting element and functions as a hole-transport layer in the light-receiving element. Similarly, an electron-injection layer functions as an electron-injection layer in the light-emitting element and functions as an electron-transport layer in the light-receiving element.

FIG. 1A to FIG. 1D are cross-sectional views of display devices of embodiments of the present invention.

A display device 50A illustrated in FIG. 1A includes a layer 53 including a light-receiving element and a layer 57 including a light-emitting element between a substrate 51 and a substrate 59.

Figure 1B:
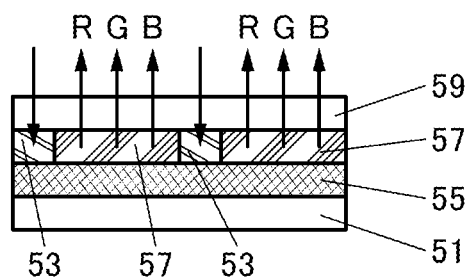

A display device 50B illustrated in FIG. 1B includes the layer 53 including a light-receiving element, a layer 55 including transistors, and the layer 57 including a light-emitting element between the substrate 51 and the substrate 59.

In the display device 50A and the display device 50B, red (R) light, green (G) light, and blue (B) light are emitted from the layer 57 including a light-emitting element.

The light-receiving element included in the layer 53 including a light-receiving element can detect light that enters from the outside of the display device 50A or the display device 50B.

The display device of one embodiment of the present invention includes a plurality of pixels arranged in a matrix. One pixel includes at least one subpixel. One subpixel includes one light-emitting element. For example, the pixel can include three subpixels (e.g., three colors of R, G, and B or three colors of yellow (Y), cyan (C), and magenta (M)) or four subpixels (e.g., four colors of R, G, B, and white (W) or four colors of R, G, B, and Y). The pixel further includes a light-receiving element. The light-receiving element may be provided in all the pixels or may be provided in some of the pixels. In addition, one pixel may include a plurality of light-receiving elements.

The layer 55 including transistors preferably includes a first transistor and a second transistor. The first transistor is electrically connected to the light-receiving element. The second transistor is electrically connected to the light-emitting element.

Figure 1C:
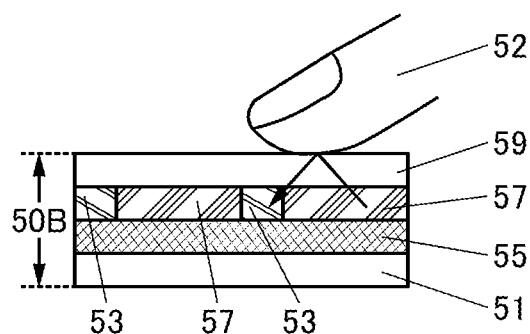

The display device of one embodiment of the present invention may have a function of detecting an object such as a finger that is touching the display device. For example, after light emitted by the light-emitting element in the layer 57 including a light-emitting element is reflected by a finger 52 that touches the display device 50B as illustrated in FIG. 1C, the light-receiving element in the layer 53 including a light-receiving element detects the reflected light. Thus, the touch of the finger 52 on the display device 50B can be detected.

Figure 1D:
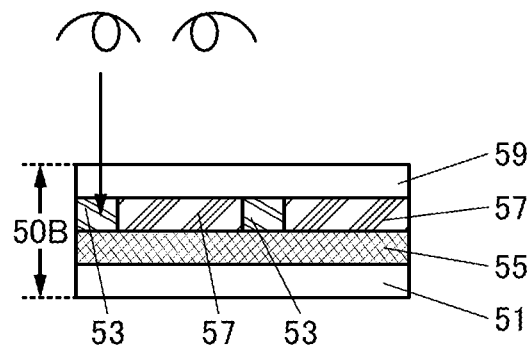

The display device of one embodiment of the present invention may have a function of detecting an object that is close to (but is not touching) the display device 50B as illustrated in FIG. 1D or capturing an image of such an object.

[Pixel]

FIG. 1E to FIG. 1H illustrate examples of pixels.

Figure 1E:
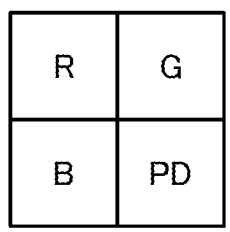
FIG. 1E to FIG. 1H are top views showing pixel examples.
Figure 1F:
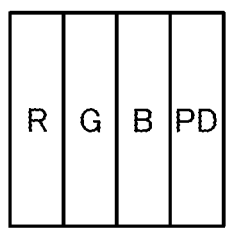

The pixel illustrated in each of FIG. 1E and FIG. 1F includes three subpixels (three light-emitting elements) of R, G, and B and a light-receiving element PD. FIG. 1E illustrates an example in which the three subpixels and the light-receiving element PD are arranged in a 2×2 matrix. FIG. 1F illustrates an example in which the three subpixels and the light-receiving element PD are arranged in a row.

Figure 1G:
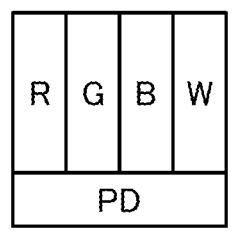

The pixel illustrated in FIG. 1G includes four subpixels (four light-emitting elements) of R, G, B, and W and the light-receiving element PD.

Figure 1H:
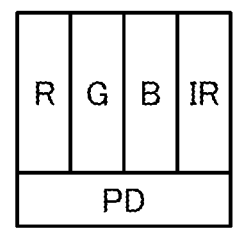

The pixel illustrated in FIG. 1H includes three subpixels of R, G, and B, a light-emitting element IR that emits infrared light, and the light-receiving element PD. Here, the light-receiving element PD preferably has a function of detecting infrared light. The light-receiving element PD may have a function of detecting both visible light and infrared light. The wavelength of light detected by the light-receiving element PD can be determined depending on the application of the sensor.

Structures of the light-emitting elements and the light-receiving element included in the display device of one embodiment of the present invention will be described in more detail below with reference to FIG. 2 to FIG. 7.

The display device of one embodiment of the present invention can have any of a top-emission structure in which light is emitted in a direction opposite to a substrate where a light-emitting element is formed, a bottom-emission structure in which light is emitted toward the substrate where the light-emitting element is formed, and a dual-emission structure in which light is emitted toward both surfaces.

FIG. 2 to FIG. 7 describe top-emission display devices as examples.

In this specification and the like, unless otherwise specified, in describing a structure including a plurality of components (e.g., light-emitting elements or light-emitting layers), alphabets are not added when a common part for the components is described. For example, when a common part for a light-emitting layer 193R, a light-emitting layer 193G, and the like is described, the expression "light-emitting layer 193" is used in some cases.

Structure Example 1

First, the display devices shown in FIG. 2, FIG. 3A, and FIG. 3B will be described.

Figure 2:
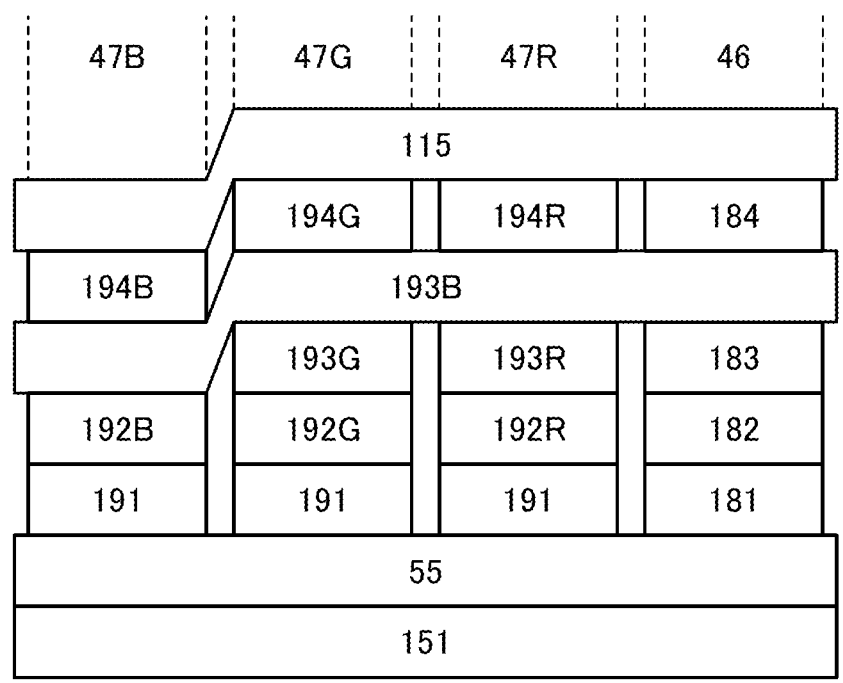
FIG. 2 is a cross-sectional view showing a display device example.
Figure 3A:
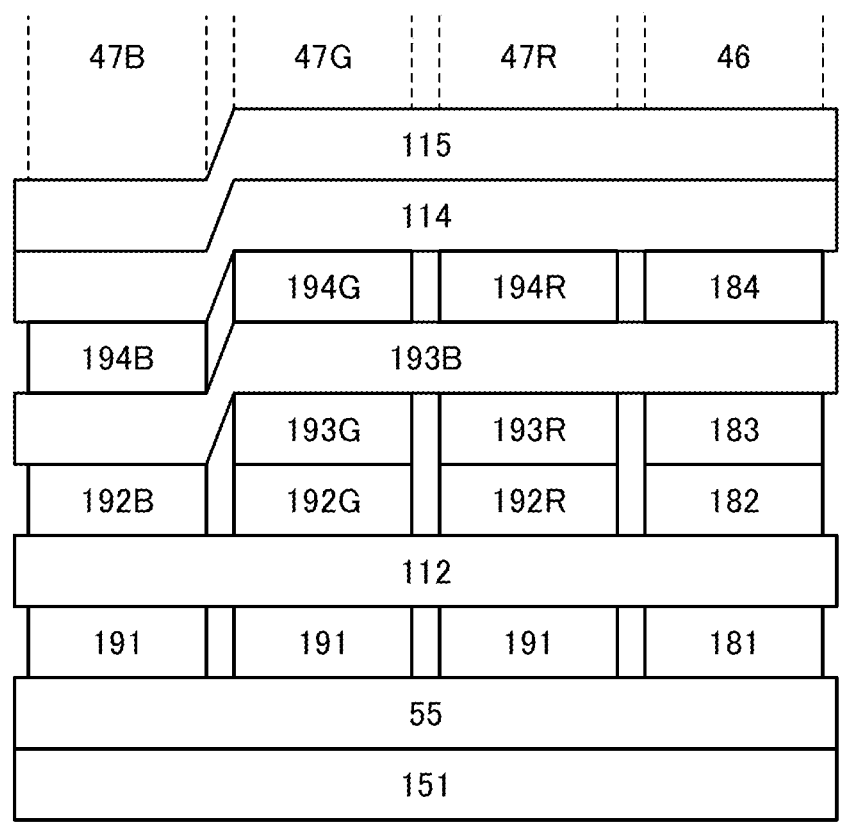
FIG. 3A and FIG. 3B are cross-sectional views showing display device examples.
Figure 3B:
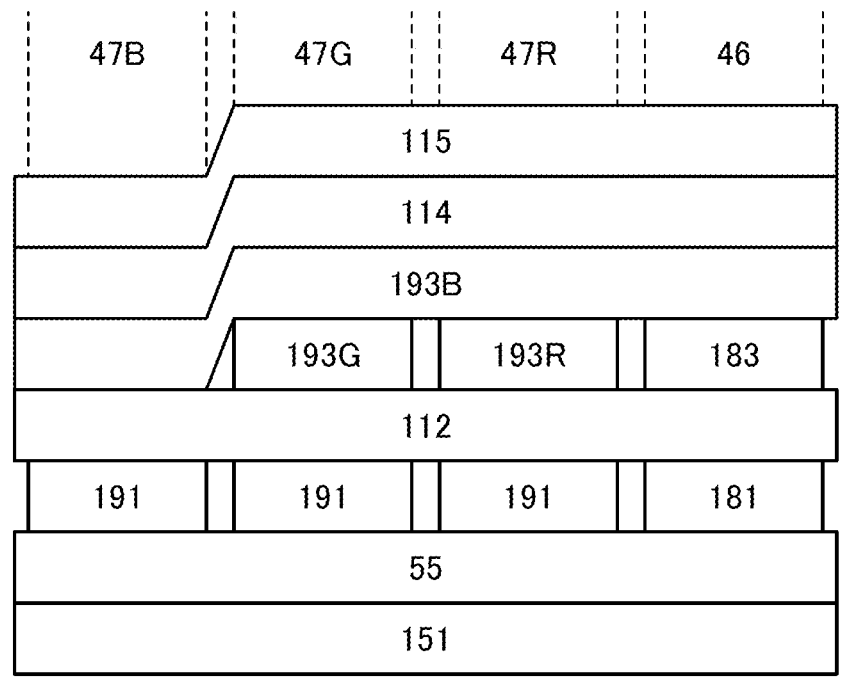

The display devices shown in FIG. 2, FIG. 3A, and FIG. 3B each include a light-emitting element 47B emitting blue (B) light, a light-emitting element 47G emitting green (G) light, a light-emitting element 47R emitting red (R) light, and a light-receiving element 46 over a substrate 151 with the layer 55 including transistors positioned therebetween.

The light-emitting element 47B, the light-emitting element 47G, and the light-emitting element 47R each include a pixel electrode 191 and a common electrode 115. In this embodiment, the case where the pixel electrode 191 functions as an anode and the common electrode 115 functions as a cathode is described as an example.

The light-receiving element 46 includes a pixel electrode 181 and the common electrode 115. In the description made in this embodiment, the pixel electrode 181 functions as an anode and the common electrode 115 functions as a cathode as in the light-emitting element. In other words, when the light-receiving element 46 is driven by application of reverse bias between the pixel electrode 181 and the common electrode 115, light entering the light-receiving element 46 can be detected and electric charge can be generated and extracted as current.

The pixel electrode 191 and the pixel electrode 181 can be formed using the same material in the same step. The pixel electrodes 191 included in the light-emitting elements are electrically insulated (or "electrically separated") from each other. The pixel electrode 181 included in the light-receiving element 46 is electrically insulated from the pixel electrodes 191 included in the light-emitting elements.

The common electrode 115 is shared by the light-receiving element 46, the light-emitting element 47B, the light-emitting element 47G, and the light-emitting element 47R.

The material, thickness, and the like of the pair of electrodes can be the same in the light-receiving element 46, the light-emitting element 47B, the light-emitting element 47G, and the light-emitting element 47R. Accordingly, the manufacturing cost of the display device can be reduced and the manufacturing process of the display device can be simplified.

In the display devices shown in FIG. 2, FIG. 3A, and FIG. 3B, a light-emitting layer 193B is provided not only in the light-emitting element 47B emitting blue light but also in the light-emitting element 47R emitting red light, the light-emitting element 47G emitting green light, and the light-receiving element 46. In the light-emitting element 47R, the light-emitting element 47G, and the light-receiving element 46, the light-emitting layer 193B functions as a carrier-transport layer (an electron-transport layer in this embodiment).

When less layers are formed separately for the elements, manufacture of the display device can be simplified. In the case where the light-emitting layer 193B is provided not only in the light-emitting element 47B but also in the light-emitting elements exhibiting other colors and the light-receiving element, the influence of deviation of a pattern of the light-emitting layer 193B can be smaller than that in the case where the light-emitting layer 193B is provided only in the light-emitting element 47B, whereby the manufacturing yield of the display device can be increased.

In the case of depositing the light-emitting layer 193B in a deposition chamber different from that for a buffer layer 192B and a buffer layer 194B, another mask for deposition of the light-emitting layer 193B is needed. In such a case, the structure in which the light-emitting layer 193B is shared by the light-receiving element 46, the light-emitting element 47B, the light-emitting element 47G, and the light-emitting element 47R can reduce the number of masks necessary for deposition and can reduce the manufacturing cost.

Alignment of the substrate and the mask needs to be highly accurate and thus, it sometimes takes time to place the mask, and misalignment sometimes affects the display quality of a manufactured display device. The number of masks is preferably smaller because in that case, the manufacturing time of the display device can be shorter and the yield can be higher.

A structure of the display device shown in FIG. 2 will be specifically described.

The light-emitting element 47B includes the buffer layer 192B, the light-emitting layer 193B, and the buffer layer 194B in this order over the pixel electrode 191. The light-emitting layer 193B includes a light-emitting material that emits blue light. The light-emitting element 47B has a function of emitting blue light.

The light-emitting element 47G includes a buffer layer 192G, the light-emitting layer 193G, the light-emitting layer 193B, and a buffer layer 194G in this order over the pixel electrode 191. The light-emitting layer 193G includes a light-emitting material that emits green light. The light-emitting element 47G has a function of emitting green light.

The light-emitting element 47R includes a buffer layer 192R, the light-emitting layer 193R, the light-emitting layer 193B, and a buffer layer 194R in this order over the pixel electrode 191. The light-emitting layer 193R includes a light-emitting material that emits red light. The light-emitting element 47R has a function of emitting red light.

The light-receiving element 46 includes a buffer layer 182, an active layer 183, the light-emitting layer 193B, and a buffer layer 184 in this order over the pixel electrode 181. The active layer 183 contains an organic compound. The light-receiving element 46 has a function of detecting one or both of visible light and infrared light.

The pixel electrode 181, the pixel electrode 191, the buffer layer 182, the buffer layer 192R, the buffer layer 192G, the buffer layer 192B, the active layer 183, the light-emitting layer 193R, the light-emitting layer 193G, the light-emitting layer 193B, the buffer layer 184, the buffer layer 194R, the buffer layer 194G, the buffer layer 194B, and the common electrode 115 may each have a single-layer structure or a stacked-layer structure.

The light-emitting layer 193B is shared by the light-emitting element 47B, the light-emitting element 47G, the light-emitting element 47R, and the light-receiving element 46. In contrast, the light-emitting layer 193G, the light-emitting layer 193R, and the active layer 183 are separately formed for the elements; the light-emitting layer 193G is provided in the light-emitting element 47G, the light-emitting layer 193R is provided in the light-emitting element 47R, and the active layer 183 is provided in the light-receiving element 46.

The buffer layer 182 can include a hole-transport layer. The buffer layers 192B, 192G, and 192R can each include one or both of a hole-injection layer and a hole-transport layer. The buffer layer 184 can include an electron-transport layer. The buffer layers 184, 194B, 194G, and 194R can each include one or both of an electron-injection layer and an electron-transport layer.

The hole-injection layer is a layer that injects holes from the anode to the light-emitting element and contains a material with a high hole-injection property. As the material with a high hole-injection property, an aromatic amine compound or a composite material containing a hole-transport material and an acceptor material (an electron-accepting material) can be used.

In the light-emitting element, the hole-transport layer is a layer transporting, to the light-emitting layer, holes which are injected from the anode by the hole-injection layer. In the light-receiving element, the hole-transport layer is a layer transporting, to the anode, holes which are generated in the active layer on the basis of incident light. The hole-transport layer is a layer including a hole-transport material. As the hole-transport material, a substance having a hole mobility of greater than or equal to $1\times10^{-6}$ cm$^2$/Vs is preferable. Note that other substances can also be used as long as they have a hole-transport property higher than an electron-transport property. As the hole-transport material, materials having a high hole-transport property, such as a π-electron-rich heteroaromatic compound (e.g., a carbazole derivative, a thiophene derivative, and a furan derivative) and an aromatic amine (a compound having an aromatic amine skeleton), are preferable.

In the light-emitting element, the electron-transport layer is a layer transporting, to the light-emitting layer, electrons which are injected from the cathode by the electron-injection layer. In the light-receiving element, the electron-transport layer is a layer transporting, to the cathode, electrons which are generated in the active layer on the basis of incident light. The electron-transport layer is a layer including an electron-transport material. As the electron-transport material, a substance having an electron mobility of greater than or equal to $1\times10^{-6}$ cm$^2$/Vs is preferable. Note that other substances can also be used as long as they have an electron-transport property higher than a hole-transport property. As the electron-transport material, it is possible to use a material having a high electron-transport property, such as a metal complex having a quinoline skeleton, a metal complex having a benzoquinoline skeleton, a metal complex having an oxazole skeleton, a metal complex having a thiazole skeleton, an oxadiazole derivative, a triazole derivative, an imidazole derivative, an oxazole derivative, a thiazole derivative, a phenanthroline derivative, a quinoline derivative having a quinoline ligand, a benzoquinoline derivative, a quinoxaline derivative, a dibenzoquinoxaline derivative, a pyridine derivative, a bipyridine derivative, a pyrimidine derivative, or a π-electron deficient heteroaromatic compound such as a nitrogen-containing heteroaromatic compound.

The electron-injection layer is a layer that injects electrons from the cathode to the light-emitting element and contains a material with a high electron-injection property. As the material with a high electron-injection property, an alkali metal, an alkaline earth metal, or a compound thereof can be used. As the material with a high electron-injection property, a composite material containing an electron-transport material and a donor material (an electron-donating material) can also be used.

The light-emitting elements included in the display device of this embodiment preferably employ a micro optical resonator (microcavity) structure. Therefore, one of the pair of electrodes of the light-emitting elements preferably includes an electrode having properties of transmitting and reflecting visible light (a semi-transmissive semi-reflective electrode), and the other preferably includes an electrode having a property of reflecting visible light (a reflective electrode). When the light-emitting elements have a microcavity structure, light emission obtained from the light-emitting layer can be resonated between the electrodes, whereby light emitted from the light-emitting elements can be intensified.

Note that the semi-transmissive semi-reflective electrode can have a stacked-layer structure of a reflective electrode and an electrode having a property of transmitting visible light (also referred to as a transparent electrode). In this specification and the like, the reflective electrode functioning as part of a semi-transmissive semi-reflective electrode may be referred to as a pixel electrode or a common electrode, and the transparent electrode may be referred to as an optical adjustment layer; in some cases, the transparent electrode (optical adjustment layer) can also be regarded as having a function of a pixel electrode or a common electrode.

The light transmittance of the transparent electrode is greater than or equal to 40%. For example, an electrode having a visible light (light with wavelengths greater than or equal to 400 nm and less than 750 nm) transmittance higher than or equal to 40% is preferably used in the light-emitting elements. The reflectance of the semi-transmissive and semi-reflective electrode for visible light is greater than or equal to 10% and less than or equal to 95%, preferably greater than or equal to 30% and less than or equal to 80%. The visible light reflectance of the reflective electrode is higher than or equal to 40% and lower than or equal to 100%, preferably higher than or equal to 70% and lower than or equal to 100%. These electrodes preferably have a resistivity less than or equal to $1\times10^{-2}$ Ωcm. Note that in the case where a light-emitting element that emits near-infrared light is used in the display device, the near-infrared light (light with wavelengths greater than or equal to 750 nm and less than or equal to 1300 nm) transmittance and reflectance of these electrodes are preferably in the above ranges.

The buffer layers 182, 192B, 192G, and 192R may each have a function of an optical adjustment layer. Specifically, the thickness of the buffer layer 192B is preferably adjusted such that the optical distance between the pair of electrodes in the light-emitting element 47B intensifies blue light. Similarly, the thickness of the buffer layer 192G is preferably adjusted such that the optical distance between the pair of electrodes in the light-emitting element 47G intensifies green light. The thickness of the buffer layer 192R is preferably adjusted such that the optical distance between the pair of electrodes in the light-emitting element 47R intensifies red light. By changing the thickness of the buffer layer 192 or the buffer layer 194, light of a particular color can be intensified and extracted from each light-emitting element. Note that when the semi-transmissive and semi-reflective electrode has a stacked-layer structure of a reflective electrode and a transparent electrode, the optical distance between the pair of electrodes refers to the optical distance between a pair of reflective electrodes.

A structure of the display device shown in FIG. 3A will be specifically described.

The display device shown in FIG. 3A includes a common layer 112 and a common layer 114 in addition to the components of the display device shown in FIG. 2.

At least some of the layers constituting the light-emitting elements and the light-receiving element preferably have common structures, in which case the number of manufacturing steps of the display device can be reduced.

Specifically, the light-emitting element 47B shown in FIG. 3A includes the common layer 112 between the pixel electrode 191 and the buffer layer 192B and includes the common layer 114 between the buffer layer 194B and the common electrode 115. Similarly, the light-emitting element 47G shown in FIG. 3A includes the common layer 112 between the pixel electrode 191 and the buffer layer 192G and includes the common layer 114 between the buffer layer 194G and the common electrode 115. The light-emitting element 47R shown in FIG. 3A includes the common layer 112 between the pixel electrode 191 and the buffer layer 192R and includes the common layer 114 between the buffer layer 194R and the common electrode 115. The light-receiving element 46 shown in FIG. 3A includes the common layer 112 between the pixel electrode 181 and the buffer layer 182 and includes the common layer 114 between the buffer layer 184 and the common electrode 115.

The common layer 112 and the common layer 114 may each have a single-layer structure or a stacked-layer structure.

The common layer 112 can include, for example, one or both of a hole-injection layer and a hole-transport layer. The common layer 114 can include, for example, one or both of an electron-injection layer and an electron-transport layer. The functions of the common layer 112 and the common layer 114 might differ between the light-emitting elements and the light-receiving element. For example, when the common layer 112 includes a hole-injection layer, the hole-injection layer functions as a hole-injection layer in the light-emitting element and functions as a hole-transport layer in the light-receiving element. Similarly, when the common layer 114 includes an electron-injection layer, the electron-injection layer functions as an electron-injection layer in the light-emitting element and functions as an electron-transport layer in the light-receiving element.

As an example of the display device shown in FIG. 3A, a structure is given in which the common layer 112 includes a hole-injection layer, the buffer layers 182, 192B, 192G, and 192R each include a hole-transport layer, the buffer layers 184, 194B, 194G, and 194R each include an electron-transport layer, and the common layer 114 includes an electron-injection layer.

The common layer 112 and the common layer 114 are each positioned over the pixel electrode 181 and the pixel electrode 191. The common layer 112 and the common layer 114 are layers shared by the light-receiving element 46 and the light-emitting elements 47.

A structure of the display device shown in FIG. 3B will be specifically described.

The display device shown in FIG. 3B is different from the display device shown in FIG. 3A in that the buffer layers 182, 192, 184, and 194 are not included and the common layers 112 and 114 are included.

The light-emitting element 47B includes the common layer 112 between the pixel electrode 191 and the light-emitting layer 193B and includes the common layer 114 between the light-emitting layer 193B and the common electrode 115.

The light-emitting element 47G includes the common layer 112 between the pixel electrode 191 and the light-emitting layer 193G and includes the common layer 114 between the light-emitting layer 193B and the common electrode 115.

The light-emitting element 47R includes the common layer 112 between the pixel electrode 191 and the light-emitting layer 193R and includes the common layer 114 between the light-emitting layer 193B and the common electrode 115.

The light-receiving element 46 includes the common layer 112 between the pixel electrode 181 and the active layer 183 and includes the common layer 114 between the light-emitting layer 193B and the common electrode 115.

As an example of the display device shown in FIG. 3B, a structure is given in which the common layer 112 includes a hole-injection layer and a hole-transport layer and the common layer 114 includes an electron-transport layer and an electron-injection layer.

The display device shown in FIG. 3B is an example in which the light-receiving element 46 and the light-emitting elements 47 have a common structure except for the active layer 183 of the light-receiving element 46, the light-emitting layer 193R of the light-emitting element 47R, and the light-emitting layer 193G of the light-emitting element 47G which are separately formed. The number of layers (buffer layers) that are formed separately for the light-receiving element 46 and the light-emitting elements 47 is reduced with the use of the layers (common layers) shared by the light-receiving element 46 and the light-emitting elements 47, whereby the light-receiving element 46 can be incorporated in the display device without a significant increase in the number of manufacturing steps.

In the display device shown in FIG. 3B, the light-emitting element 47B does not include a layer formed separately from other elements and thus, the number of masks can be reduced. Accordingly, the manufacturing cost of the display device can be reduced.

Structure Example 2

Next, the display devices shown in FIG. 4A, FIG. 4B, FIG. 5A, and FIG. 5B will be described.

The display devices shown in FIG. 4A, FIG. 4B, FIG. 5A, and FIG. 5B each include the light-emitting element 47B emitting blue (B) light, the light-emitting element 47G emitting green (G) light, the light-emitting element 47R emitting red (R) light, the light-receiving element 46, a coloring layer CFG, and a coloring layer CFR over the substrate 151 with the layer 55 including transistors positioned therebetween. The display device shown in FIG. 5B further includes a coloring layer CFB.

The light-emitting element 47B, the light-emitting element 47G, and the light-emitting element 47R each include the pixel electrode 191 and the common electrode 115.

The light-receiving element 46 includes the pixel electrode 181 and the common electrode 115.

The common electrode 115 is shared by the light-receiving element 46 and the light-emitting elements 47 emitting light of the respective colors.

Figure 4A:
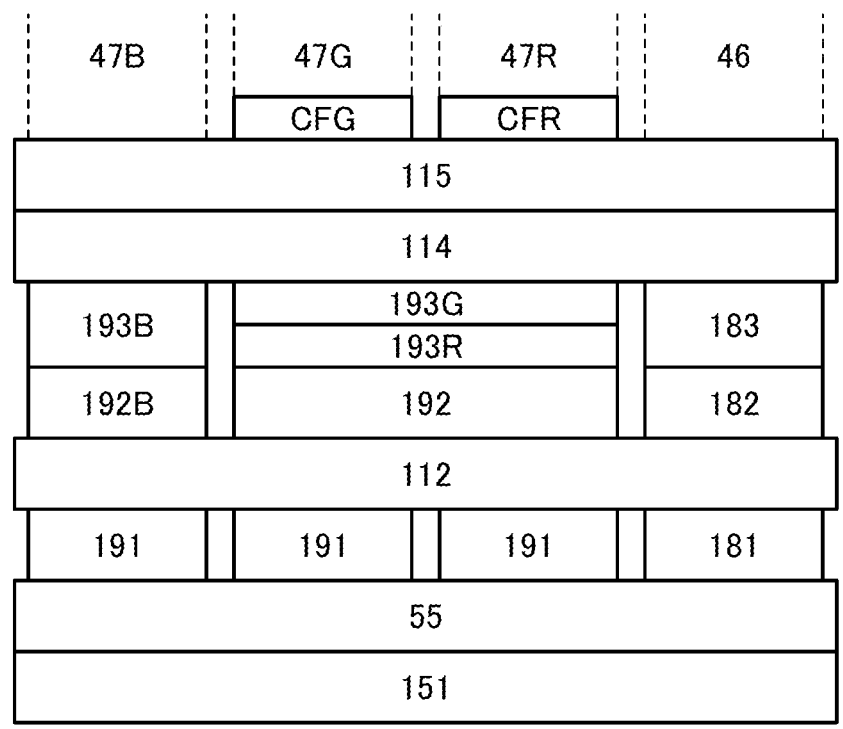
FIG. 4A and FIG. 4B are cross-sectional views showing display device examples.
Figure 4B:
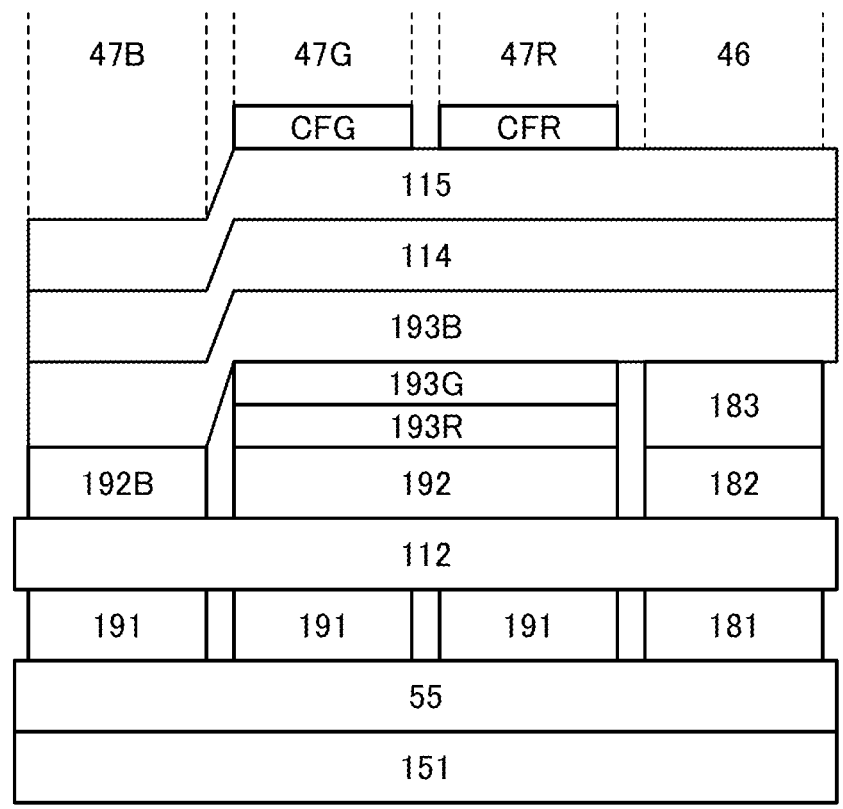
Figure 5A:
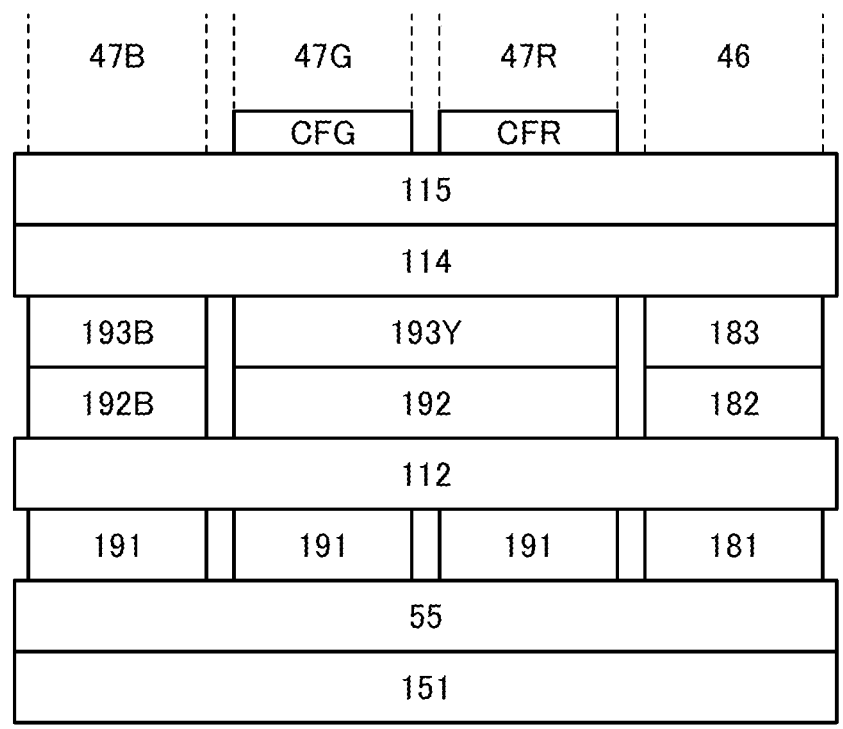
FIG. 5A and FIG. 5B are cross-sectional views showing display device examples.

In the display devices shown in FIG. 4A, FIG. 4B, and FIG. 5A, the light-emitting element 47R and the light-emitting element 47G include a common light-emitting layer. In FIG. 4A and FIG. 4B, the light-emitting element 47R and the light-emitting element 47G include the light-emitting layer 193R emitting red light and the light-emitting layer 193G emitting green light. In FIG. 5A, the light-emitting element 47R and the light-emitting element 47G include a light-emitting layer 193Y emitting yellow light. Light emitted by the light-emitting element 47R is extracted from the display device through the coloring layer CFR as red light. Furthermore, light emitted by the light-emitting element 47G is extracted from the display device through the coloring layer CFG as green light.

When the light-emitting element 47R and the light-emitting element 47G have a common structure, the number of deposition steps and the number of masks can be smaller than those for the structure in which the light-emitting element 47R and the light-emitting element 47G include separately formed layers. As a result, the number of manufacturing steps and the manufacturing cost of the display device can be reduced.

When the light-emitting element 47R and the light-emitting element 47G have a common structure, a margin for misalignment can be narrower than that for the structure in which the light-emitting element 47R and the light-emitting element 47G include separately formed layers. Accordingly, the aperture ratio of a pixel can be increased, so that the light extraction efficiency of the display device can be increased. When the aperture ratio of a pixel becomes higher, the luminance of a subpixel necessary to obtain a certain luminance in the display device can be reduced. This can extend the life of the light-emitting element. Furthermore, the display device can exhibit a high luminance. Moreover, the definition of the display device can also be increased.

Figure 5B:
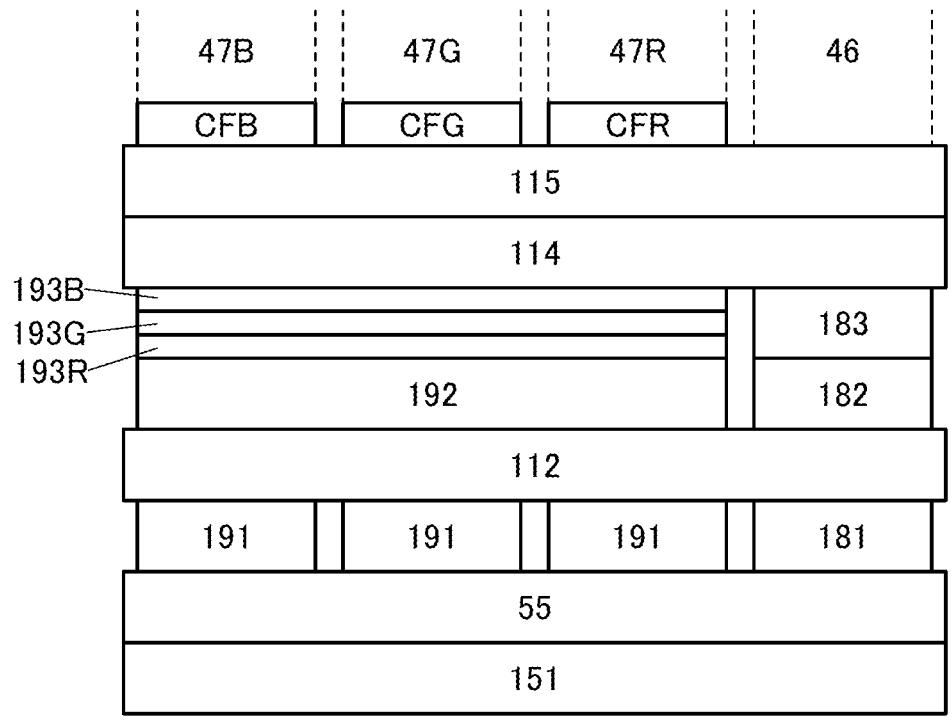

In FIG. 5B, the light-emitting element 47R, the light-emitting element 47G, and the light-emitting element 47B include common light-emitting layers. The light-emitting elements include the light-emitting layer 193R that emits red light, the light-emitting layer 193G that emits green light, and the light-emitting layer 193B that emits blue light. Light emitted by the light-emitting element 47R is extracted from the display device through the coloring layer CFR as red light. Furthermore, light emitted by the light-emitting element 47G is extracted from the display device through the coloring layer CFG as green light. Moreover, light emitted by the light-emitting element 47B is extracted from the display device through the coloring layer CFB as blue light.

When the light-emitting element 47R, the light-emitting element 47G, and the light-emitting element 47B have a common structure, the number of deposition steps and the number of masks can be smaller than those for the structure in which the light-emitting element 47R, the light-emitting element 47G, and the light-emitting element 47B include separately formed layers. As a result, the number of manufacturing steps and the manufacturing cost of the display device can be reduced.

When the light-emitting element 47R, the light-emitting element 47G, and the light-emitting element 47B have a common structure, a margin for misalignment can be narrower than that for the structure in which the light-emitting element 47R, the light-emitting element 47G, and the light-emitting element 47B include separately formed layers. Accordingly, the aperture ratio of a pixel can be increased, so that the light extraction efficiency of the display device can be increased. When the aperture ratio of a pixel becomes higher, the luminance of a subpixel necessary to obtain a certain luminance in the display device can be reduced. This can extend the life of the light-emitting element. Furthermore, the display device can exhibit a high luminance. Moreover, the definition of the display device can also be increased.

A structure of the display device shown in FIG. 4A will be specifically described.

The light-emitting element 47B includes the common layer 112, the buffer layer 192B, the light-emitting layer 193B, and the common layer 114 in this order over the pixel electrode 191. The light-emitting layer 193B includes a light-emitting material that emits blue light. The light-emitting element 47B has a function of emitting blue light.

The light-emitting element 47G and the light-emitting element 47R each include the common layer 112, the buffer layer 192, the light-emitting layer 193R, the light-emitting layer 193G, and the common layer 114 in this order over the pixel electrode 191. The light-emitting layer 193R includes a light-emitting material that emits red light. The light-emitting layer 193G includes a light-emitting material that emits green light. Light emitted by the light-emitting element 47G is extracted through the coloring layer CFG as green light. Light emitted by the light-emitting element 47R is extracted through the coloring layer CFR as red light.

The light-receiving element 46 includes the common layer 112, the buffer layer 182, the active layer 183, and the common layer 114 in this order over the pixel electrode 181. The active layer 183 contains an organic compound. The light-receiving element 46 has a function of detecting one or both of visible light and infrared light.

The light-emitting layer 193R and the light-emitting layer 193G are shared by the light-emitting element 47G and the light-emitting element 47R. In contrast, the light-emitting layer 193B and the active layer 183 are separately formed for the elements; the light-emitting layer 193B is provided in the light-emitting element 47B, and the active layer 183 is provided in the light-receiving element 46.

As an example of the display device shown in FIG. 4A, a structure is given in which the common layer 112 includes a hole-injection layer, the buffer layers 182, 192B, and 192 each include a hole-transport layer, and the common layer 114 includes one or both of an electron-injection layer and an electron-transport layer.

Although FIG. 4A shows an example in which the light-emitting element 47G and the light-emitting element 47R have the same structure, the light-emitting element 47G and the light-emitting element 47R may include optical adjustment layers with different thicknesses. For example, optical adjustment is preferably performed in such a manner that the pixel electrode 191 has a stacked-layer structure of a reflective electrode and a transparent electrode over the reflective electrode and the thickness of the transparent electrode is different between the light-emitting element 47G and the light-emitting element 47R. Specifically, in the light-emitting element 47G, the transparent electrode may be provided such that the optical distance between the pair of electrodes intensifies green light, whereas in the light-emitting element 47R, the transparent electrode may be provided such that the optical distance between the pair of electrodes intensifies red light. It is preferable that the light-emitting element 47B be optically adjusted with the buffer layer 192B such that the optical distance between the pair of electrodes intensifies blue light. In a similar manner, it is preferable that the light-receiving element 46 be optically adjusted with the buffer layer 182 such that the optical distance between the pair of electrodes intensifies light with a wavelength desired to be detected. Alternatively, the light-emitting element 47B and the light-receiving element 46 may each be provided with an optical adjustment layer (transparent electrode).

A structure of the display device shown in FIG. 4B will be specifically described.

The display device shown in FIG. 4B is different from the display devices shown in FIG. 4A and FIG. 5A in that the light-emitting layer 193B is provided not only in the light-emitting element 47B emitting blue light but also in the light-emitting elements 47R and 47G emitting light of the other colors and the light-receiving element 46.

In the light-emitting elements 47R and 47G and the light-receiving element 46, the light-emitting layer 193B functions as a carrier-transport layer (an electron-transport layer in this embodiment).

As in Structure Example 1, when less layers are formed separately for the elements, manufacture of the display device can be simplified. In the case where the light-emitting layer 193B is provided in the light-emitting elements emitting light of the respective colors and the light-receiving element, the influence of deviation of a pattern of the light-emitting layer 193B can be smaller than that in the case where the light-emitting layer 193B is provided only in the light-emitting element 47B, whereby the manufacturing yield of the display device can be increased.

In addition, a mask dedicated for deposition of the light-emitting layer 193B is not needed, which can reduce the manufacturing cost, shorten the manufacturing time, and increase the yield.

A structure of the display device shown in FIG. 5A will be specifically described.

The display device shown in FIG. 5A is different from the display device shown in FIG. 4A in that the light-emitting element 47R and the light-emitting element 47G do not include the light-emitting layer 193R emitting red light or the light-emitting layer 193G emitting green light but include the light-emitting layer 193Y emitting yellow light.

When the light-emitting element 47R and the light-emitting element 47G include a reduced number of light-emitting layers, the number of the manufacturing steps of the display device can be reduced.

Note that the display device shown in FIG. 5A can also have a structure in which the light-emitting layer 193B is provided not only in the light-emitting element 47B emitting blue light but also in the light-emitting elements 47R and 47G emitting light of the other colors and the light-receiving element 46.

A structure of the display device shown in FIG. 5B will be specifically described.

The display device shown in FIG. 5B is different from the display device shown in FIG. 4A in that the light-emitting element 47R, the light-emitting element 47G, and the light-emitting element 47B have the same structure and light emitted by the light-emitting element 47B is extracted through the coloring layer CFB.

The light-emitting element 47R, the light-emitting element 47G, and the light-emitting element 47B each include the common layer 112, the buffer layer 192, the light-emitting layer 193R, the light-emitting layer 193G, the light-emitting layer 193B, and the common layer 114 in this order over the pixel electrode 191. The light-emitting layer 193R includes a light-emitting material that emits red light. The light-emitting layer 193G includes a light-emitting material that emits green light. The light-emitting layer 193B includes a light-emitting material that emits blue light. Light emitted by the light-emitting element 47R is extracted through the coloring layer CFR as red light. Light emitted by the light-emitting element 47G is extracted through the coloring layer CFG as green light. Light emitted by the light-emitting element 47B is extracted through the coloring layer CFB as blue light.

Note that the light-emitting element 47 may have a single structure in which one light-emitting unit is provided between the pixel electrode 191 and the common electrode 115, or a tandem structure in which a plurality of light-emitting units are provided between them.

The light-receiving element 46 includes the common layer 112, the buffer layer 182, the active layer 183, and the common layer 114 in this order over the pixel electrode 181. The active layer 183 contains an organic compound. The light-receiving element 46 has a function of detecting one or both of visible light and infrared light.

The light-emitting layer 193R, the light-emitting layer 193G, and the light-emitting layer 193B are shared by the light-emitting element 47R, the light-emitting element 47G, and the light-emitting element 47B. When the light-emitting element 47R, the light-emitting element 47G, and the light-emitting element 47B have a common structure, the number of deposition steps and the number of masks can be smaller than those for the structure in which the light-emitting element 47R, the light-emitting element 47G, and the light-emitting element 47B include separately formed layers. As a result, the number of manufacturing steps and the manufacturing cost of the display device can be reduced.

In FIG. 5B, the light-emitting element 47R, the light-emitting element 47G, the light-emitting element 47B, and the light-receiving element 46 may include optical adjustment layers with different thicknesses.

Structure Example 3

Next, the display devices shown in FIG. 6A, FIG. 6B, FIG. 7A, and FIG. 7B will be described.

The display devices shown in FIG. 6A, FIG. 6B, FIG. 7A, and FIG. 7B each include the light-emitting element 47B emitting blue (B) light, the light-emitting element 47G emitting green (G) light, the light-emitting element 47R emitting red (R) light, and the light-receiving element 46 over the substrate 151 with the layer 55 including transistors positioned therebetween.

The light-emitting element 47B, the light-emitting element 47G, and the light-emitting element 47R each include the pixel electrode 191 and the common electrode 115.

The light-receiving element 46 includes the pixel electrode 181 and the common electrode 115.

The common electrode 115 is shared by the light-receiving element 46 and the light-emitting elements 47 emitting light of the respective colors.

Figure 6A:
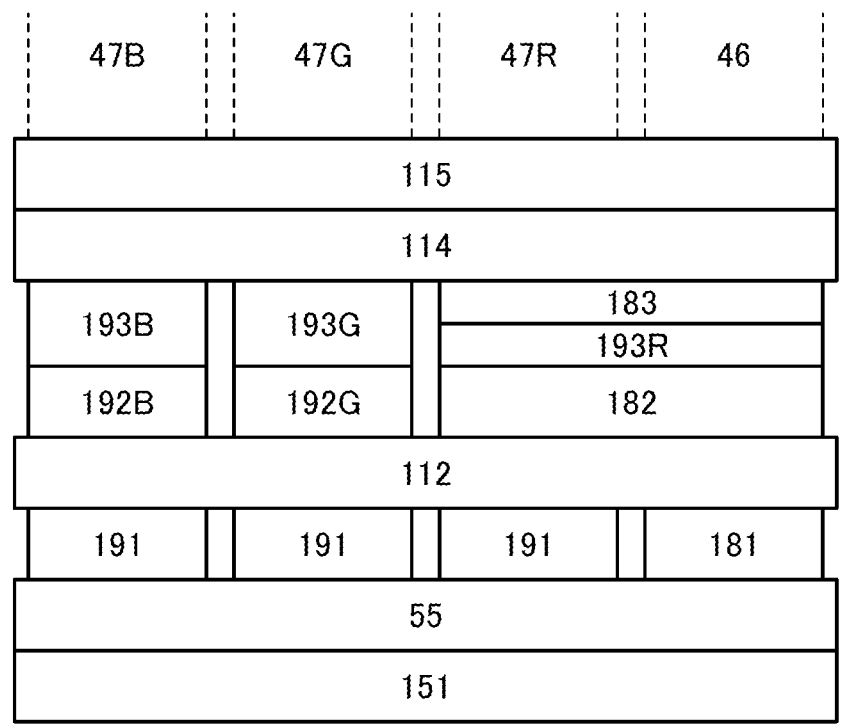
FIG. 6A and FIG. 6B are cross-sectional views showing display device examples.
Figure 6B:
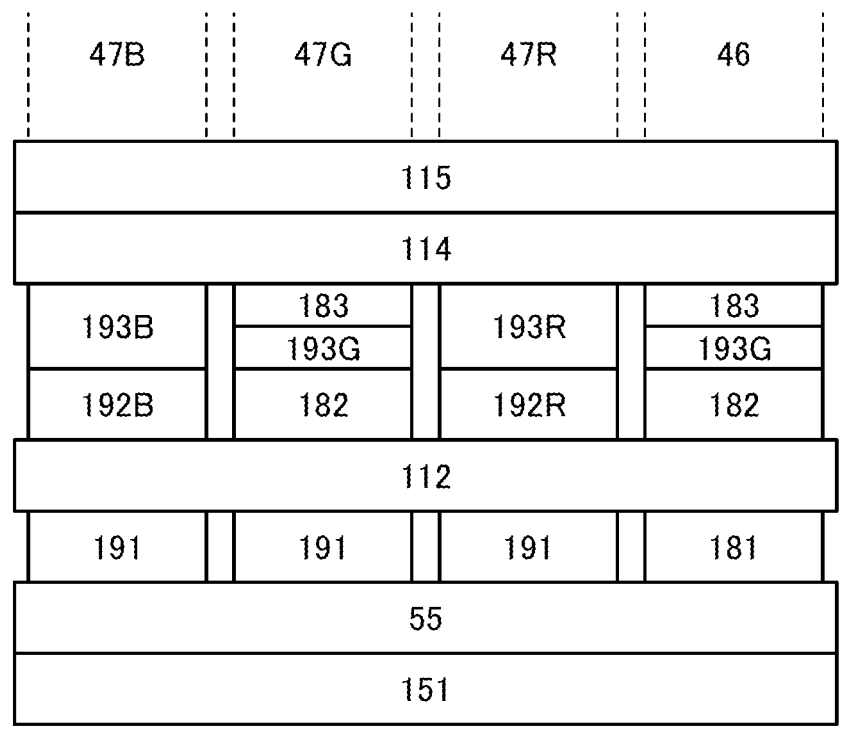
Figure 7A:
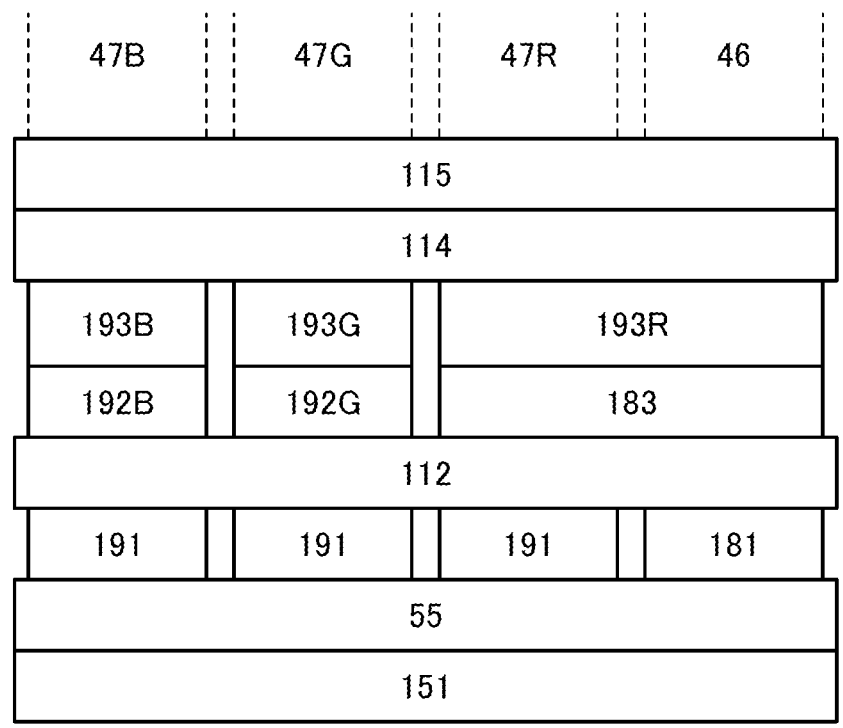
FIG. 7A and FIG. 7B are cross-sectional views showing display device examples.
Figure 7B:
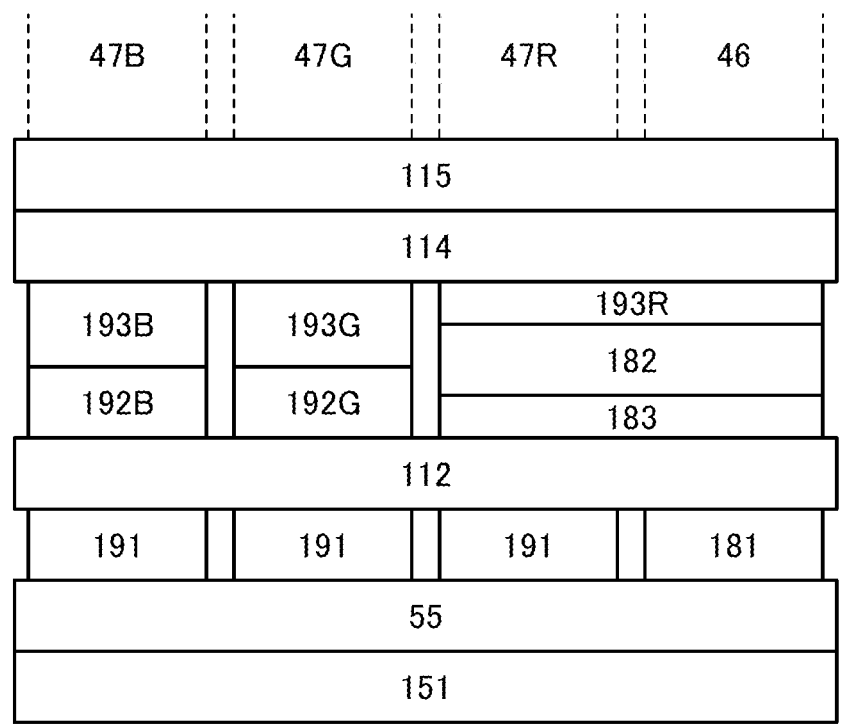

In the display devices shown in FIG. 6A, FIG. 7A, and FIG. 7B, the light-receiving element 46 and the light-emitting element 47R include the common light-emitting layer 193R and the common active layer 183. In the display device shown in FIG. 6B, the light-receiving element 46 includes the light-emitting layer 193G and the common active layer 183 in common with the light-emitting element 47G.

Here, the light-receiving element 46 can have a structure in common with the light-emitting element which emits light with a wavelength longer than that of the light desired to be detected. For example, the light-receiving element 46 configured to detect blue light can have a structure which is similar to that of one or both of the light-emitting element 47R and the light-emitting element 47G. For example, the light-receiving element 46 configured to detect green light can have a structure similar to that of the light-emitting element 47R.

When the light-receiving element 46 and the light-emitting element 47R or the light-emitting element 47G have a common structure, the number of deposition steps and the number of masks can be smaller than those for the structure in which the light-receiving element 46 and the light-emitting element 47R or the light-emitting element 47G include separately formed layers. As a result, the number of manufacturing steps and the manufacturing cost of the display device can be reduced.

When the light-receiving element 46 and the light-emitting element 47R or the light-emitting element 47G have a common structure, a margin for misalignment can be narrower than that for the structure in which the light-receiving element 46 and the light-emitting element 47R or the light-emitting element 47G include separately formed layers. Accordingly, the aperture ratio of a pixel can be increased, so that the light extraction efficiency of the display device can be increased. This can extend the life of the light-emitting element. Furthermore, the display device can exhibit a high luminance. Moreover, the definition of the display device can also be increased.

A structure of the display device shown in FIG. 6A will be specifically described.

The light-emitting element 47B includes the common layer 112, the buffer layer 192B, the light-emitting layer 193B, and the common layer 114 in this order over the pixel electrode 191. The light-emitting layer 193B includes a light-emitting material that emits blue light. The light-emitting element 47B has a function of emitting blue light.

The light-emitting element 47G includes the common layer 112, the buffer layer 192G, the light-emitting layer 193G, and the common layer 114 in this order over the pixel electrode 191. The light-emitting layer 193G includes a light-emitting material that emits green light. The light-emitting element 47G has a function of emitting green light.

The light-emitting element 47R and the light-receiving element 46 each include the common layer 112, the buffer layer 182, the light-emitting layer 193R, the active layer 183, and the common layer 114 in this order over the pixel electrode. The light-emitting layer 193R includes a light-emitting material that emits red light. The active layer 183 contains an organic compound that absorbs light with a wavelength shorter than that of red light (e.g., one or both of green light and blue light). The active layer 183 preferably contains an organic compound that does not easily absorb red light and that absorbs light with a wavelength shorter than that of red light. In this way, red light can be efficiently extracted from the light-emitting element 47R, and the light-receiving element 46 can sense light with a wavelength shorter than that of red light at high accuracy.

Although FIG. 6A shows an example in which the light-emitting element 47R and the light-receiving element 46 have the same structure, the light-emitting element 47R and the light-receiving element 46 may include optical adjustment layers with different thicknesses. For example, optical adjustment is preferably performed in such a manner that the pixel electrode 191 and the pixel electrode 181 each have a stacked-layer structure of a reflective electrode and a transparent electrode over the reflective electrode and the thickness of the transparent electrode is different between the light-emitting element 47R and the light-receiving element 46. Specifically, in the light-emitting element 47R, the transparent electrode is preferably provided such that the optical distance between the pair of electrodes intensifies red light, whereas in the light-receiving element 46, the transparent electrode is preferably provided such that the optical distance between the pair of electrodes intensifies light with a wavelength desired to be detected. In this way, red light can be efficiently extracted from the light-emitting element 47R, and the light-receiving element 46 can sense light at high accuracy. The light-emitting element 47G is preferably optically adjusted with the buffer layer 192G such that the optical distance between the pair of electrodes intensifies green light. Similarly, it is preferable that the light-emitting element 47B be optically adjusted with the buffer layer 192B such that the optical distance between the pair of electrodes intensifies blue light. Alternatively, the light-emitting element 47G and the light-emitting element 47B may each be provided with an optical adjustment layer (transparent electrode).

For example, a structure can be employed in which the common layer 112 includes a hole-injection layer, the buffer layers 182, 192B, and 192G each include a hole-transport layer, and the common layer 114 includes one or both of an electron-injection layer and an electron-transport layer.

A structure of the display device shown in FIG. 6B will be specifically described.

The light-emitting element 47B shown in FIG. 6B has a structure similar to that in FIG. 6A.

The light-emitting element 47R includes the common layer 112, the buffer layer 192R, the light-emitting layer 193R, and the common layer 114 in this order over the pixel electrode 191. The light-emitting layer 193R includes a light-emitting material that emits red light. The light-emitting element 47R has a function of emitting red light.

The light-emitting element 47G and the light-receiving element 46 each include the common layer 112, the buffer layer 182, the light-emitting layer 193G, the active layer 183, and the common layer 114 in this order over the pixel electrode. The light-emitting layer 193G includes a light-emitting material that emits green light. The active layer 183 contains an organic compound that absorbs light with a wavelength shorter than that of green light (e.g., blue light). The active layer 183 preferably contains an organic compound that does not easily absorb red to green light and that absorbs light with a wavelength shorter than that of green light. In this way, green light can be efficiently extracted from the light-emitting element 47G, and the light-receiving element 46 can sense light with a wavelength shorter than that of green light at high accuracy.

Note that the light-emitting element 47G and the light-receiving element 46 may be different from each other in the thickness of the pixel electrode or the buffer layer. Specifically, the light-emitting element 47G may be optically adjusted such that the optical distance between the pair of electrodes intensifies green light, whereas the light-receiving element 46 may be optically adjusted such that the optical distance between the pair of electrodes intensifies light with a wavelength desired to be sensed. In this way, green light can be efficiently extracted from the light-emitting element 47G, and the light-receiving element 46 can sense light at high accuracy.

In the display device of this embodiment, an organic compound is used for the active layer 183 of the light-receiving element 46. The light-receiving element 46 can be fabricated only by changing at least part of the structure between the pair of electrodes of the light-emitting element 47. Thus, the light-receiving element 46 can be incorporated in the display portion of the display device. Furthermore, the light-receiving element can have a structure in common with the light-emitting element emitting red or green light. In this manner, when at least some of the layers constituting the light-emitting element and the light-receiving element have common structures, the number of manufacturing steps of the display device can be reduced.

A structure of the display device shown in FIG. 7A will be specifically described.

The display device shown in FIG. 7A is different from the display device shown in FIG. 6A in that the light-emitting element 47R and the light-receiving element 46 do not include the buffer layer 182 and the light-emitting layer 193R is positioned over the active layer 183.

The stacking order of the active layer 183 and the light-emitting layer 193R is not limited. The light-emitting layer 193R may be provided over the active layer 183 or the active layer 183 may be provided over the light-emitting layer 193R.

As the buffer layers 192B and 192G, for example, hole-transport layers can be used. The light-emitting element 47R and the light-receiving element 46 do not necessarily include a hole-transport layer. In this manner, there may be a layer that is provided in any of the light-emitting elements 47R, 47G, and 47B and the light-receiving element 46 and is not provided in the other elements (e.g., a hole-injection layer, a hole-transport layer, an electron-transport layer, an electron-injection layer, a hole-blocking layer, or an electron-blocking layer).

A structure of the display device shown in FIG. 7B will be specifically described.

The display device shown in FIG. 7B is different from the display device shown in FIG. 6A in that the buffer layer 182 is provided between the active layer 183 and the light-emitting layer 193R.

The light-emitting layer 193R and the active layer 183 may be in contact with each other or a layer may be interposed therebetween.

The buffer layer provided between the active layer 183 and the light-emitting layer 193R can suppress transfer of excitation energy from the light-emitting layer 193R to the active layer 183. Furthermore, the buffer layer can also be used to adjust the optical path length (cavity length) of the microcavity structure. Thus, a high emission efficiency can be obtained from the light-emitting element 47R including the buffer layer between the active layer 183 and the light-emitting layer 193R.

For example, a structure can be employed in which the common layer 112 includes a hole-injection layer, the buffer layers 182, 192B, and 192G each include a hole-transport layer, and the common layer 114 includes one or both of an electron-injection layer and an electron-transport layer. The common layer 112 may further include a hole-transport layer. In other words, the light-emitting elements and the light-receiving element may each include both the hole-transport layer of the common layer 112 and the hole-transport layer of the buffer layer.

The structure of the display device of one embodiment of the present invention will be described below with reference to FIG. 8 and FIG. 9.

[Display Device 10A]

Figure 8A:
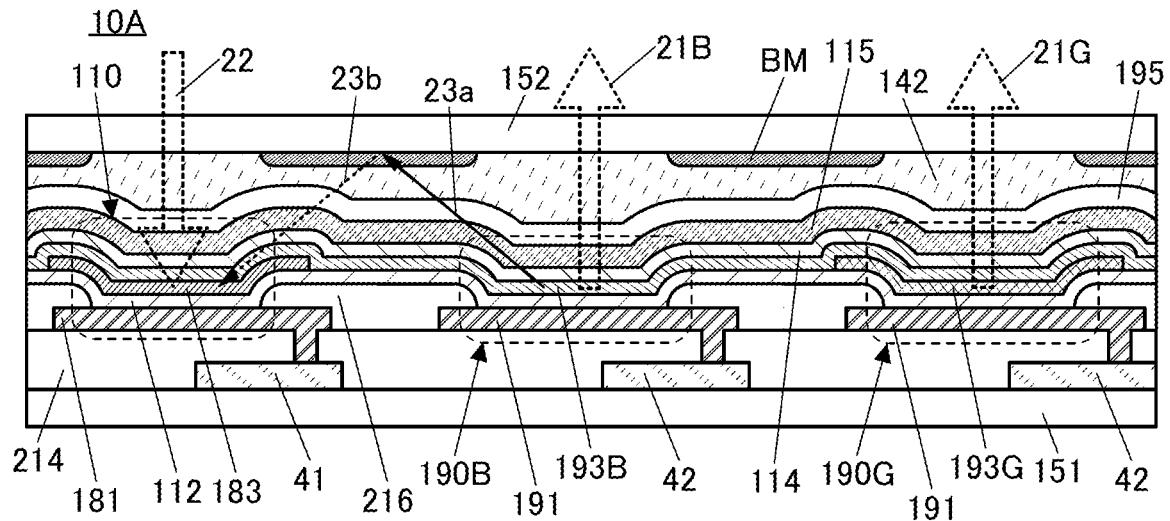
FIG. 8A to FIG. 8C are cross-sectional views showing display device examples.

FIG. 8A shows a cross-sectional view of a display device 10A. The structure in FIG. 3B described in Structure Example 1 is applied to the display device 10A. The description of Structure Example 1 can be referred to for the details of each layer.

The display device 10A includes a light-receiving element 110, a light-emitting element 190B, and a light-emitting element 190G. The light-receiving element 110 has a function of detecting light 22. The wavelength of the light 22 to be detected by the light-receiving element 110 is not particularly limited; for example, one or both of visible light and infrared light can be detected. The light-emitting element 190B has a function of emitting blue light 21B. The light-emitting element 190G has a function of emitting green light 21G.

The light-emitting element 190B includes the pixel electrode 191, the common layer 112, the light-emitting layer 193B, the common layer 114, and the common electrode 115.

The light-emitting element 190G includes the pixel electrode 191, the common layer 112, the light-emitting layer 193G, the light-emitting layer 193B, the common layer 114, and the common electrode 115.

The light-receiving element 110 includes the pixel electrode 181, the common layer 112, the active layer 183, the light-emitting layer 193B, the common layer 114, and the common electrode 115.

The pixel electrode 181 and the pixel electrode 191 are positioned over an insulating layer 214. The pixel electrode 181 and the pixel electrode 191 can be formed using the same material in the same step.

The common layer 112 is positioned over the pixel electrode 181 and the pixel electrode 191. The common layer 112 is a layer shared by the light-receiving element 110, the light-emitting element 190B, and the light-emitting element 190G. As the common layer 112, one or both of a hole-injection layer and a hole-transport layer can be formed, for example.

The active layer 183 overlaps with the pixel electrode 181 with the common layer 112 therebetween. The light-emitting layer 193G overlaps with the pixel electrode 191 with the common layer 112 therebetween. The light-emitting layer 193B overlaps with the pixel electrode 181 with the common layer 112 and the active layer 183 therebetween. The light-emitting layer 193B overlaps with the pixel electrode 191 of the light-emitting element 190G with the common layer 112 and the light-emitting layer 193G therebetween. The light-emitting layer 193B overlaps with the pixel electrode 191 of the light-emitting element 190B with the common layer 112 therebetween.

The common layer 114 is positioned over the light-emitting layer 193B. The common layer 114 is a layer shared by the light-receiving element 110, the light-emitting element 190B, and the light-emitting element 190G. As the common layer 114, one or both of an electron-injection layer and an electron-transport layer can be formed, for example.

The common electrode 115 includes a portion overlapping with the pixel electrode 181 with the common layer 112, the active layer 183, the light-emitting layer 193B, and the common layer 114 therebetween. The common electrode 115 includes a portion overlapping with the pixel electrode 191 of the light-emitting element 190G with the common layer 112, the light-emitting layer 193G, the light-emitting layer 193B, and the common layer 114 therebetween. The common electrode 115 includes a portion overlapping with the pixel electrode 191 of the light-emitting element 190B with the common layer 112, the light-emitting layer 193B, and the common layer 114 therebetween. The common electrode 115 is a layer shared by the light-receiving element 110, the light-emitting element 190B, and the light-emitting element 190G.

In the display device of this embodiment, an organic compound is used for the active layer 183 of the light-receiving element 110. The light-receiving element 110 can be fabricated only by changing at least part of the structure between the pair of electrodes of the light-emitting element 190 (EL element). That is, the light-emitting element 190 and the light-receiving element 110 can be formed over one substrate. Furthermore, the light-receiving element 110 can be formed in parallel with formation of the light-emitting element 190. Accordingly, the light-receiving element 110 can be incorporated into the display portion of the display device without a significant increase in the number of manufacturing steps.

The display device 10A illustrates an example in which the light-receiving element 110 and the light-emitting element 190G have a common structure except for the active layer 183 of the light-receiving element 110 and the light-emitting layer 193G of the light-emitting element 190G which are separately formed. Note that the structures of the light-receiving element 110 and the light-emitting element 190G are not limited thereto. The light-receiving element 110 and the light-emitting element 190G may include separately formed layers other than the active layer 183 and the light-emitting layer 193G. The light-receiving element 110 and the light-emitting element 190G preferably include at least one shared layer (common layer). Thus, the light-receiving element 110 can be incorporated into the display device without a significant increase in the number of manufacturing steps.

In the display device 10A shown in FIG. 8A, the light-emitting layer 193B emitting blue light is provided not only in the light-emitting element 190B emitting blue light but also in the light-emitting element 190G and the light-receiving element 110. In the light-emitting element 190G and the light-receiving element 110, the light-emitting layer 193B functions as a carrier-transport layer. When the light-emitting layer 193B is provided in the light-emitting elements emitting light of the respective colors and the light-receiving element, the influence of deviation of a pattern of the light-emitting layer 193B can be reduced, which can increase the manufacturing yield of the display device.

The display device 10A includes the light-receiving element 110, the light-emitting element 190B, the light-emitting element 190G, a transistor 41, a transistor 42, and the like between a pair of substrates (the substrate 151 and a substrate 152).

In the light-receiving element 110, the common layer 112, the active layer 183, and the common layer 114, which are positioned between the pixel electrode 181 and the common electrode 115, can each also be referred to as an organic layer (a layer including an organic compound). The pixel electrode 181 preferably has a function of reflecting visible light. An end portion of the pixel electrode 181 is covered with a bank 216. The common electrode 115 has a function of transmitting visible light.

The light-receiving element 110 has a function of sensing light. Specifically, the light-receiving element 110 is a photoelectric conversion element that receives the light 22 that enters from the outside of the display device 10A and converts it into an electrical signal. The light 22 can also be expressed as light that is emitted by the light-emitting element 190 and then reflected by an object. The light 22 may enter the light-receiving element 110 through a lens described later.

A light-blocking layer BM is preferably provided on a surface of the substrate 152 on the substrate 151 side. The light-blocking layer BM has an opening in a position overlapping with the light-receiving element 110 and an opening in a position overlapping with the light-emitting element 190. Providing the light-blocking layer BM can control the range where the light-receiving element 110 detects light.

Here, the light-receiving element 110 detects light that is emitted by the light-emitting element 190 and then reflected by an object. However, in some cases, light emitted by the light-emitting element 190 is reflected inside the display device 10A and enters the light-receiving element 110 without via an object. The light-blocking layer BM can reduce the influence of such stray light. For example, in the case where the light-blocking layer BM is not provided, light 23a emitted by the light-emitting element 190 is reflected by the substrate 152 and reflected light 23b enters the light-receiving element 110 in some cases. Providing the light-blocking layer BM can inhibit the reflected light 23b from entering the light-receiving element 110. Thus, noise can be reduced, and the sensitivity of a sensor using the light-receiving element 110 can be increased.

In the light-emitting element 190, the common layer 112, the light-emitting layer 193, and the common layer 114, which are positioned between the pixel electrode 191 and the common electrode 115, can each also be referred to as an EL layer. The pixel electrode 191 preferably has a function of reflecting visible light. An end portion of the pixel electrode 191 is covered with the bank 216. The pixel electrode 181 and the pixel electrode 191 are electrically insulated (or "electrically separated") from each other by the bank 216. The common electrode 115 has a function of transmitting visible light.

The light-emitting element 190B is an electroluminescent element that emits the blue light 21B to the substrate 152 side when voltage is applied between the pixel electrode 191 and the common electrode 115.

The light-emitting element 190G is an electroluminescent element that emits the green light 21G to the substrate 152 side when voltage is applied between the pixel electrode 191 and the common electrode 115.

The pixel electrode 181 is electrically connected to a source or a drain of the transistor 41 through an opening provided in the insulating layer 214. The end portion of the pixel electrode 181 is covered with the bank 216.

The pixel electrode 191 is electrically connected to a source or a drain of the transistor 42 through an opening provided in the insulating layer 214. The end portion of the pixel electrode 191 is covered with the bank 216. The transistor 42 has a function of controlling the driving of the light-emitting element 190.

The transistor 41 and the transistor 42 are on and in contact with the same layer (the substrate 151 in FIG. 8A).

At least part of a circuit electrically connected to the light-receiving element 110 and a circuit electrically connected to the light-emitting element 190 are preferably formed using the same material in the same step. In that case, the thickness of the display device can be smaller than that in the case where the two circuits are separately formed, resulting in simplification of the manufacturing process.

The light-receiving element 110 and the light-emitting element 190 are preferably covered with a protective layer 195. In FIG. 8A, the protective layer 195 is provided on and in contact with the common electrode 115. Providing the protective layer 195 can inhibit entry of impurities such as water into the light-receiving element 110 and the light-emitting element 190, so that the reliability of the light-receiving element 110 and the light-emitting element 190 can be increased. The protective layer 195 and the substrate 152 are bonded to each other with an adhesive layer 142.

[Display Device 10B]

Figure 8B:
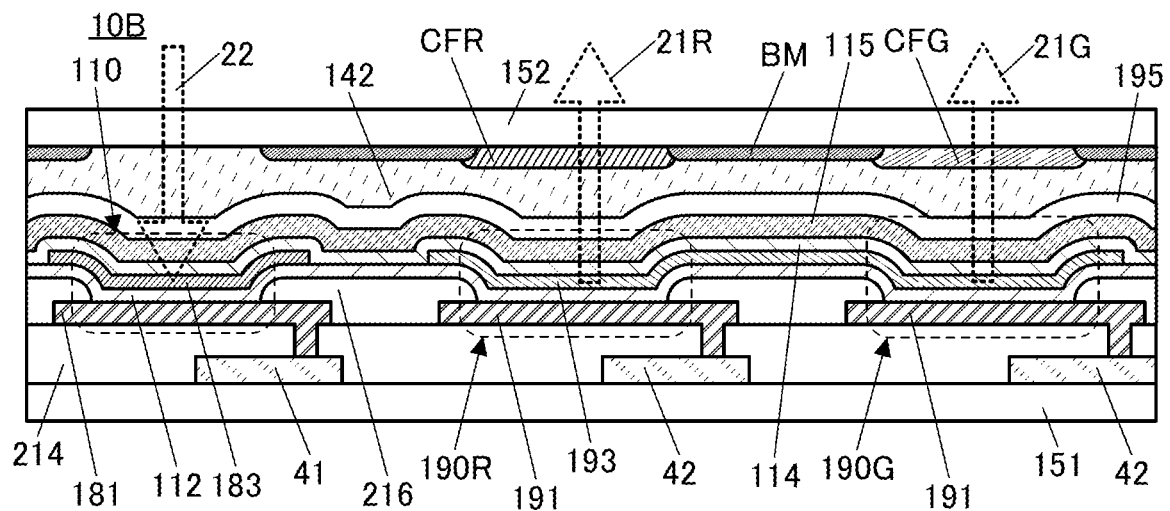

FIG. 8B shows a cross-sectional view of a display device 10B. The structure described in Structure Example 2 is applied to the display device 10B. Note that in the description of the display device below, components similar to those of the above-mentioned display device are not described in some cases.

The display device 10B includes the light-receiving element 110, a light-emitting element 190R, and the light-emitting element 190G. The light-receiving element 110 has a function of detecting the light 22. The light-emitting element 190R has a function of emitting red light 21R. The light-emitting element 190G has a function of emitting the green light 21G.

The light-emitting element 190R and the light-emitting element 190G have the same structure. Specifically, the light-emitting element 190R and the light-emitting element 190G include the pixel electrode 191, the common layer 112, the light-emitting layer 193, the common layer 114, and the common electrode 115. The light-emitting layer 193 may have a single-layer structure or a stacked-layer structure. To the light-emitting layer 193, for example, a structure in which the light-emitting layer 193R emitting red light and the light-emitting layer 193G emitting green light are provided as shown in FIG. 4A or a structure in which the light-emitting layer 193Y emitting yellow light is provided as shown in FIG. 5A can be applied.

The red coloring layer CFR and the green coloring layer CFG are provided on the substrate 151 side of the substrate 152. Light emitted by the light-emitting element 190R is extracted from the display device 10B through the coloring layer CFR as red light. Furthermore, light emitted by the light-emitting element 190G is extracted from the display device 10B through the coloring layer CFG as green light.

The light-receiving element 110 includes the pixel electrode 181, the common layer 112, the active layer 183, the common layer 114, and the common electrode 115.

The display device 10B illustrates an example in which the light-receiving element 110 and the light-emitting elements 190G and 190R have a common structure except for the active layer 183 of the light-receiving element 110 and the light-emitting layer 193 of the light-emitting elements 190G and 190R which are separately formed. Note that the structures of the light-receiving element 110 and the light-emitting elements 190G and 190R are not limited thereto. The light-receiving element 110 and the light-emitting elements 190G and 190R may include separately formed layers other than the active layer 183 and the light-emitting layer 193. The light-receiving element 110 and the light-emitting elements 190G and 190R preferably include at least one shared layer (common layer). Thus, the light-receiving element 110 can be incorporated into the display device without a significant increase in the number of manufacturing steps.

[Display Device 10C]

Figure 8C:
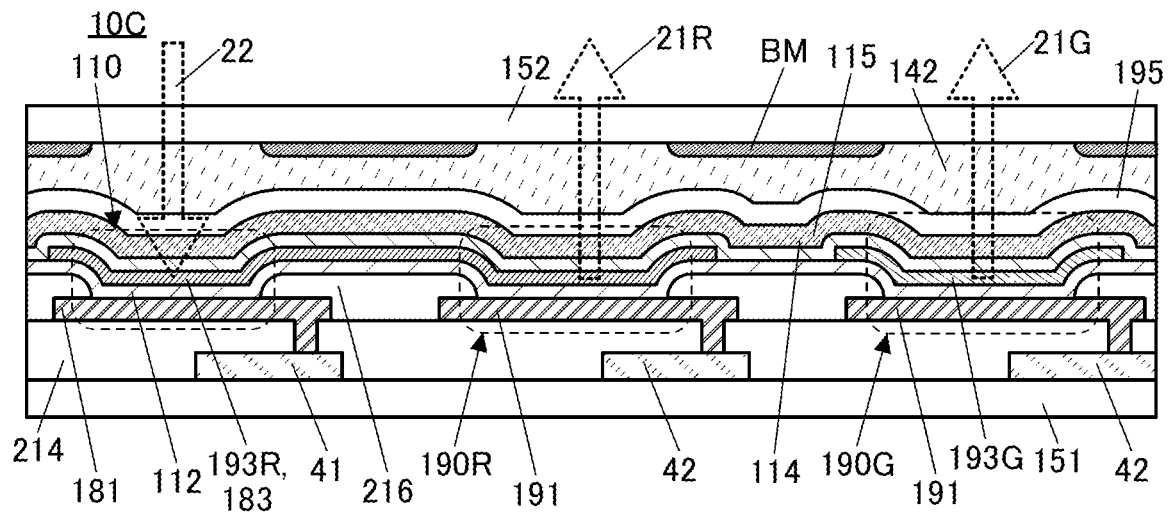

FIG. 8C shows a cross-sectional view of a display device 10C. The structure in FIG. 6A described in Structure Example 3 is applied to the display device 10C.

The display device 10C includes the light-receiving element 110, the light-emitting element 190R, and the light-emitting element 190G. The light-receiving element 110 has a function of detecting the light 22. The light-emitting element 190R has a function of emitting the red light 21R. The light-emitting element 190G has a function of emitting the green light 21G.

The light-emitting element 190R and the light-receiving element 110 have the same structure. Specifically, the light-emitting element 190R and the light-receiving element 110 include a pixel electrode, the common layer 112, the light-emitting layer 193R, the active layer 183, the common layer 114, and the common electrode 115. Note that although the light-emitting layer 193R and the active layer 183 are described as one layer in FIG. 8C and the like, the light-emitting layer 193R and the active layer 183 are separate layers.

The light-emitting element 190G includes the pixel electrode 191, the common layer 112, the light-emitting layer 193G, the common layer 114, and the common electrode 115.

The display device 10C illustrates an example in which the light-receiving element 110, the light-emitting element 190R, and the light-emitting element 190G have a common structure except for the active layer 183 and the light-emitting layer 193R of the light-receiving element 110 and the light-emitting element 190R which are separately formed from the light-emitting layer 193G of the light-emitting element 190G. Note that the structures of the light-receiving element 110 and the light-emitting elements 190G and 190R are not limited thereto.

[Display Device 10D]

Figure 9A:
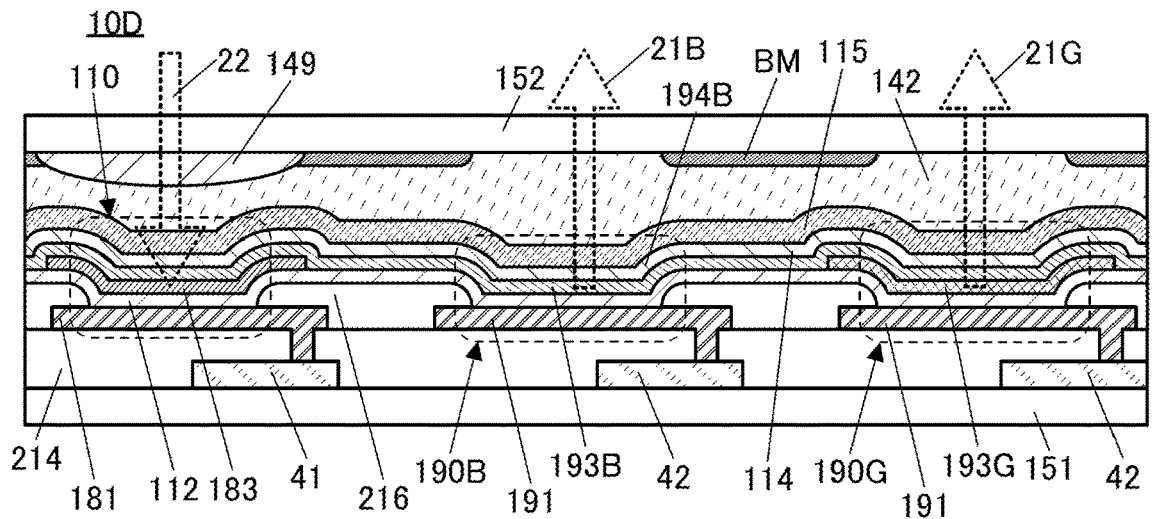
FIG. 9A to FIG. 9C are cross-sectional views showing display device examples.

FIG. 9A shows a cross-sectional view of a display device 10D.

The display device 10D is different from the display device 10A in that the protective layer 195 is not included and a lens 149 is included.

The display device of this embodiment does not necessarily include a protective layer over the light-receiving element 110 and over the light-emitting element 190. In FIG. 9A, the common electrode 115 and the substrate 152 are bonded to each other with the adhesive layer 142.

The display device of this embodiment may include the lens 149. The lens 149 is provided in a position overlapping with the light-receiving element 110. In the display device 10D, the lens 149 is provided in contact with the substrate 152. The lens 149 included in the display device 10D has a convex surface on the substrate 151 side.

In the case where the light-blocking layer BM and the lens 149 are formed on the same plane of the substrate 152, their formation order is not limited. Although FIG. 9A shows an example in which the lens 149 is formed first, the light-blocking layer BM may be formed first. In FIG. 9A, end portions of the lens 149 are covered with the light-blocking layer BM.

The display device 10D has a structure in which the light 22 enters the light-receiving element 110 through the lens 149. With the lens 149, the image-capturing range of the light-receiving element 110 can be narrower than that in the case where the lens 149 is not provided, thereby inhibiting overlap of the image-capturing ranges between the adjacent light-receiving elements 110. Thus, a clear image with little blurring can be captured. With the lens 149, the size of a pinhole (corresponding to the size of an opening in the light-blocking layer BM that overlaps with the light-receiving element 110 in FIG. 9A) can be larger than that in the case where the lens 149 is not provided, given that the image-capturing range of the light-receiving element 110 is the same. Hence, providing the lens 149 can increase the amount of light entering the light-receiving element 110.

Alternatively, the lens 149 having a convex surface on the substrate 152 side may be provided in contact with a top surface of the protective layer 195. A lens array may be provided on the display surface side (which is opposite to a surface on the substrate 151 side) of the substrate 152. A lens included in the lens array is provided in the position overlapping with the light-receiving element 110. The light-blocking layer BM is preferably provided on the surface of the substrate 152 on the substrate 151 side.

As a method for forming the lens used in the display device of this embodiment, a lens such as a microlens may be formed directly over the substrate or the light-receiving element, or a lens array formed separately, such as a microlens array, may be bonded to the substrate.

[Display Device 10E]

Figure 9B:
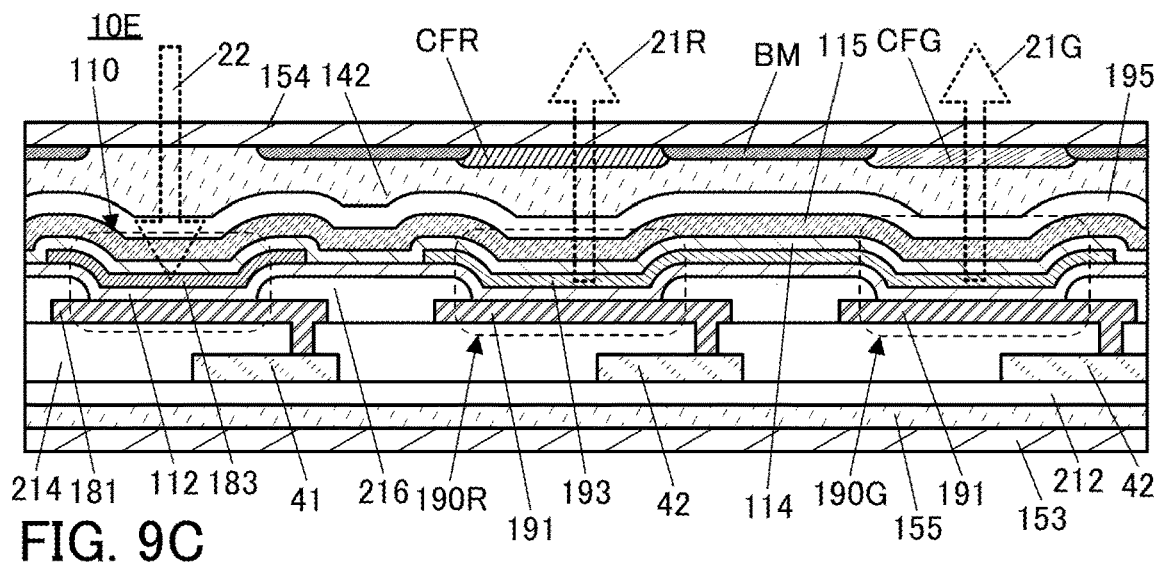

FIG. 9B shows a cross-sectional view of a display device 10E.

The display device 10E differs from the display device 10B in that the substrate 151 and the substrate 152 are not included but a substrate 153, a substrate 154, an adhesive layer 155, and an insulating layer 212 are included.

The substrate 153 and the insulating layer 212 are bonded to each other with the adhesive layer 155. The substrate 154 and the protective layer 195 are bonded to each other with the adhesive layer 142.

The display device 10E is formed in such a manner that the insulating layer 212, the transistor 41, the transistor 42, the light-receiving element 110, the light-emitting element 190, and the like which are formed over a formation substrate are transferred onto the substrate 153. The substrate 153 and the substrate 154 are preferably flexible. Accordingly, the flexibility of the display device 10E can be increased. For example, a resin is preferably used for each of the substrate 153 and the substrate 154. As the substrate included in the display device of this embodiment, a film having high optical isotropy may be used.

[Display Device 10F]

Figure 9C:
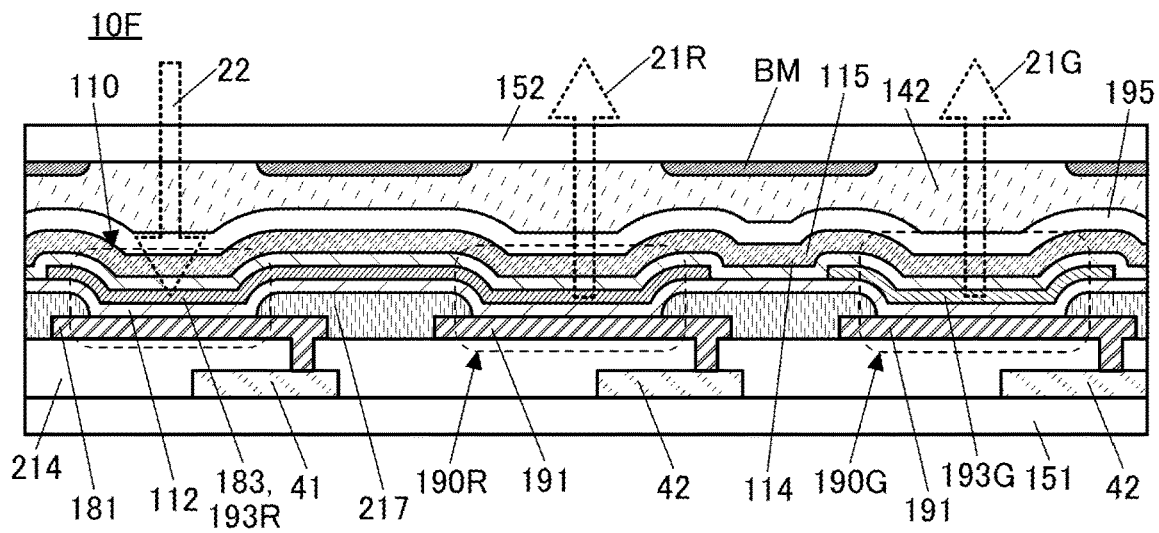

FIG. 9C shows a cross-sectional view of a display device 10F.

The display device 10F is different from the display device 10C in that the bank 216 is not included but a bank 217 is included.

The bank 217 preferably absorbs light emitted by the light-emitting element. As the bank 217, a black matrix can be formed using a resin material containing a pigment or dye, for example. Moreover, the bank 217 can be formed of a colored insulating layer by using a brown resist material.

In some cases, light emitted by the light-emitting element 190 is reflected by the substrate 152 and the bank 217 and reflected light enters the light-receiving element 110. In other cases, light emitted by the light-emitting element 190 is transmitted through the bank 217 and is reflected by a transistor, a wiring, or the like, and thus reflected light enters the light-receiving element 110. When the bank 217 absorbs light, such reflected light can be inhibited from entering the light-receiving element 110. As a result, noise can be reduced, and the sensitivity of a sensor using the light-receiving element 110 can be increased.

The bank 217 preferably absorbs at least light with the wavelength that is sensed by the light-receiving element 110. For example, in the case where the light-receiving element 110 senses the green light 21G emitted by the light-emitting element 190G, the bank 217 preferably absorbs at least green light. For example, when the bank 217 includes a red color filter, the bank 217 can absorb green light and thus reflected light can be inhibited from entering the light-receiving element 110.

Note that a colored layer that absorbs light may be provided in contact with one or both of top and side surfaces of the bank that transmits light. The colored layer preferably absorbs light emitted by the light-emitting element. As the colored layer, a black matrix can be formed using a resin material containing a pigment or dye, for example. More-over, the colored layer can be formed of a colored insulating layer by using a brown resist material.

The colored layer preferably absorbs at least light with the wavelength that is sensed by the light-receiving element 110. For example, in the case where the light-receiving element 110 senses the green light 21G emitted by the light-emitting element 190G, the colored layer preferably absorbs at least green light. For example, when the colored layer includes a red color filter, the colored layer can absorb the green light, and thus reflected light can be inhibited from entering the light-receiving element 110.

When the colored layer absorbs stray light generated in the display device 10F, the amount of stray light entering the light-receiving element 110 can be reduced. As a result, noise can be reduced, and the sensitivity of a sensor using the light-receiving element 110 can be increased.

In the display device of this embodiment, the colored layer is provided between the light-receiving element 110 and the light-emitting element 190. This can inhibit stray light from entering the light-receiving element 110 from the light-emitting element 190.

A structure of the display device of one embodiment of the present invention will be described in more detail below with reference to FIG. 10 to FIG. 14. Note that although FIG. 10 to FIG. 14 mainly show display devices to which the structure in FIG. 3B described in Structure Example 1 is applied, the structure described in Structure Example 2 or Structure Example 3 can also be applied to the display device of one embodiment of the present invention.

[Display Device 100A]

Figure 10:
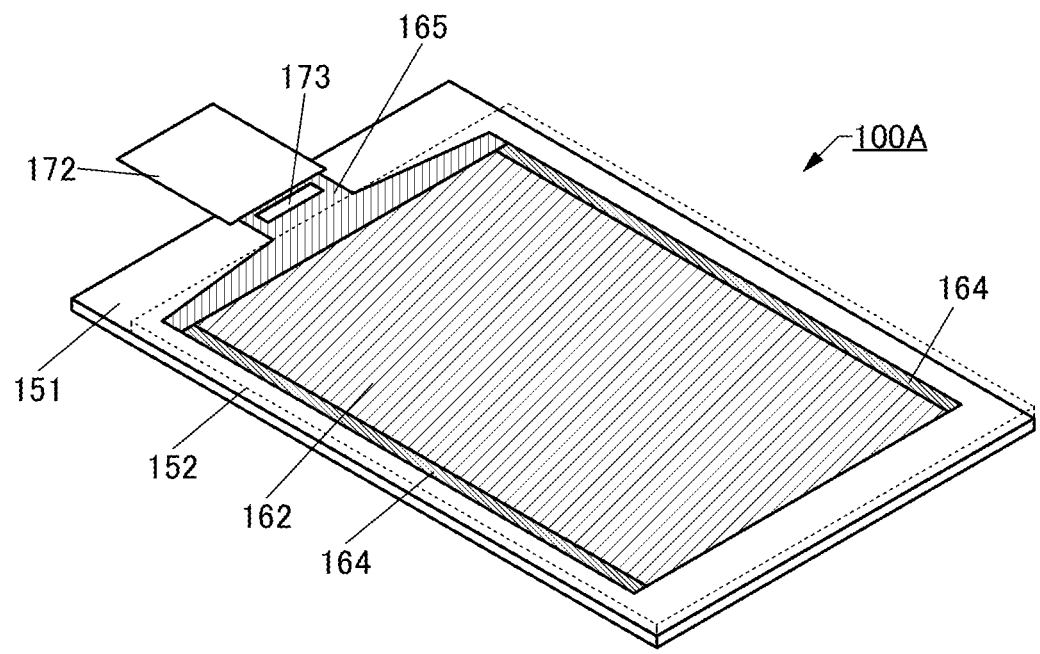
FIG. 10 is a perspective view showing a display device example.
Figure 11:
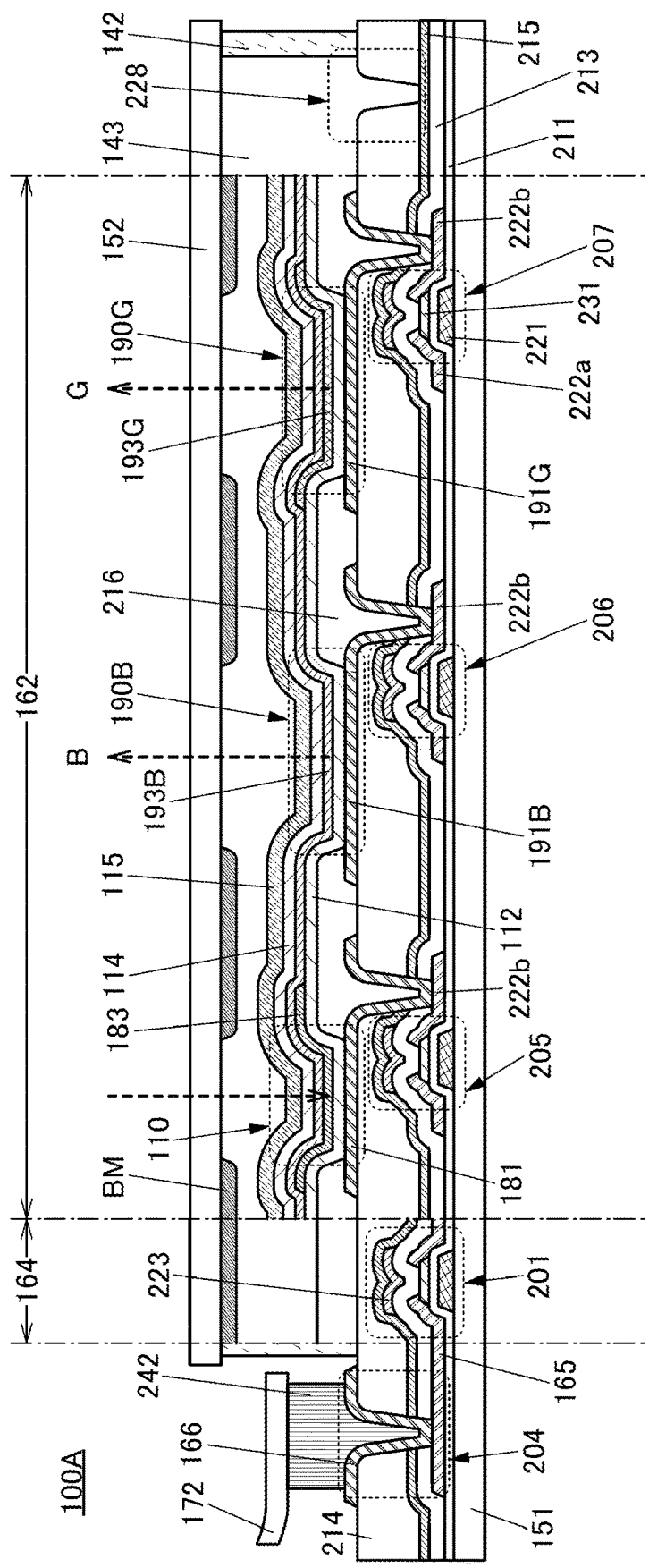
FIG. 11 is a cross-sectional view showing a display device example.

FIG. 10 shows a perspective view of a display device 100A, and FIG. 11 shows a cross-sectional view of the display device 100A.

The display device 100A has a structure in which the substrate 152 and the substrate 151 are bonded to each other. In FIG. 10, the substrate 152 is denoted by a dashed line.

The display device 100A includes a display portion 162, a circuit 164, a wiring 165, and the like. FIG. 10 illustrates an example in which the display device 100A is provided with an IC (integrated circuit) 173 and an FPC 172. Thus, the structure illustrated in FIG. 10 can be regarded as a display module including the display device 100A, the IC, and the FPC.

As the circuit 164, for example, a scan line driver circuit can be used.

The wiring 165 has a function of supplying a signal and power to the display portion 162 and the circuit 164. The signal and power are input to the wiring 165 from the outside through the FPC 172 or from the IC 173.

FIG. 10 illustrates an example in which the IC 173 is provided over the substrate 151 by a COG (Chip On Glass) method, a COF (Chip on Film) method, or the like. An IC including a scan line driver circuit, a signal line driver circuit, or the like can be used as the IC 173, for example. Note that the display device 100A and the display module may have a structure that is not provided with an IC. The IC may be implemented on the FPC by a COF method or the like.

FIG. 11 illustrates an example of a cross section including part of a region including the FPC 172, part of a region including the circuit 164, part of a region including the display portion 162, and part of a region including an end portion of the display device 100A illustrated in FIG. 10.

The display device 100A in FIG. 11 includes a transistor 201, a transistor 205, a transistor 206, a transistor 207, the light-emitting element 190B, the light-emitting element 190G, the light-receiving element 110, and the like between the substrate 151 and the substrate 152.

The substrate 152 and the insulating layer 214 are bonded to each other with the adhesive layer 142. A solid sealing structure, a hollow sealing structure, or the like can be employed to seal the light-emitting element 190 and the light-receiving element 110. In FIG. 11, a hollow sealing structure is employed in which a space 143 surrounded by the substrate 152, the adhesive layer 142, and the insulating layer 214 is filled with an inert gas (e.g., nitrogen or argon). The adhesive layer 142 may be provided to overlap with the light-emitting element 190. The space 143 surrounded by the substrate 152, the adhesive layer 142, and the insulating layer 214 may be filled with a resin different from that of the adhesive layer 142.

The light-emitting element 190B has a stacked-layer structure in which a pixel electrode 191B, the common layer 112, the light-emitting layer 193B, the common layer 114, and the common electrode 115 are stacked in this order from the insulating layer 214 side. The pixel electrode 191B is connected to a conductive layer 222b included in the transistor 206 through an opening provided in the insulating layer 214. The transistor 206 has a function of controlling the driving of the light-emitting element 190B. An end portion of the pixel electrode 191B is covered with the bank 216. The pixel electrode 191B includes a material that reflects visible light, and the common electrode 115 includes a material that transmits visible light.

The light-emitting element 190G has a stacked-layer structure in which a pixel electrode 191G, the common layer 112, the light-emitting layer 193G, the light-emitting layer 193B, the common layer 114, and the common electrode 115 are stacked in this order from the insulating layer 214 side. The pixel electrode 191G is connected to the conductive layer 222b included in the transistor 207 through an opening provided in the insulating layer 214. The transistor 207 has a function of controlling the driving of the light-emitting element 190G. An end portion of the pixel electrode 191G is covered with the bank 216. The pixel electrode 191G includes a material that reflects visible light.

The light-receiving element 110 has a stacked-layer structure in which the pixel electrode 181, the common layer 112, the active layer 183, the light-emitting layer 193B, the common layer 114, and the common electrode 115 are stacked in this order from the insulating layer 214 side. The pixel electrode 181 is electrically connected to the conductive layer 222b included in the transistor 205 through an opening provided in the insulating layer 214. An end portion of the pixel electrode 181 is covered with the bank 216. The pixel electrode 181 includes a material that reflects visible light.

Light emitted by the light-emitting element 190 is emitted toward the substrate 152. Light enters the light-receiving element 110 through the substrate 152 and the space 143. For the substrate 152, a material having a high visible-light-transmitting property is preferably used.

The pixel electrode 181, the pixel electrode 191B, and the pixel electrode 191G can be formed using the same material in the same step. The common layer 112, the common layer 114, and the common electrode 115 are shared by the light-receiving element 110 and the light-emitting elements 190 for the respective colors. The light-receiving element 110 has the structure of the light-emitting element 190B to which the active layer 183 is added. The light-receiving element 110 and the light-emitting element 190G can have a common structure except for the active layer 183 and the light-emitting layer 193G. Thus, the light-receiving element 110 can be incorporated into the display device 100A without a significant increase in the number of manufacturing steps.

The light-blocking layer BM is provided on the surface of the substrate 152 on the substrate 151 side. The light-blocking layer BM has an opening in a position overlapping with the light-receiving element 110 and an opening in a position overlapping with the light-emitting element 190. Providing the light-blocking layer BM can control the range where the light-receiving element 110 detects light. Furthermore, with the light-blocking layer BM, light can be prevented from directly entering the light-receiving element 110 from the light-emitting element 190 without passing through any object. Hence, a sensor with less noise and high sensitivity can be obtained.

The transistor 201, the transistor 205, the transistor 206, and the transistor 207 are formed over the substrate 151. These transistors can be formed using the same materials in the same steps.

An insulating layer 211, an insulating layer 213, an insulating layer 215, and the insulating layer 214 are provided in this order over the substrate 151. Parts of the insulating layer 211 function as gate insulating layers of the transistors. Parts of the insulating layer 213 function as gate insulating layers of the transistors. The insulating layer 215 is provided to cover the transistors. The insulating layer 214 is provided to cover the transistors and has a function of a planarization layer. Note that the number of gate insulating layers and the number of insulating layers covering the transistor are not limited and either a single layer or two or more layers may be employed.

A material through which impurities such as water and hydrogen do not easily diffuse is preferably used for at least one of the insulating layers that cover the transistors. Thus, such an insulating layer can serve as a barrier layer. Such a structure can effectively inhibit diffusion of impurities into the transistors from the outside and increase the reliability of the display device.

An inorganic insulating film is preferably used as each of the insulating layer 211, the insulating layer 213, and the insulating layer 215. As the inorganic insulating film, for example, an inorganic insulating film such as a silicon nitride film, a silicon oxynitride film, a silicon oxide film, a silicon nitride oxide film, an aluminum oxide film, or an aluminum nitride film can be used. A hafnium oxide film, an yttrium oxide film, a zirconium oxide film, a gallium oxide film, a tantalum oxide film, a magnesium oxide film, a lanthanum oxide film, a cerium oxide film, a neodymium oxide film, or the like may also be used. A stack including two or more of the above insulating films may also be used.

Here, an organic insulating film often has a lower barrier property than an inorganic insulating film. Therefore, the organic insulating film preferably has an opening in the vicinity of an end portion of the display device 100A. This can inhibit entry of impurities from the end portion of the display device 100A through the organic insulating film. Alternatively, the organic insulating film may be formed so that its end portion is positioned on the inner side compared to the end portion of the display device 100A, to prevent the organic insulating film from being exposed at the end portion of the display device 100A.

An organic insulating film is suitable for the insulating layer 214 functioning as a planarization layer. Examples of materials which can be used for the organic insulating film include an acrylic resin, a polyimide resin, an epoxy resin, a polyamide resin, a polyimide-amide resin, a siloxane resin, a benzocyclobutene-based resin, a phenol resin, and precursors of these resins.

In a region 228 illustrated in FIG. 11, an opening is formed in the insulating layer 214. This can inhibit entry of impurities into the display portion 162 from the outside through the insulating layer 214 even when an organic insulating film is used as the insulating layer 214. As a result, the display device 100A can have higher reliability.

Each of the transistor 201, the transistor 205, the transistor 206, and the transistor 207 includes a conductive layer 221 functioning as a gate, the insulating layer 211 functioning as the gate insulating layer, a conductive layer 222a and the conductive layer 222b functioning as a source and a drain, a semiconductor layer 231, the insulating layer 213 functioning as the gate insulating layer, and a conductive layer 223 functioning as a gate. Here, a plurality of layers obtained by processing the same conductive film are shown with the same hatching pattern. The insulating layer 211 is positioned between the conductive layer 221 and the semiconductor layer 231. The insulating layer 213 is positioned between the conductive layer 223 and the semiconductor layer 231.

There is no particular limitation on the structure of the transistors included in the display device of this embodiment. For example, a planar transistor, a staggered transistor, or an inverted staggered transistor can be used. A top-gate or a bottom-gate transistor structure may be employed. Alternatively, gates may be provided above and below a semiconductor layer in which a channel is formed.

The structure in which the semiconductor layer where a channel is formed is provided between two gates is used for the transistor 201, the transistor 205, the transistor 206, and the transistor 207. The two gates may be connected to each other and supplied with the same signal to operate the transistor. Alternatively, by supplying a potential for controlling the threshold voltage to one of the two gates and a potential for driving to the other, the threshold voltage of the transistor may be controlled.

There is no particular limitation on the crystallinity of a semiconductor material used for the transistors, and an amorphous semiconductor or a semiconductor having crystallinity (a microcrystalline semiconductor, a polycrystalline semiconductor, a single-crystal semiconductor, or a semiconductor partly including crystal regions) may be used. A semiconductor having crystallinity is preferably used, in which case deterioration of the transistor characteristics can be suppressed.

It is preferable that a semiconductor layer of a transistor contain a metal oxide (also referred to as an oxide semiconductor). Alternatively, the semiconductor layer of the transistor may contain silicon. Examples of silicon include amorphous silicon and crystalline silicon (e.g., low-temperature polysilicon or single crystal silicon).

The semiconductor layer preferably contains indium, M (M is one or more kinds selected from gallium, aluminum, silicon, boron, yttrium, tin, copper, vanadium, beryllium, titanium, iron, nickel, germanium, zirconium, molybdenum, lanthanum, cerium, neodymium, hafnium, tantalum, tungsten, and magnesium), and zinc, for example. Specifically, M is preferably one or more kinds selected from aluminum, gallium, yttrium, and tin.

It is particularly preferable to use an oxide containing indium (In), gallium (Ga), and zinc (Zn) (also referred to as IGZO) for the semiconductor layer.

When the semiconductor layer is an In-M-Zn oxide, the atomic ratio of In is preferably greater than or equal to the atomic ratio of M in the In-M-Zn oxide. Examples of the atomic ratio of the metal elements in such an In-M-Zn oxide include In:M:Zn=1:1:1 or a composition in the neighborhood thereof, In:M:Zn=1:1:1.2 or a composition in the neighborhood thereof, In:M:Zn=2:1:3 or a composition in the neighborhood thereof, In:M:Zn=3:1:2 or a composition in the neighborhood thereof, In:M:Zn=4:2:3 or a composition in the neighborhood thereof, In:M:Zn=4:2:4.1 or a composition in the neighborhood thereof, In:M:Zn=5:1:3 or a composition in the neighborhood thereof, In:M:Zn=5:1:6 or a composition in the neighborhood thereof, In:M:Zn=5:1:7 or a composition in the neighborhood thereof, In:M:Zn=5:1:8 or a composition in the neighborhood thereof, In:M:Zn=6:1:6 or a composition in the neighborhood thereof, and In:M:Zn=5:2:5 or a composition in the neighborhood thereof. Note that "a composition in the neighborhood" includes ±30% of an intended atomic ratio.

For example, in describing an atomic ratio of "In:Ga:Zn=4:2:3 or a composition in the neighborhood thereof", the case is included where the atomic proportion of Ga is greater than or equal to 1 and less than or equal to 3 and the atomic proportion of Zn is greater than or equal to 2 and less than or equal to 4 with the atomic proportion of In being 4. In describing an atomic ratio of "In:Ga:Zn=5:1:6 or a composition in the neighborhood thereof", the case is included where the atomic proportion of Ga is greater than 0.1 and less than or equal to 2 and the atomic proportion of Zn is greater than or equal to 5 and less than or equal to 7 with the atomic proportion of In being 5. In describing an atomic ratio of "In:Ga:Zn=1:1:1 or a composition in the neighborhood thereof", the case is included where the atomic proportion of Ga is greater than 0.1 and less than or equal to 2 and the atomic proportion of Zn is greater than 0.1 and less than or equal to 2 with the atomic proportion of In being 1.

The transistor included in the circuit 164 and the transistor included in the display portion 162 may have the same structure or different structures. One structure or two or more kinds of structures may be employed for a plurality of transistors included in the circuit 164. Similarly, one structure or two or more kinds of structures may be employed for a plurality of transistors included in the display portion 162.

A connection portion 204 is provided in a region of the substrate 151 not overlapping with the substrate 152. In the connection portion 204, the wiring 165 is electrically connected to the FPC 172 via a conductive layer 166 and a connection layer 242. On the top surface of the connection portion 204, the conductive layer 166 obtained by processing the same conductive film as the pixel electrode 191 is exposed. Thus, the connection portion 204 and the FPC 172 can be electrically connected to each other through the connection layer 242.

Any of a variety of optical members can be arranged on the outer side of the substrate 152. Examples of the optical members include a polarizing plate, a retardation plate, a light diffusion layer (a diffusion film or the like), an anti-reflective layer, and a light-condensing film. Furthermore, an antistatic film preventing the attachment of dust, a water repellent film suppressing the attachment of stain, a hard coat film inhibiting generation of a scratch caused by the use, a shock absorbing layer or the like may be arranged on the outside of the substrate 152.

For each of the substrate 151 and the substrate 152, glass, quartz, ceramic, sapphire, a resin, or the like can be used. When a flexible material is used for the substrate 151 and the substrate 152, the flexibility of the display device can be increased.

As the adhesive layer, a variety of curable adhesives, e.g., a photocurable adhesive such as an ultraviolet curable adhesive, a reactive curable adhesive, a thermosetting adhesive, and an anaerobic adhesive can be used. Examples of these adhesives include an epoxy resin, an acrylic resin, a silicone resin, a phenol resin, a polyimide resin, an imide resin, a PVC (polyvinyl chloride) resin, a PVB (polyvinyl butyral) resin, and an EVA (ethylene vinyl acetate) resin. In particular, a material with low moisture permeability, such as an epoxy resin, is preferred. Alternatively, a two-component resin may be used. An adhesive sheet or the like may be used.

As the connection layer 242, an anisotropic conductive film (ACF), an anisotropic conductive paste (ACP), or the like can be used.

The light-emitting element 190 may have a top emission, bottom emission, or dual emission structure, for example. A conductive film that transmits visible light is used as the electrode through which light is extracted. A conductive film that reflects visible light is preferably used as the electrode through which no light is extracted.

The light-emitting element 190 includes at least the light-emitting layer 193. The light-emitting element 190 may further include, as a layer other than the light-emitting layer 193, a layer containing a substance with a high hole-injection property, a substance with a high hole-transport property, a hole-blocking material, a substance with a high electron-transport property, a substance with a high electron-injection property, a substance with a bipolar property (a substance with high electron- and hole-transport properties), or the like. For example, the common layer 112 preferably includes one or both of a hole-injection layer and a hole-transport layer. For example, the common layer 114 preferably includes one or both of an electron-transport layer and an electron-injection layer.

Either a low molecular compound or a high molecular compound can be used for the common layer 112, the light-emitting layer 193, and the common layer 114 and an inorganic compound may also be contained. The layers that constitute the common layer 112, the light-emitting layer 193, and the common layer 114 can each be formed by a method such as an evaporation method (including a vacuum evaporation method), a transfer method, a printing method, an inkjet method, or a coating method.

The light-emitting layer 193 is a layer including a light-emitting substance. The light-emitting layer 193 can include one or more kinds of light-emitting substances. As the light-emitting substance, a substance that exhibits an emission color of blue, purple, bluish purple, green, yellowish green, yellow, orange, red, or the like is appropriately used. As the light-emitting substance, a substance that emits near-infrared light can also be used.

The active layer 183 of the light-receiving element 110 contains a semiconductor. Examples of the semiconductor include an inorganic semiconductor such as silicon and an organic semiconductor including an organic compound. This embodiment shows an example in which an organic semiconductor is used as the semiconductor contained in the active layer. The use of an organic semiconductor is preferable because the light-emitting layer 193 of the light-emitting element 190 and the active layer 183 of the light-receiving element 110 can be formed by the same method (e.g., a vacuum evaporation method) and thus the same manufacturing apparatus can be used.

Examples of an n-type semiconductor material included in the active layer 183 are electron-accepting organic semiconductor materials such as fullerene (e.g., $C_{60}$ and $C_{70}$) and derivatives thereof. As an example of a p-type semiconductor material included in the active layer 183, an electron-donating organic semiconductor material such as copper(II) phthalocyanine (CuPc) or tetraphenyldibenzoperiflanthene (DBP) can be given.

For example, the active layer 183 is preferably formed by co-evaporation of an n-type semiconductor and a p-type semiconductor.

Examples of materials that can be used for conductive layers of a variety of wirings and electrodes and the like constituting the display device in addition to a gate, a source, and a drain of a transistor include metals such as aluminum, titanium, chromium, nickel, copper, yttrium, zirconium, molybdenum, silver, tantalum, and tungsten and an alloy containing any of these metals as its main component. A film containing any of these materials can be used in a single layer or as a stacked-layer structure.

As a light-transmitting conductive material, a conductive oxide such as indium oxide, indium tin oxide, indium zinc oxide, zinc oxide, or zinc oxide containing gallium, or graphene can be used. Alternatively, a metal material such as gold, silver, platinum, magnesium, nickel, tungsten, chromium, molybdenum, iron, cobalt, copper, palladium, or titanium, or an alloy material containing the metal material can be used. Further alternatively, a nitride of the metal material (e.g., titanium nitride) or the like may be used. Note that in the case of using the metal material or the alloy material (or the nitride thereof), the thickness is preferably set small enough to allow light transmission. A stacked-layer film of any of the above materials can be used for the conductive layers. For example, when a stacked film of indium tin oxide and an alloy of silver and magnesium, or the like is used, the conductivity can be increased, which is preferable. They can also be used for conductive layers of a variety of wirings and electrodes and the like that constitute a display device, and conductive layers (conductive layers functioning as a pixel electrode or a common electrode) included in a display element.

As an insulating material that can be used for each insulating layer, for example, a resin such as an acrylic resin or an epoxy resin, and an inorganic insulating material such as silicon oxide, silicon oxynitride, silicon nitride oxide, silicon nitride, or aluminum oxide can be given.

[Display Device 100B]

FIG. 12A shows a cross-sectional view of a display device 100B.

The display device 100B is different from the display device 100A mainly in that the lens 149 and the protective layer 195 are included. Detailed description of a structure similar to that of the display device 100A is omitted.

Providing the protective layer 195 covering the light-receiving element 110 and the light-emitting element 190 can inhibit entry of impurities such as water into the light-receiving element 110 and the light-emitting element 190, so that the reliability of the light-receiving element 110 and the light-emitting element 190 can be increased.

In the region 228 in the vicinity of an end portion of the display device 100B, the insulating layer 215 and the protective layer 195 are preferably in contact with each other through an opening in the insulating layer 214. In particular, the inorganic insulating film included in the insulating layer 215 and the inorganic insulating film included in the protective layer 195 are preferably in contact with each other. Thus, entry of impurities from the outside into the display portion 162 through the organic insulating film can be inhibited. As a result, the display device 100B can have higher reliability.

FIG. 12B illustrates an example in which the protective layer 195 has a three-layer structure. In FIG. 12B, the protective layer 195 includes an inorganic insulating layer 195a over the common electrode 115, an organic insulating layer 195b over the inorganic insulating layer 195a, and an inorganic insulating layer 195c over the organic insulating layer 195b.

An end portion of the inorganic insulating layer 195a and an end portion of the inorganic insulating layer 195c extend beyond an end portion of the organic insulating layer 195b and are in contact with each other. The inorganic insulating layer 195a is in contact with the insulating layer 215 (inorganic insulating layer) through the opening in the insulating layer 214 (organic insulating layer). Accordingly, the light-receiving element 110 and the light-emitting element 190 can be surrounded by the insulating layer 215 and the protective layer 195, whereby the reliability of the light-receiving element 110 and the light-emitting element 190 can be increased.

As described above, the protective layer 195 may have a stacked-layer structure of an organic insulating film and an inorganic insulating film. In that case, an end portion of the inorganic insulating film preferably extends beyond an end portion of the organic insulating film.

The lens 149 is provided on the surface of the substrate 152 on the substrate 151 side. The lens 149 has a convex surface on the substrate 151 side. The lens 149 is provided to overlap with a light-receiving region of the light-receiving element 110. Thus, the sensitivity and accuracy of a sensor using the light-receiving element 110 can be increased.

The lens 149 preferably has a refractive index greater than or equal to 1.3 and less than or equal to 2.5. The lens 149 can be formed using at least one of an inorganic material and an organic material. For example, a material containing a resin can be used for the lens 149. Moreover, a material containing at least one of an oxide and a sulfide can be used for the lens 149.

Specifically, a resin containing chlorine, bromine, or iodine, a resin containing a heavy metal atom, a resin having an aromatic ring, a resin containing sulfur, and the like can be used for the lens 149. Alternatively, a material containing a resin and nanoparticles of a material having a higher refractive index than the resin can be used for the lens 149. Titanium oxide, zirconium oxide, or the like can be used for the nanoparticles.

In addition, cerium oxide, hafnium oxide, lanthanum oxide, magnesium oxide, niobium oxide, tantalum oxide, titanium oxide, yttrium oxide, zinc oxide, an oxide containing indium and tin, an oxide containing indium, gallium, and zinc, and the like can be used for the lens 149. Alternatively, zinc sulfide or the like can be used for the lens 149.

In the display device 100B, the protective layer 195 and the substrate 152 are bonded to each other with the adhesive layer 142. The adhesive layer 142 is provided to overlap with the light-receiving element 110 and the light-emitting element 190; that is, the display device 100B employs a solid sealing structure.

[Display Device 100C]

FIG. 13A shows a cross-sectional view of a display device 100C.

The display device 100C differs from the display device 100B in transistor structures.

The display device 100C includes a transistor 208, a transistor 209, and a transistor 210 over the substrate 151.

Each of the transistor 208, the transistor 209, and the transistor 210 includes the conductive layer 221 functioning as a gate, the insulating layer 211 functioning as a gate insulating layer, a semiconductor layer including a channel formation region 231i and a pair of low-resistance regions 231n, the conductive layer 222a connected to one of the pair of low-resistance regions 231n, the conductive layer 222b connected to the other of the pair of low-resistance regions 231n, an insulating layer 225 functioning as a gate insulating layer, the conductive layer 223 functioning as a gate, and the insulating layer 215 covering the conductive layer 223. The insulating layer 211 is positioned between the conductive layer 221 and the channel formation region 231i. The insulating layer 225 is positioned between the conductive layer 223 and the channel formation region 231i.

The conductive layer 222a and the conductive layer 222b are connected to the low-resistance regions 231n through openings provided in the insulating layer 225 and the insulating layer 215. One of the conductive layer 222a and the conductive layer 222b serves as a source, and the other serves as a drain.

The pixel electrode 191B of the light-emitting element 190B is electrically connected to one of the pair of low-resistance regions 231n of the transistor 208 through the conductive layer 222b.

The pixel electrode 181 of the light-receiving element 110 is electrically connected to the other of the pair of low-resistance regions 231n of the transistor 209 through the conductive layer 222b.

FIG. 13A illustrates an example in which the insulating layer 225 covers a top surface and a side surface of the semiconductor layer. Meanwhile, in FIG. 13B, the insulating layer 225 overlaps with the channel formation region 231i of the semiconductor layer 231 and does not overlap with the low-resistance regions 231n. The structure illustrated in FIG. 13B can be obtained by processing the insulating layer 225 with the conductive layer 223 as a mask, for example. In FIG. 13B, the insulating layer 215 is provided to cover the insulating layer 225 and the conductive layer 223, and the conductive layer 222a and the conductive layer 222b are connected to the low-resistance regions 231n through openings in the insulating layer 215. Furthermore, an insulating layer 218 covering the transistor may be provided.

[Display Device 100D]

Figure 14:
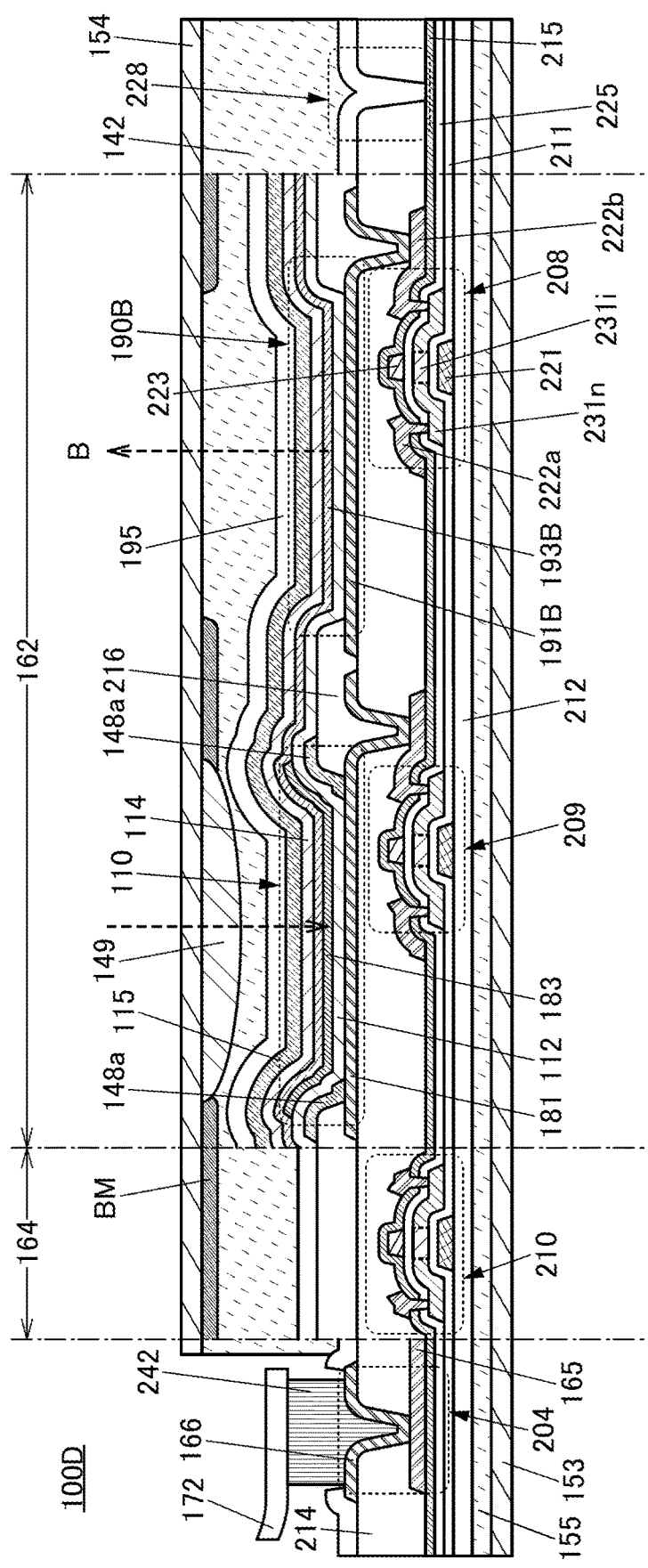
FIG. 14 is a cross-sectional view showing a display device example.

FIG. 14 shows a cross-sectional view of a display device 100D.

The display device 100D is different from the display device 100C in that a colored layer 148a is included.

The colored layer 148a includes a portion in contact with a top surface of the pixel electrode 181 in the light-receiving element 110 and a portion in contact with a side surface of the bank 216.

When the colored layer 148a absorbs stray light generated in the display device 100D, the amount of stray light entering the light-receiving element 110 can be reduced. As a result, noise can be reduced, and the sensitivity of a sensor using the light-receiving element 110 can be increased.

In addition, the display device 100D differs from the display device 100C in that neither the substrate 151 nor the substrate 152 is included and that the substrate 153, the substrate 154, the adhesive layer 155, and the insulating layer 212 are included.

The substrate 153 and the insulating layer 212 are bonded to each other with the adhesive layer 155. The substrate 154 and the protective layer 195 are bonded to each other with the adhesive layer 142.

The display device 100D is formed in such a manner that the insulating layer 212, the transistor 208, the transistor 209, the transistor 210, the light-receiving element 110, the light-emitting element 190B, and the like which are formed over a formation substrate are transferred onto the substrate 153. The substrate 153 and the substrate 154 are preferably flexible. Accordingly, the flexibility of the display device 100D can be increased.

The inorganic insulating film that can be used as the insulating layer 211 and the insulating layer 215 can be used as the insulating layer 212.

The display device 100C shows an example in which the lens 149 is not provided, and the display device 100D shows an example in which the lens 149 is provided. The lens 149 can be provided as appropriate in accordance with usage of a sensor or the like.

[Metal Oxide]

A metal oxide that can be used for the semiconductor layer will be described below.

Note that in this specification and the like, a metal oxide containing nitrogen is also collectively referred to as a metal oxide in some cases. A metal oxide containing nitrogen may be referred to as a metal oxynitride. For example, a metal oxide containing nitrogen, such as zinc oxynitride (ZnON), may be used for the semiconductor layer.

Note that in this specification and the like, "CAAC (c-axis aligned crystal)" and "CAC (Cloud-Aligned Composite)" might be stated. CAAC refers to an example of a crystal structure, and CAC refers to an example of a function or a material composition.

For example, a CAC (Cloud-Aligned Composite)-OS (Oxide Semiconductor) can be used for the semiconductor layer.

A CAC-OS or a CAC-metal oxide has a conducting function in part of the material and has an insulating function in another part of the material; as a whole, the CAC-OS or the CAC-metal oxide has a function of a semiconductor. In the case where the CAC-OS or the CAC-metal oxide is used in a semiconductor layer of a transistor, the conducting function is to allow electrons (or holes) serving as carriers to flow, and the insulating function is to not allow electrons serving as carriers to flow. By the complementary action of the conducting function and the insulating function, a switching function (On/Off function) can be given to the CAC-OS or the CAC-metal oxide. In the CAC-OS or the CAC-metal oxide, separation of the functions can maximize each function.

Furthermore, the CAC-OS or the CAC-metal oxide includes conductive regions and insulating regions. The conductive regions have the above-described conducting function, and the insulating regions have the above-described insulating function. Furthermore, in some cases, the conductive regions and the insulating regions in the material are separated at the nanoparticle level. Furthermore, in some cases, the conductive regions and the insulating regions are unevenly distributed in the material. Furthermore, in some cases, the conductive regions are observed to be coupled in a cloud-like manner with their boundaries blurred.

Furthermore, in the CAC-OS or the CAC-metal oxide, the conductive regions and the insulating regions each have a size greater than or equal to 0.5 nm and less than or equal to 10 nm, preferably greater than or equal to 0.5 nm and less than or equal to 3 nm, and are dispersed in the material, in some cases.

Furthermore, the CAC-OS or the CAC-metal oxide includes components having different bandgaps. For example, the CAC-OS or the CAC-metal oxide includes a component having a wide gap due to the insulating region and a component having a narrow gap due to the conductive region. In the case of the structure, when carriers flow, carriers mainly flow in the component having a narrow gap. Furthermore, the component having a narrow gap complements the component having a wide gap, and carriers also flow in the component having a wide gap in conjunction with the component having a narrow gap. Therefore, in the case where the above-described CAC-OS or CAC-metal oxide is used in a channel formation region of a transistor, high current driving capability in an on state of the transistor, that is, a high on-state current and high field-effect mobility can be obtained.

In other words, the CAC-OS or the CAC-metal oxide can also be referred to as a matrix composite or a metal matrix composite.

Oxide semiconductors (metal oxides) are classified into a single crystal oxide semiconductor and a non-single crystal oxide semiconductor. Examples of a non-single-crystal oxide semiconductor include a CAAC-OS (c-axis aligned crystalline oxide semiconductor), a polycrystalline oxide semiconductor, an nc-OS (nanocrystalline oxide semiconductor), an amorphous-like oxide semiconductor (a-like OS), and an amorphous oxide semiconductor.

The CAAC-OS has c-axis alignment, a plurality of nanocrystals are connected in the a-b plane direction, and its crystal structure has distortion. Note that the distortion refers to a portion where the direction of a lattice arrangement changes between a region with a regular lattice arrangement and another region with a regular lattice arrangement in a region where the plurality of nanocrystals are connected.

The nanocrystal is basically a hexagon but is not always a regular hexagon and is a non-regular hexagon in some cases. Furthermore, a pentagonal or heptagonal lattice arrangement, for example, is included in the distortion in some cases. Note that it is difficult to observe a clear crystal grain boundary (also referred to as grain boundary) even in the vicinity of distortion in the CAAC-OS. That is, formation of a crystal grain boundary is found to be inhibited by the distortion of a lattice arrangement. This is because the CAAC-OS can tolerate distortion owing to a low density of arrangement of oxygen atoms in the a-b plane direction, an interatomic bond length changed by substitution of a metal element, and the like.

Furthermore, the CAAC-OS tends to have a layered crystal structure (also referred to as a layered structure) in which a layer containing indium and oxygen (hereinafter, In layer) and a layer containing the element M, zinc, and oxygen (hereinafter, (M,Zn) layer) are stacked. Note that indium and the element M can be replaced with each other, and when the element M in the (M,Zn) layer is replaced with indium, the layer can also be referred to as an (In,M,Zn) layer. Furthermore, when indium in the In layer is replaced with the element M, the layer can be referred to as an (In,M) layer.

The CAAC-OS is a metal oxide with high crystallinity. On the other hand, a clear crystal grain boundary cannot be observed in the CAAC-OS; thus, it can be said that a reduction in electron mobility due to the crystal grain boundary is less likely to occur. Entry of impurities, formation of defects, or the like might decrease the crystallinity of a metal oxide; thus, it can be said that the CAAC-OS is a metal oxide that has small amounts of impurities and defects (e.g., oxygen vacancies (also referred to as $V_O$)). Thus, a metal oxide including a CAAC-OS is physically stable. Therefore, the metal oxide including a CAAC-OS is resistant to heat and has high reliability.

In the nc-OS, a microscopic region (e.g., a region with a size greater than or equal to 1 nm and less than or equal to 10 nm, in particular, a region with a size greater than or equal to 1 nm and less than or equal to 3 nm) has a periodic atomic arrangement. Furthermore, there is no regularity of crystal orientation between different nanocrystals in the nc-OS. Thus, the orientation in the whole film is not observed. Accordingly, the nc-OS cannot be distinguished from an a-like OS or an amorphous oxide semiconductor by some analysis methods.

Note that indium-gallium-zinc oxide (hereinafter referred to as IGZO) that is a kind of metal oxide containing indium, gallium, and zinc has a stable structure in some cases by being formed of the above-described nanocrystals. In particular, crystals of IGZO tend not to grow in the air and thus, a stable structure is obtained when IGZO is formed of smaller crystals (e.g., the above-described nanocrystals) rather than larger crystals (here, crystals with a size of several millimeters or several centimeters).

An a-like OS is a metal oxide having a structure between those of the nc-OS and an amorphous oxide semiconductor. The a-like OS includes a void or a low-density region. That is, the a-like OS has low crystallinity as compared with the nc-OS and the CAAC-OS.

An oxide semiconductor (metal oxide) can have various structures that show different properties. Two or more of the amorphous oxide semiconductor, the polycrystalline oxide semiconductor, the a-like OS, the nc-OS, and the CAAC-OS may be included in an oxide semiconductor of one embodiment of the present invention.

A metal oxide film that functions as a semiconductor layer can be deposited using either or both of an inert gas and an oxygen gas. Note that there is no particular limitation on the flow rate ratio of oxygen (the partial pressure of oxygen) at the time of depositing the metal oxide film. However, to obtain a transistor having high field-effect mobility, the flow rate ratio of oxygen (the partial pressure of oxygen) at the time of depositing the metal oxide film is preferably higher than or equal to 0% and lower than or equal to 30%, further preferably higher than or equal to 5% and lower than or equal to 30%, still further preferably higher than or equal to 7% and lower than or equal to 15%.

The energy gap of the metal oxide is preferably 2 eV or more, further preferably 2.5 eV or more, still further preferably 3 eV or more. With use of a metal oxide having such a wide energy gap, the off-state current of the transistor can be reduced.

The substrate temperature during the deposition of the metal oxide film is preferably lower than or equal to 350° C., further preferably higher than or equal to room temperature and lower than or equal to 200° C., still further preferably higher than or equal to room temperature and lower than or equal to 130° C. The substrate temperature during the deposition of the metal oxide film is preferably room temperature because productivity can be increased.

The metal oxide film can be formed by a sputtering method. Alternatively, a PLD method, a PECVD method, a thermal CVD method, an ALD method, or a vacuum evaporation method, for example, may be used.

As described above, the display device of this embodiment includes a light-receiving element and a light-emitting element in a display portion, and the display portion has both a function of displaying an image and a function of detecting light. Thus, the size and weight of an electronic device can be smaller than those in the case where a sensor is provided outside a display portion or outside a display device. Moreover, an electronic device having more functions can be obtained by a combination of the display device of this embodiment and a sensor provided outside the display portion or outside the display device.

In the light-receiving element, at least one of the layers provided between the pair of electrodes can have a structure in common with a layer in the light-emitting element (EL element). For example, in the light-receiving element, all of the layers other than the active layer can have structures in common with the layers in the light-emitting element (EL element). That is, with only the addition of the step of depositing the active layer to the manufacturing process of the light-emitting element, the light-emitting element and the light-receiving element can be formed over one substrate. In the light-receiving element and the light-emitting element, their pixel electrodes can be formed using the same material in the same step, and their common electrodes can be formed using the same material in the same step. When a circuit electrically connected to the light-receiving element and a circuit electrically connected to the light-emitting element are formed using the same material in the same step, the manufacturing process of the display device can be simplified. In such a manner, a display device that incorporates a light-receiving element and is highly convenient can be manufactured without complicated steps.

This embodiment can be combined with the other embodiments as appropriate. In this specification, in the case where a plurality of structure examples are shown in one embodiment, the structure examples can be combined as appropriate.

Embodiment 2

In this embodiment, a display device of one embodiment of the present invention will be described with reference to FIG. 15.

A display device of one embodiment of the present invention includes first pixel circuits including a light-receiving element and second pixel circuits including a light-emitting element. The first pixel circuits and the second pixel circuits are arranged in a matrix.

Figure 15A:
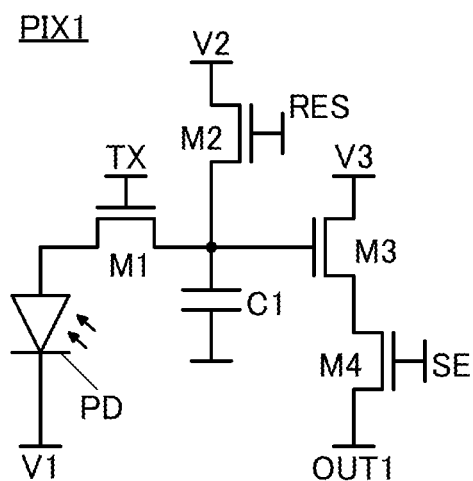
FIG. 15A and FIG. 15B are circuit diagrams showing pixel circuit examples.
Figure 15B:
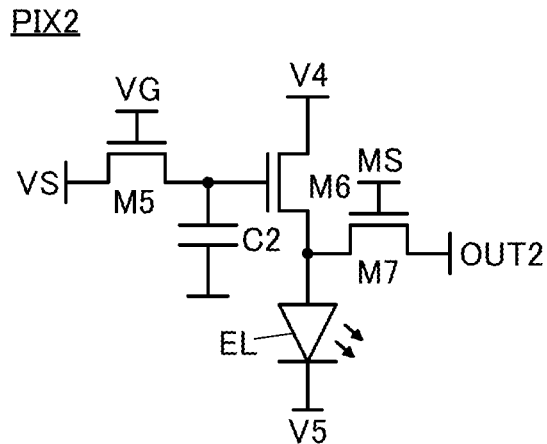

FIG. 15A illustrates an example of the first pixel circuit including a light-receiving element. FIG. 15B illustrates an example of the second pixel circuit including a light-emitting element.

A pixel circuit PIX1 illustrated in FIG. 15A includes a light-receiving element PD, a transistor M1, a transistor M2, a transistor M3, a transistor M4, and a capacitor C1. Here, an example of the case where a photodiode is used as the light-receiving element PD is illustrated.

A cathode of the light-receiving element PD is electrically connected to a wiring V1, and an anode is electrically connected to one of a source and a drain of the transistor M1. A gate of the transistor M1 is electrically connected to a wiring TX, and the other of the source and the drain is electrically connected to one electrode of the capacitor C1, one of a source and a drain of the transistor M2, and a gate of the transistor M3. A gate of the transistor M2 is electrically connected to a wiring RES, and the other of the source and the drain is electrically connected to a wiring V2. One of a source and a drain of the transistor M3 is electrically connected to a wiring V3, and the other of the source and the drain is electrically connected to one of a source and a drain of the transistor M4. A gate of the transistor M4 is electrically connected to a wiring SE, and the other of the source and the drain is electrically connected to a wiring OUT1.

A constant potential is supplied to the wiring V1, the wiring V2, and the wiring V3. When the light-receiving element PD is driven with a reverse bias, the wiring V2 is supplied with a potential lower than the potential of the wiring V1. The transistor M2 is controlled by a signal supplied to the wiring RES and has a function of resetting the potential of a node connected to the gate of the transistor M3 to a potential supplied to the wiring V2. The transistor M1 is controlled by a signal supplied to the wiring TX and has a function of controlling the timing at which the potential of the node changes, in accordance with a current flowing through the light-receiving element PD. The transistor M3 functions as an amplifier transistor for performing output corresponding to the potential of the node. The transistor M4 is controlled by a signal supplied to the wiring SE and functions as a selection transistor for reading an output corresponding to the potential of the node by an external circuit connected to the wiring OUT1.

A pixel circuit PIX2 illustrated in FIG. 15B includes a light-emitting element EL, a transistor M5, a transistor M6, a transistor M7, and a capacitor C2. Here, an example in which a light-emitting diode is used as the light-emitting element EL is illustrated. In particular, an organic EL element is preferably used as the light-emitting element EL.

A gate of the transistor M5 is electrically connected to a wiring VG, one of a source and a drain of the transistor M5 is electrically connected to a wiring VS, and the other of the source and the drain is electrically connected to one electrode of the capacitor C2 and a gate of the transistor M6. One of a source and a drain of the transistor M6 is electrically connected to a wiring V4, and the other of the source and the drain is electrically connected to an anode of the light-emitting element EL and one of a source and a drain of the transistor M7. A gate of the transistor M7 is electrically connected to a wiring MS, and the other of the source and the drain is electrically connected to a wiring OUT2. A cathode of the light-emitting element EL is electrically connected to a wiring V5.

A constant potential is supplied to the wiring V4 and the wiring V5. In the light-emitting element EL, the anode side can have a high potential and the cathode side can have a lower potential than the anode side. The transistor M5 is controlled by a signal supplied to the wiring VG and functions as a selection transistor for controlling a selection state of the pixel circuit PIX2. The transistor M6 functions as a driving transistor that controls a current flowing through the light-emitting element EL in accordance with a potential supplied to the gate. When the transistor M5 is in an on state, a potential supplied to the wiring VS is supplied to the gate of the transistor M6, and the emission luminance of the light-emitting element EL can be controlled in accordance with the potential. The transistor M7 is controlled by a signal supplied to the wiring MS and has a function of outputting a potential between the transistor M6 and the light-emitting element EL to the outside through the wiring OUT2.

The wiring V1, to which the cathode of the light-receiving element PD is electrically connected, and the wiring V5, to which the cathode of the light-emitting element EL is electrically connected, can be provided in the same layer and have the same level of potential.

Note that in the display device of this embodiment, the light-emitting element may be made to emit light in a pulsed manner so as to achieve image display. A reduction in the driving time of the light-emitting element can reduce power consumption of the display device and suppress heat generation of the display device. An organic EL element is particularly preferable because of its favorable frequency characteristics. The frequency can be higher than or equal to 1 kHz and lower than or equal to 100 MHz, for example.

Here, a transistor in which a metal oxide (an oxide semiconductor) is used in a semiconductor layer where a channel is formed is preferably used as the transistor M1, the transistor M2, the transistor M3, and the transistor M4 included in the pixel circuit PIX1 and the transistor M5, the transistor M6, and the transistor M7 included in the pixel circuit PIX2.

A transistor using a metal oxide having a wider band gap and a lower carrier density than silicon can achieve an extremely low off-state current. Thus, such a low off-state current enables retention of charges accumulated in a capacitor that is connected in series with the transistor for a longtime. Therefore, it is particularly preferable to use a transistor using an oxide semiconductor as the transistor M1, the transistor M2, and the transistor M5 each of which is connected in series with the capacitor C1 or the capacitor C2. Moreover, the use of transistors using an oxide semiconductor as the other transistors can reduce the manufacturing cost.

Alternatively, transistors using silicon as a semiconductor in which a channel is formed can be used as the transistor M1 to the transistor M7. In particular, the use of silicon with high crystallinity, such as single crystal silicon or polycrystalline silicon, is preferable because high field-effect mobility is achieved and higher-speed operation is possible.

Alternatively, a transistor using an oxide semiconductor may be used as one or more of the transistor M1 to the transistor M7, and transistors using silicon may be used as the other transistors.

Although n-channel transistors are shown as the transistors in FIG. 15A and FIG. 15B, p-channel transistors can also be used.

The transistors included in the pixel circuit PIX1 and the transistors included in the pixel circuit PIX2 are preferably formed side by side over the same substrate. It is particularly preferable that the transistors included in the pixel circuits PIX1 and the transistors included in the pixel circuits PIX2 be periodically arranged in one region.

One or more layers including the transistor and/or the capacitor are preferably provided to overlap with the light-receiving element PD or the light-emitting element EL. Thus, the effective area of each pixel circuit can be reduced, and a high-definition display portion can be achieved.

This embodiment can be combined with the other embodiments as appropriate.

Embodiment 3

In this embodiment, a driving method of a display device of one embodiment of the present invention will be described with reference to FIG. 16 and FIG. 17.

In this embodiment, the case where the display device of one embodiment of the present invention functions as a touch panel is described.

High resolution is required in capturing an image of a fingerprint and thus, it is preferable that imaging data obtained with the light-receiving element be individually read out one (pixel) by one (pixel) from all the pixels. In contrast, in the case where the display device functions as a touch panel, a resolution as high as that required for fingerprint authentication is not required but a high-speed reading operation is required.

For example, when touch detection is performed all at once in a plurality of pixels, the driving frequency can be increased. The pixels in which simultaneous reading is performed can be determined as appropriate to be 4 pixels (2×2 pixels), 9 pixels (3×3 pixels), or 16 pixels (4×4 pixels), for example.

Figure 16A:
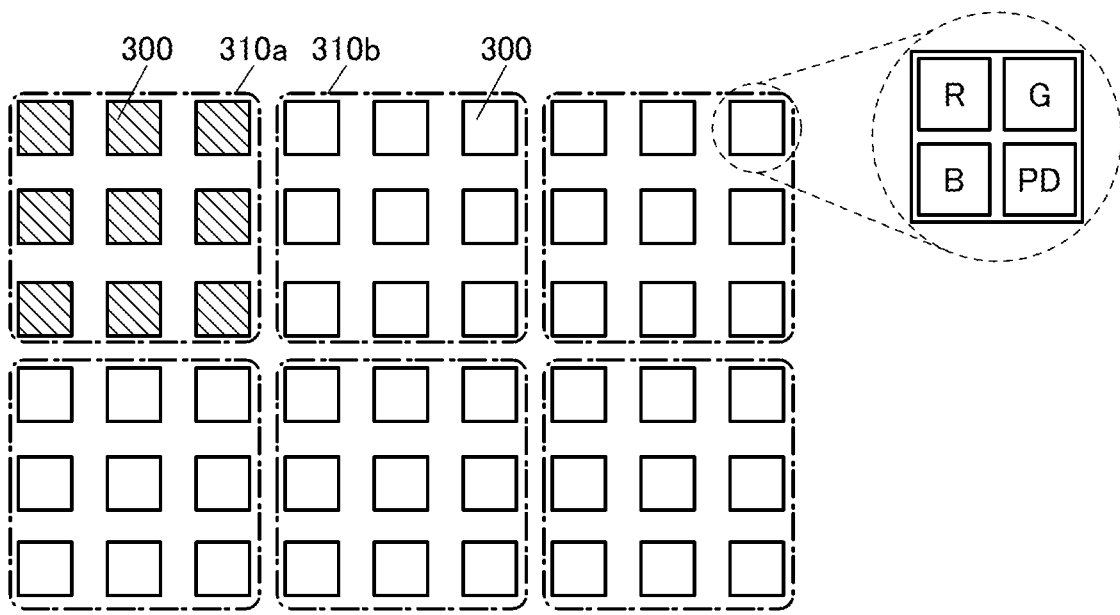
FIG. 16A and FIG. 16B are drawings showing examples of a method for driving a display device.

FIG. 16A shows an example in which imaging data of the light-receiving elements PD included in a plurality of pixels are collectively read out.

One pixel 300 includes the light-receiving element PD, a subpixel R which exhibits red light, a subpixel G which exhibits green light, and a subpixel B which exhibits blue light. Although FIG. 16A shows an example in which a unit 310 includes nine pixels 300 (3×3 pixels), the number of pixels included in the unit 310 is not particularly limited. The pixels 300 included in the same unit 310 are subjected to imaging data reading at the same time. For example, the imaging data in a unit 310a is read first; then, the imaging data in a unit 310b is read out. Thus, the number of times of reading can be smaller than that in the case where imaging data is individually read pixel by pixel, and the driving frequency can be increased. The imaging data in the unit 310a is data in which the imaging data in the plurality of pixels 300 (here, the nine pixels 300) are added together; thus, the sensitivity can be higher than that in the case where image capturing is performed pixel by pixel.

Alternatively, touch detection may be performed using only some pixels. For example, pixels used for touch detection can be determined as appropriate to be one pixel out of four pixels (2×2 pixels), one pixel out of 100 pixels (10×10 pixels), or one pixel out of 900 pixels (30×30 pixels), for example.

Figure 16B:
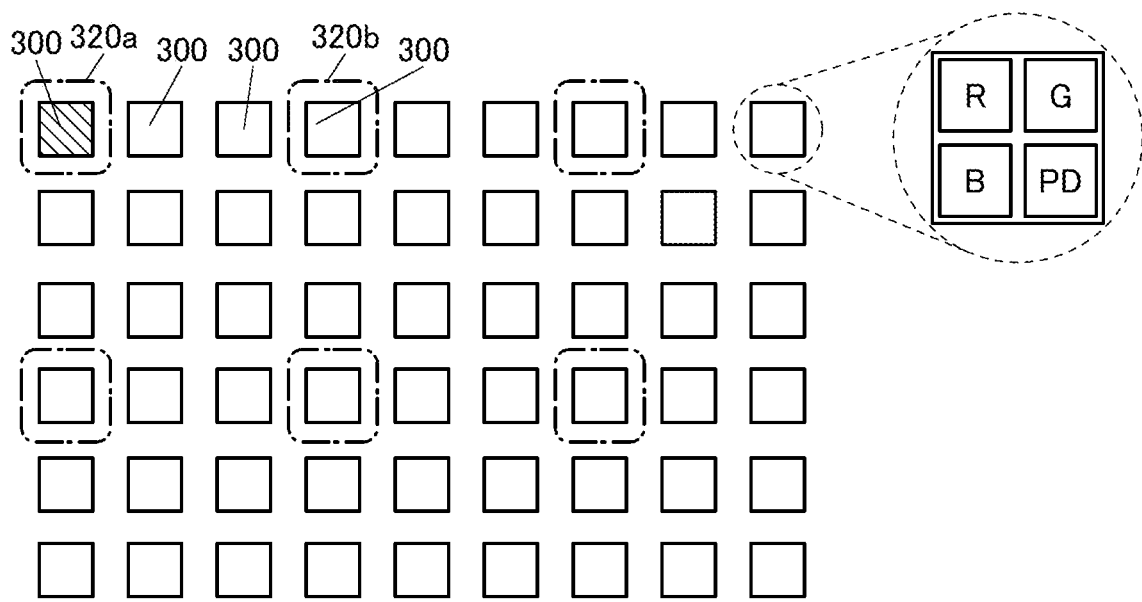

FIG. 16B illustrates examples of touch detection using only some pixels.

One pixel 300 includes the light-receiving element PD, the subpixel R which exhibits red light, the subpixel G which exhibits green light, and the subpixel B which exhibits blue light. Target pixels 320 which are a reading target are only the pixels 300 surrounded by dashed-dotted lines. FIG. 16B illustrates an example in which the number of target pixels 320 used for touch detection is one pixel out of nine pixels (3×3 pixels); however, the number of target pixels 320 is not particularly limited. First, imaging data of a target pixel 320a is read out, and imaging data of a target pixel 320b is then read out. Imaging data is not read from the pixels 300 positioned between the target pixel 320a and the target pixel 320b. Thus, the number of times of reading can be smaller than that in the case where imaging data is read pixel by pixel from all the pixels, and the driving frequency can be increased.

Note that the plurality of pixels 300 may serve as the target pixel 320 in turn. For example, in the case where one pixel out of nine pixels is used as the target pixel 320, the target pixel 320 may shift one row by one row or one column by one column so that three pixels can serve as the target pixel 320 in turn. All the nine pixels may serve as the target pixel 320 in turn.

The display device of one embodiment of the present invention preferably has two or more kinds of operation modes of the light-receiving element so that switching therebetween is possible. For example, switching between a mode of performing reading pixel by pixel individually from all the pixels and a mode of performing reading collectively from a plurality of pixels is preferably possible. Alternatively, switching between a mode of performing reading from all the pixels and a mode of performing reading from some of the pixels is preferably possible. Thus, image capturing at a high resolution can be performed in fingerprint image capturing, and touch detection at a high driving frequency can be performed in displaying an image.

Furthermore, the influence of ambient light which is noise in touch detection is preferably removed.

For example, lighting and non-lighting of the light-emitting element are made to repeat periodically in some pixels, and a difference in detection intensity of the light-receiving element between a lighting period and a non-lighting period is obtained, so that the influence of ambient light can be removed. Note that it is preferable that the number of pixels where lighting and non-lighting repeat be two or more within the range not affecting images displayed on the display device. Furthermore, lighting and non-lighting of the light-emitting element are preferably made to repeat at intervals of one frame; for example, a lighting pixel and a non-lighting pixel may be exchanged between an odd-numbered frame and an even-numbered frame. Note that the emission color in the lighting period is not particularly limited.

Figure 17A:
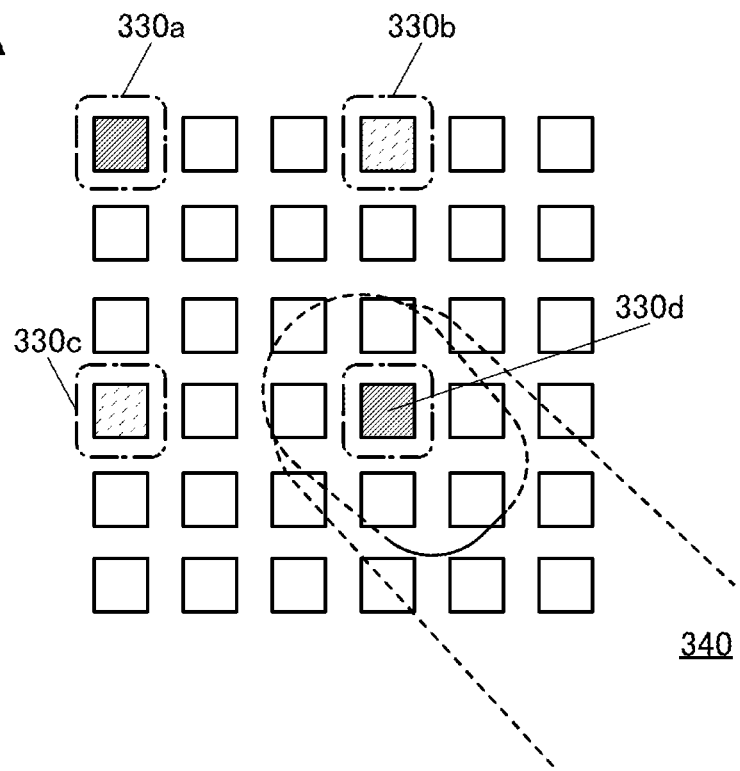
FIG. 17A and FIG. 17B are drawings showing examples of a method for driving a display device.
Figure 17B:
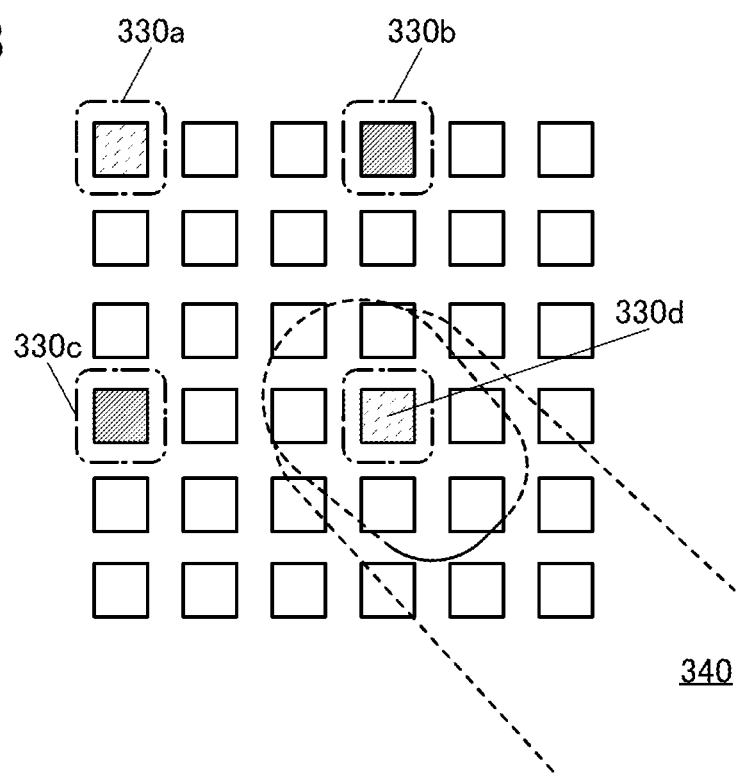

A pixel 330a and a pixel 330d are in a non-lighting state and a pixel 330b and a pixel 330c are in a lighting state in FIG. 17A, whereas the pixel 330a and the pixel 330d are in a lighting state and the pixel 330b and the pixel 330c are in a non-lighting state in FIG. 17B.

The pixel 330b detects ambient light and thus, the detection intensity of the light-receiving element does not change between the lighting period and the non-lighting period of the light source. In contrast, the pixel 330d detects the light reflected by a finger 340 and thus, the detection intensity of the light-receiving element changes between the lighting period and the non-lighting period of the light-emitting element. Utilizing this difference in detection intensity between the lighting period and the non-lighting period, the influence of ambient light can be removed.

As described above, the display device of this embodiment can be driven in either of a mode of performing image capturing for each unit and a mode of performing image capturing for each light-receiving element. For example, a mode of performing image capturing for each unit can be employed when high-speed operation is needed. Furthermore, a mode of performing image capturing pixel (light-receiving element) by pixel (light-receiving element) can be employed when high-resolution image capturing is needed. By changing the driving mode in accordance with the usage, the functionality of the display device can be increased.

This embodiment can be combined with the other embodiments as appropriate.

Embodiment 4

In this embodiment, electronic devices of embodiments of the present invention will be described with reference to FIG. 18 to FIG. 20.

An electronic device of this embodiment includes the display device of one embodiment of the present invention. For example, the display device of one embodiment of the present invention can be used in a display portion of the electronic device. The display device of one embodiment of the present invention has a function of detecting light, and is thus capable of performing biological authentication with the display portion or detecting touch or proximity on the display portion. Thus, the electronic device can have improved functionality and convenience, for example.

Examples of the electronic devices include a digital camera, a digital video camera, a digital photo frame, a mobile phone, a portable game console, a portable information terminal, and an audio reproducing device, in addition to electronic devices with a relatively large screen, such as a television device, a desktop or laptop personal computer, a monitor of a computer or the like, digital signage, and a large game machine such as a pachinko machine.

The electronic device of this embodiment may include a sensor (a sensor having a function of measuring force, displacement, position, speed, acceleration, angular velocity, rotational frequency, distance, light, liquid, magnetism, temperature, a chemical substance, sound, time, hardness, electric field, current, voltage, electric power, radiation, flow rate, humidity, gradient, oscillation, a smell, or infrared rays).

The electronic device of this embodiment can have a variety of functions. For example, the electronic device can have a function of displaying a variety of data (a still image, a moving image, a text image, and the like) on the display portion, a touch panel function, a function of displaying a calendar, date, time, and the like, a function of executing a variety of software (programs), a wireless communication function, and a function of reading out a program or data stored in a recording medium.

Figure 18A:
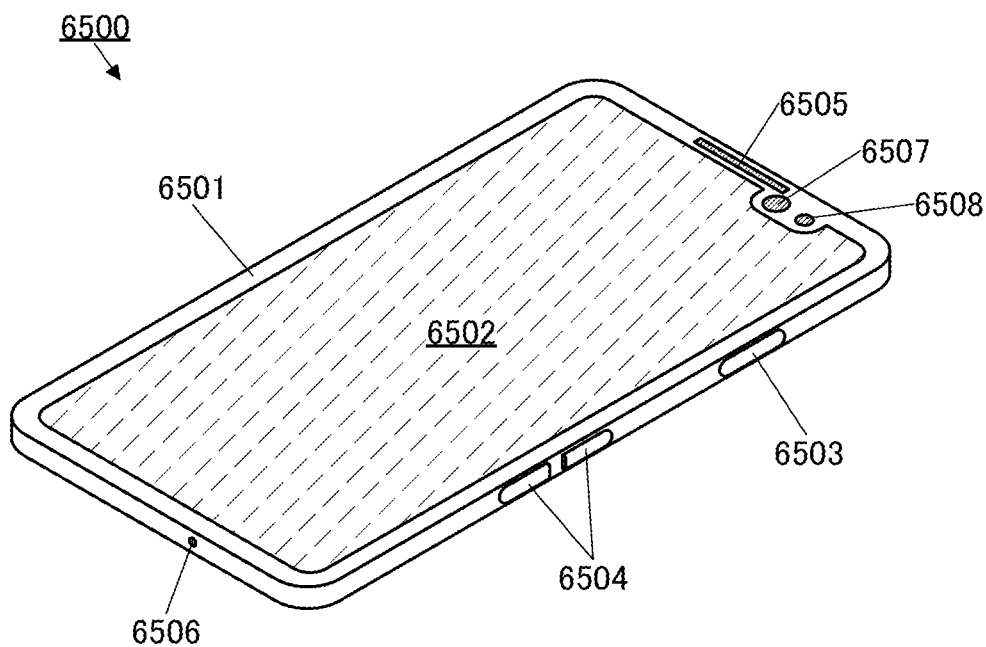
FIG. 18A and FIG. 18B are drawings showing an electronic device example.

An electronic device 6500 illustrated in FIG. 18A is a portable information terminal that can be used as a smartphone.

The electronic device 6500 includes a housing 6501, a display portion 6502, a power button 6503, buttons 6504, a speaker 6505, a microphone 6506, a camera 6507, a light source 6508, and the like. The display portion 6502 has a touch panel function.

The display device of one embodiment of the present invention can be used in the display portion 6502.

Figure 18B:
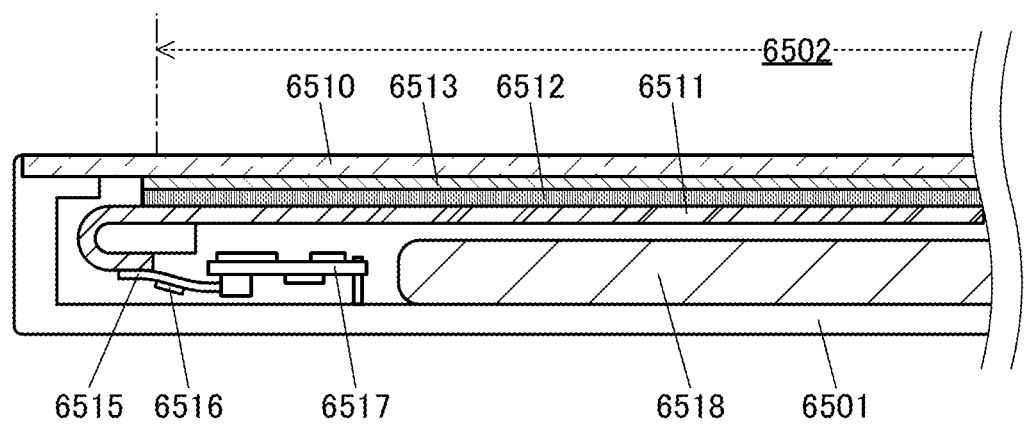

FIG. 18B is a schematic cross-sectional view including an end portion of the housing 6501 on the microphone 6506 side.

A protection member 6510 having a light-transmitting property is provided on a display surface side of the housing 6501, and a display panel 6511, an optical member 6512, a touch sensor panel 6513, a printed circuit board 6517, a battery 6518, and the like are provided in a space surrounded by the housing 6501 and the protection member 6510.

The display panel 6511, the optical member 6512, and the touch sensor panel 6513 are fixed to the protection member 6510 with an adhesive layer (not shown).

Part of the display panel 6511 is folded back in a region outside the display portion 6502, and an FPC 6515 is connected to the part that is folded back. An IC 6516 is mounted on the FPC 6515. The FPC 6515 is connected to a terminal provided on the printed circuit board 6517.

A flexible display of one embodiment of the present invention can be used as the display panel 6511. Thus, an extremely lightweight electronic device can be provided. Since the display panel 6511 is extremely thin, the battery 6518 with high capacity can be mounted with the thickness of the electronic device controlled. An electronic device with a narrow frame can be obtained when part of the display panel 6511 is folded back so that the portion connected to the FPC 6515 is positioned on the rear side of a pixel portion.

Figure 19A:
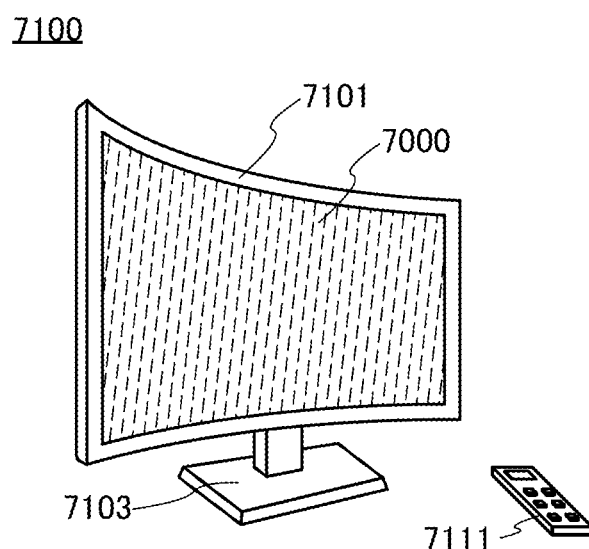
FIG. 19A to FIG. 19D are drawings showing electronic device examples.

FIG. 19A illustrates an example of a television device. In a television device 7100, a display portion 7000 is incorporated in a housing 7101. Here, a structure in which the housing 7101 is supported by a stand 7103 is illustrated.

The display device of one embodiment of the present invention can be used in the display portion 7000.

Operation of the television device 7100 illustrated in FIG. 19A can be performed with an operation switch provided in the housing 7101 or a separate remote controller 7111. Alternatively, the display portion 7000 may include a touch sensor, and the television device 7100 may be operated by touch on the display portion 7000 with a finger or the like. The remote controller 7111 may be provided with a display portion for displaying data output from the remote controller 7111. With operation keys or a touch panel provided in the remote controller 7111, channels and volume can be operated and videos displayed on the display portion 7000 can be operated.

Note that the television device 7100 has a structure in which a receiver, a modem, and the like are provided. A general television broadcast can be received with the receiver. When the television device is connected to a communication network with or without wires via the modem, one-way (from a transmitter to a receiver) or two-way (between a transmitter and a receiver or between receivers, for example) data communication can be performed.

Figure 19B:
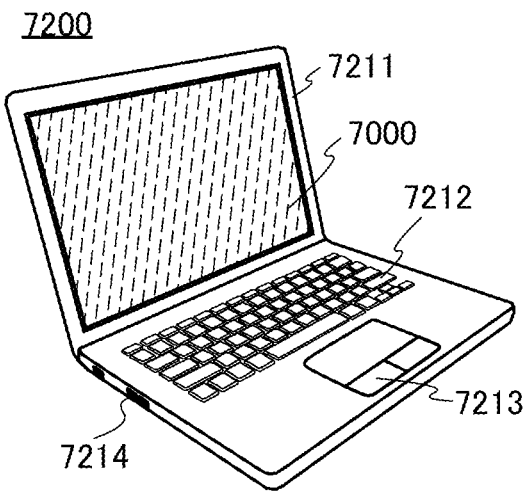

FIG. 19B illustrates an example of a laptop personal computer. A laptop personal computer 7200 includes a housing 7211, a keyboard 7212, a pointing device 7213, an external connection port 7214, and the like. In the housing 7211, the display portion 7000 is incorporated.

The display device of one embodiment of the present invention can be used in the display portion 7000.

Figure 19C:
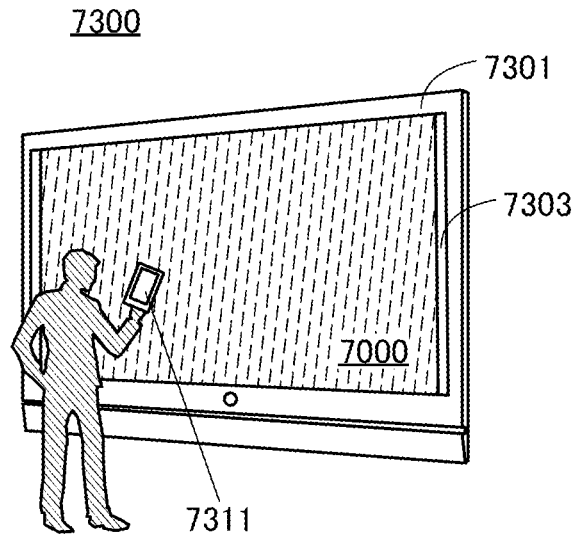
Figure 19D:
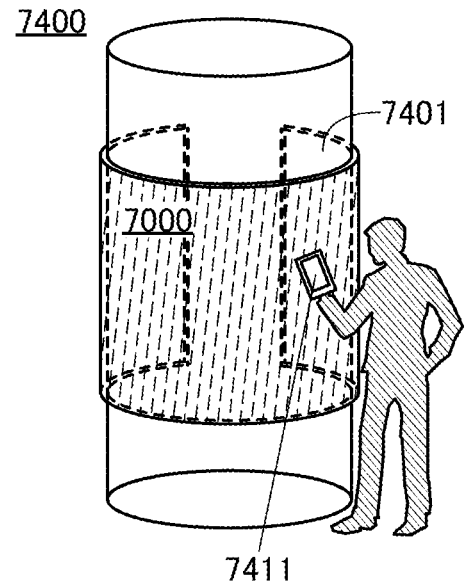

FIG. 19C and FIG. 19D illustrate examples of digital signage.

Digital signage 7300 illustrated in FIG. 19C includes a housing 7301, the display portion 7000, a speaker 7303, and the like. Furthermore, the digital signage can include an LED lamp, operation keys (including a power switch or an operation switch), a connection terminal, a variety of sensors, a microphone, and the like.

FIG. 19D is digital signage 7400 attached to a cylindrical pillar 7401. The digital signage 7400 includes the display portion 7000 provided along a curved surface of the pillar 7401.

The display device of one embodiment of the present invention can be used for the display portion 7000 in FIG. 19C and FIG. 19D.

A larger area of the display portion 7000 can increase the amount of data that can be provided at a time. The larger display portion 7000 attracts more attention, so that the effectiveness of the advertisement can be increased, for example.

The use of a touch panel in the display portion 7000 is preferable because in addition to display of a still image or a moving image on the display portion 7000, intuitive operation by a user is possible. Moreover, for an application for providing information such as route information or traffic information, usability can be enhanced by intuitive operation.

As illustrated in FIG. 19C and FIG. 19D, it is preferable that the digital signage 7300 or the digital signage 7400 can work with an information terminal 7311 or an information terminal 7411 such as a smartphone a user has through wireless communication. For example, information of an advertisement displayed on the display portion 7000 can be displayed on a screen of the information terminal 7311 or the information terminal 7411. By operation of the information terminal 7311 or the information terminal 7411, display on the display portion 7000 can be switched.

It is possible to make the digital signage 7300 or the digital signage 7400 execute a game with use of the screen of the information terminal 7311 or the information terminal 7411 as an operation means (controller). Thus, an unspecified number of users can join in and enjoy the game concurrently.

Electronic devices shown in FIG. 20A to FIG. 20F include a housing 9000, a display portion 9001, a speaker 9003, an operation key 9005 (including a power switch or an operation switch), a connection terminal 9006, a sensor 9007 (a sensor having a function of measuring force, displacement, position, speed, acceleration, angular velocity, rotational frequency, distance, light, liquid, magnetism, temperature, a chemical substance, sound, time, hardness, electric field, current, voltage, electric power, radiation, flow rate, humidity, gradient, oscillation, a smell, or infrared rays), a microphone 9008, and the like.

The electronic devices shown in FIG. 20A to FIG. 20F have a variety of functions. For example, the electronic devices can have a function of displaying a variety of data (a still image, a moving image, a text image, and the like) on the display portion, a touch panel function, a function of displaying a calendar, date, time, and the like, a function of controlling processing with use of a variety of software (programs), a wireless communication function, and a function of reading out and processing a program or data stored in a recording medium. Note that the functions of the electronic devices are not limited thereto, and the electronic devices can have a variety of functions. The electronic devices may include a plurality of display portions. The electronic devices may each include a camera or the like and have a function of taking a still image or a moving image and storing the taken image in a recording medium (an external recording medium or a recording medium incorporated in the camera), a function of displaying the taken image on the display portion, or the like.

The details of the electronic devices illustrated in FIG. 20A to FIG. 20F are described below.

Figure 20A:
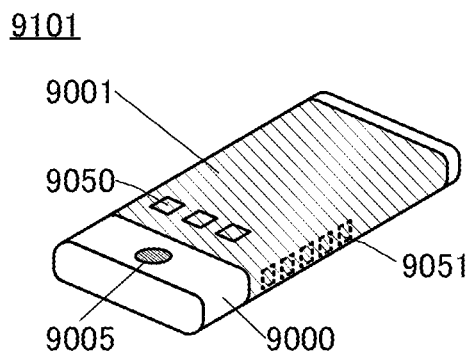
FIG. 20A to FIG. 20F are drawings showing electronic device examples.

FIG. 20A is a perspective view showing a portable information terminal 9101. For example, the portable information terminal 9101 can be used as a smartphone. Note that the portable information terminal 9101 may be provided with the speaker 9003, the connection terminal 9006, the sensor 9007, or the like. The portable information terminal 9101 can display characters and image information on its plurality of surfaces. FIG. 20A shows an example where three icons 9050 are displayed. Information 9051 indicated by dashed rectangles can be displayed on another surface of the display portion 9001. Examples of the information 9051 include notification of reception of an e-mail, SNS, or an incoming call, the title and sender of an e-mail, SNS, or the like, the date, the time, remaining battery, and the reception strength of an antenna. Alternatively, the icon 9050 or the like may be displayed in the position where the information 9051 is displayed.

Figure 20B:
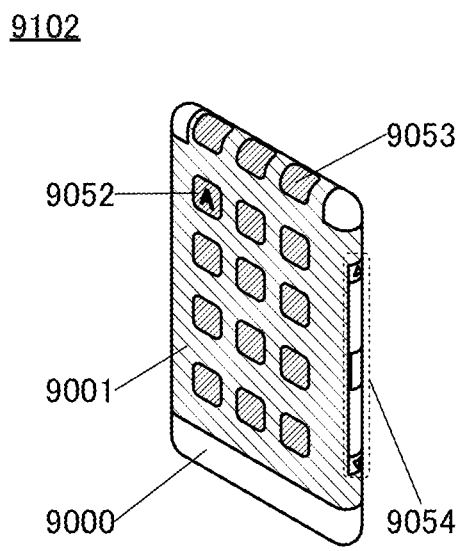

FIG. 20B is a perspective view showing a portable information terminal 9102. The portable information terminal 9102 has a function of displaying information on three or more surfaces of the display portion 9001. Here, an example in which information 9052, information 9053, and information 9054 are displayed on different surfaces is shown. For example, a user can check the information 9053 displayed in a position that can be observed from above the portable information terminal 9102, with the portable information terminal 9102 put in a breast pocket of his/her clothes. The user can seethe display without taking out the portable information terminal 9102 from the pocket and decide whether to answer the call, for example.

Figure 20C:
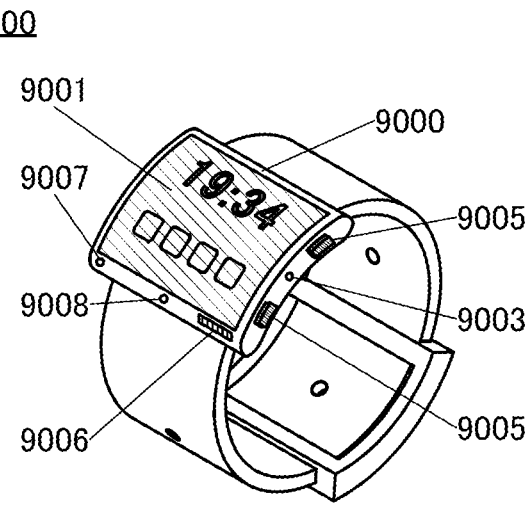

FIG. 20C is a perspective view showing a watch-type portable information terminal 9200. For example, the portable information terminal 9200 can be used as a smartwatch. The display surface of the display portion 9001 is curved and provided, and display can be performed along the curved display surface. Mutual communication between the portable information terminal 9200 and, for example, a headset capable of wireless communication enables hands-free calling. With the connection terminal 9006, the portable information terminal 9200 can perform mutual data transmission with another information terminal and charging. Note that the charging operation may be performed by wireless power feeding.

Figure 20D:
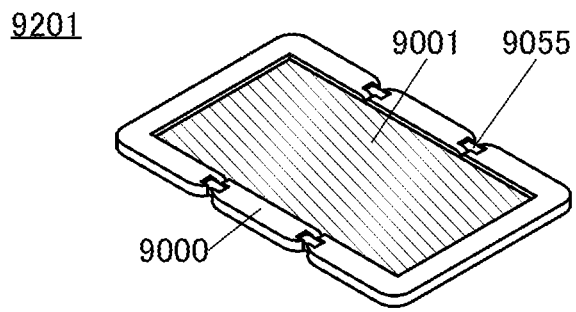
Figure 20E:
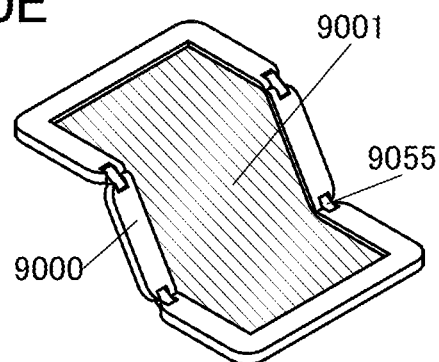
Figure 20F:
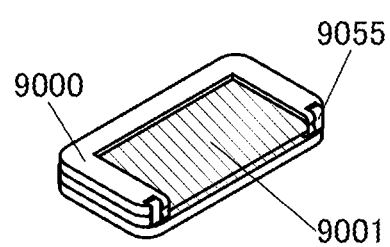

FIG. 20D to FIG. 20F are perspective views showing a foldable portable information terminal 9201. FIG. 20D is a perspective view of an opened state of the portable information terminal 9201, FIG. 20F is a perspective view of a folded state thereof, and FIG. 20E is a perspective view of a state in the middle of change from one of FIG. 20D and FIG. 20F to the other. The portable information terminal 9201 is highly portable in the folded state and is highly browsable in the opened state because of a seamless large display region. The display portion 9001 of the portable information terminal 9201 is supported by three housings 9000 joined by hinges 9055. For example, the display portion 9001 can be folded with a radius of curvature greater than or equal to 0.1 mm and less than or equal to 150 mm.

This embodiment can be combined with the other embodiments as appropriate.

Example 1

In this example, results of evaluation of light-emitting and -receiving elements that were fabricated to be used for the display device of one embodiment of the present invention will be described. Note that an element that functions as both a light-emitting element and a light-receiving element will be referred to as a light-emitting and -receiving element below.

In this example, two light-emitting and -receiving elements (Device 1 and Device 2) were fabricated. The light-emitting and -receiving elements fabricated in this example had a structure in common with a light-emitting element (organic EL element).

Chemical formulae of materials used in this example are shown below.

[Chemical 1]

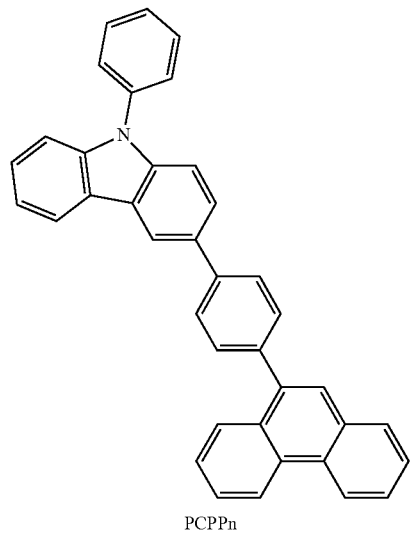

PCPPn

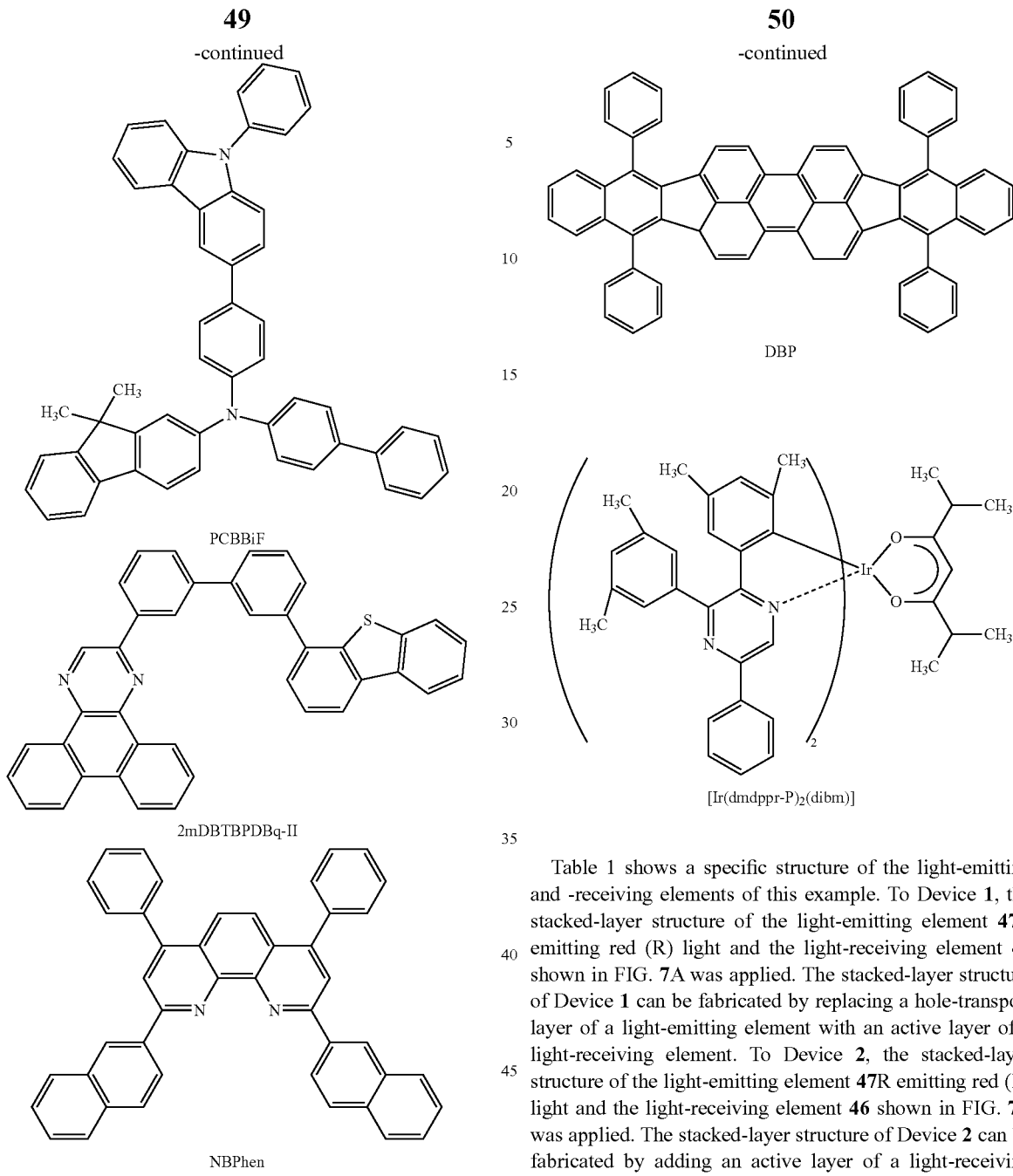

Table 1 shows a specific structure of the light-emitting and -receiving elements of this example. To Device 1, the stacked-layer structure of the light-emitting element 47R emitting red (R) light and the light-receiving element 46 shown in FIG. 7A was applied. The stacked-layer structure of Device 1 can be fabricated by replacing a hole-transport layer of a light-emitting element with an active layer of a light-receiving element. To Device 2, the stacked-layer structure of the light-emitting element 47R emitting red (R) light and the light-receiving element 46 shown in FIG. 7B was applied. The stacked-layer structure of Device 2 can be fabricated by adding an active layer of a light-receiving element to a light-emitting element.

TABLE 1

|  | First electrode | Hole-injection layer | Active layer | Hole-transport layer | Light-emitting layer | Electron-transport layer | Electron-injection layer | Second electrode | |
|---|---|---|---|---|---|---|---|---|---|
| Device 1 | APC\ITSO 100 nm\ 100 nm | PCPPn:MoOx (=2:1) 15 nm | $C_{70}$:DBP = 9:1 50 nm | | * | 2mDBTBPDBq-II 10 nm | NBPhen 10 nm | LiF 1 nm | Ag:Mg (=10:1) 10 nm | ITO 40 nm |
| Device 2 | | | | PCBBiF 15 nm | | | | | |

* 2mDBTBPDBq-II:PCBBiF:[Ir(dmdppr-P)2(dibm)] 0.8:0.2:0.06 70 nm

A first electrode was formed by depositing an alloy of silver (Ag), palladium (Pd), and copper (Cu) (Ag—Pd—Cu (APC)) by a sputtering method to a thickness of 100 nm and depositing indium tin oxide containing silicon oxide (ITSO) by a sputtering method to a thickness of 100 nm.

A hole-injection layer was formed by co-evaporating 3-[4-(9-phenanthryl)-phenyl]-9-phenyl-9H-carbazole (abbreviation: PCPPn) and molybdenum oxide with a weight ratio of PCPPn:molybdenum oxide=2:1. The hole-injection layer was formed to have a thickness of 15 nm.

An active layer was formed by co-evaporating fullerene ($C_{70}$) and tetraphenyldibenzoperiflanthene (abbreviation: DBP) with a weight ratio of $C_{70}$:DBP=9:1. The active layer was formed to have a thickness of 60 nm.

A hole-transport layer was not provided in Device 1 but provided in Device 2. For the hole-transport layer, N-(1,1'-biphenyl-4-yl)-N-[4-(9-phenyl-9H-carbazol-3-yl)phenyl]-9,9-dimethyl-9H-fluoren-2-amine (abbreviation: PCBBiF) was used and deposited by evaporation to a thickness of 70 nm.

For a light-emitting layer, 2-[3'-(dibenzothiophen-4-yl) biphenyl-3-yl]dibenzo[f,h]quinoxaline (abbreviation: 2mDBTBPDBq-II), PCBBiF, and bis{4,6-dimethyl-2-[3-(3,5-dimethylphenyl)-5-phenyl-2-pyrazinyl-N]phenyl-κC}(2,6-dimethyl-3,5-heptanedionato-κ2O,O')iridium(III) (abbreviation: [Ir(dmdppr-P)$_2$(dibm)]) were used and deposited by co-evaporation such that the light-emitting layer was formed to have a weight ratio of 0.8:0.2:0.06 (=2mDBTBPDBq-II: PCBBiF: [Ir(dmdppr-P)$_2$(dibm)]) and a thickness of 70 nm.

An electron-transport layer was formed by sequential deposition by evaporation so that the thickness of 2mDBTBPDBq-II was 10 nm and the thickness of 2,9-bis(naphthalen-2-yl)-4,7-diphenyl-1,10-phenanthroline (abbreviation: NBPhen) was 10 nm.

An electron-injection layer was formed to a thickness of 1 nm by evaporation using lithium fluoride (LiF).

A second electrode was formed in the following manner: silver (Ag) and magnesium (Mg) were deposited by co-evaporation with a volume ratio of 10:1 to have a thickness of 10 nm; then, indium tin oxide (ITO) was formed by a sputtering method to have a thickness of 40 nm.

In the above manner, the light-emitting and -receiving elements of this example were fabricated.

[Characteristics as Light-Emitting Element]

Figure 21:
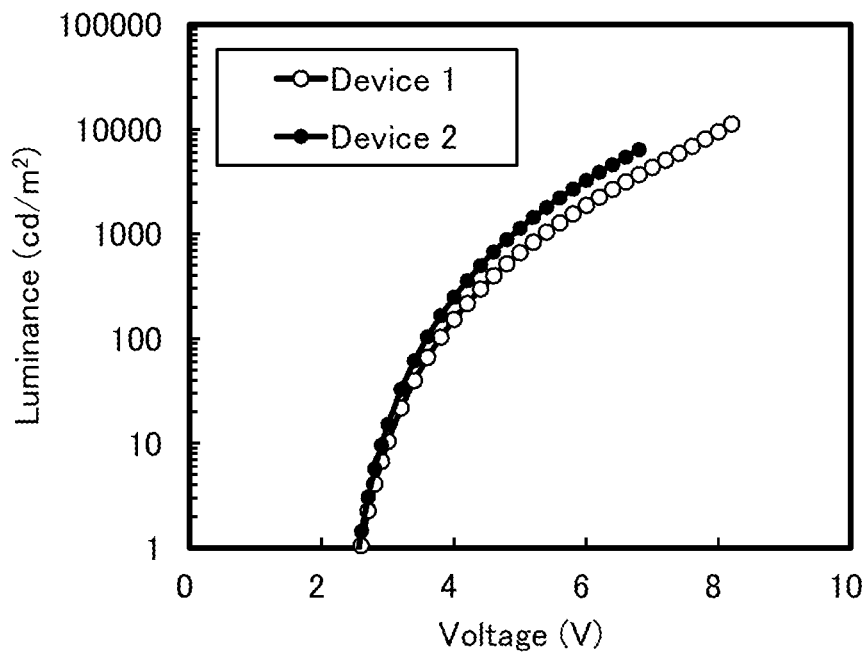
FIG. 21 is a graph showing voltage-luminance characteristics of light-emitting and -receiving elements.
Figure 22:
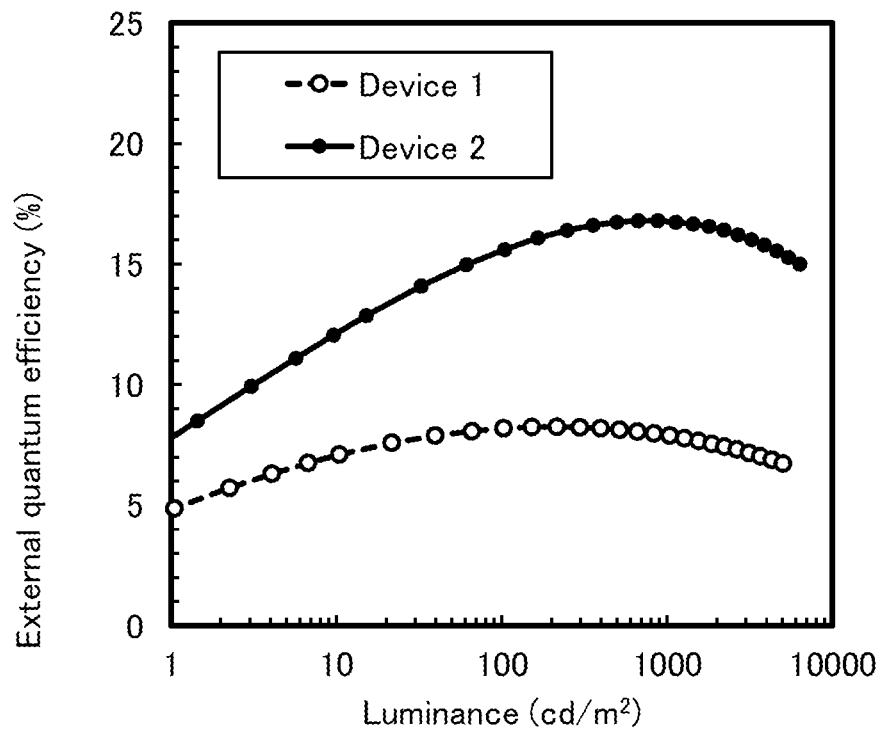
FIG. 22 is a graph showing luminance-external quantum efficiency characteristics of light-emitting and -receiving elements.

First, the characteristics of the light-emitting and -receiving elements as light-emitting elements (characteristics at the time of application of forward bias) were evaluated. FIG. 21 shows voltage-luminance characteristics of the light-emitting and -receiving elements. FIG. 22 shows luminance-external quantum efficiency characteristics of the light-emitting and -receiving elements.

Normal operation of Device 1 and Device 2 as light-emitting elements was observed. In particular, Device 2 in which the hole-transport layer was provided between the active layer and the light-emitting layer had high external quantum efficiency.

[Characteristics as Light-Receiving Element]

Figure 23:
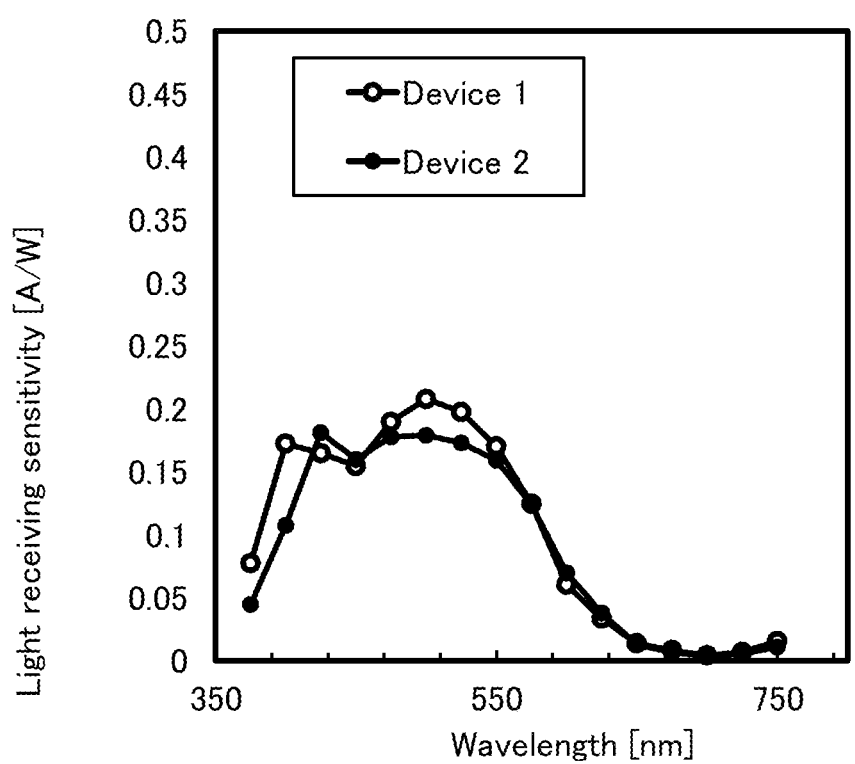
FIG. 23 is a graph showing wavelength dependence of light receiving sensitivity of light-emitting and -receiving elements.

Next, the characteristics of the light-emitting and -receiving elements as light-receiving elements (characteristics at the time of application of reverse bias) were evaluated. FIG. 23 shows wavelength dependence of light receiving sensitivity of the light-emitting and -receiving elements. The measurement conditions were as follows: the voltage was −6 V and light irradiation was performed at 10 μW/cm$^2$. Note that the applied voltage is a value in the case where a bias usually applied to an EL device is positive. That is, a bias is positive when the first electrode side has a high potential and the second electrode side has a low potential.

Normal operation of Device 1 and Device 2 as light-receiving elements was observed.

As described above, in this example, the light-emitting and -receiving elements having a structure in common with a light-emitting element (organic EL element) were fabricated and they were able to have favorable characteristics as both light-emitting elements and light-receiving elements.

This example showed that Device 1 and Device 2 can each operate as a light-emitting element and operate as a light-receiving element. Therefore, it was found that the structure of Device 1 or Device 2 can be shared by the light-emitting element 47R and the light-receiving element 46.

REFERENCE NUMERALS

C1: capacitor, C2: capacitor, IR: light-emitting element, M1: transistor, M2: transistor, M3: transistor, M4: transistor, M5: transistor, M6: transistor, M7: transistor, OUT1: wiring, OUT2: wiring, PD: light-receiving element, PIX1: pixel circuit, PIX2: pixel circuit, V1: wiring, V2: wiring, V3: wiring, V4: wiring, V5: wiring, 10A: display device, 10B: display device, 10C: display device, 10D: display device, 10E: display device, 10F: display device, 21B: light, 21G: light, 21R: light, 22: light, 23a: light, 23b: reflected light, 41: transistor, 42: transistor, 46: light-receiving element, 47: light-emitting element, 47B: light-emitting element, 47G: light-emitting element, 47R: light-emitting element, 50A: display device, 50B: display device, 51: substrate, 52: finger, 53: layer including light-receiving element, 55: layer including transistor, 57: layer including light-emitting element, 59: substrate, 100A: display device, 100B: display device, 100C: display device, 100D: display device, 110: light-receiving element, 112: common layer, 114: common layer, 115: common electrode, 142: adhesive layer, 143: space, 148a: colored layer, 149: lens, 151: substrate, 152: substrate, 153: substrate, 154: substrate, 155: adhesive layer, 162: display portion, 164: circuit, 165: wiring, 166: conductive layer, 172: FPC, 173: IC, 181: pixel electrode, 182: buffer layer, 183: active layer, 184: buffer layer, 190: light-emitting element, 190B: light-emitting element, 190G: light-emitting element, 190R: light-emitting element, 191: pixel electrode, 191B: pixel electrode, 191G: pixel electrode, 192: buffer layer, 192B: buffer layer, 192G: buffer layer, 192R: buffer layer, 193: light-emitting layer, 193B: light-emitting layer, 193G: light-emitting layer, 193R: light-emitting layer, 193Y: light-emitting layer, 194: buffer layer, 194B: buffer layer, 194G: buffer layer, 194R: buffer layer, 195: protective layer, 195a: inorganic insulating layer, 195b: organic insulating layer, 195c: inorganic insulating layer, 201: transistor, 204: connection portion, 205: transistor, 206: transistor, 207: transistor, 208: transistor, 209: transistor, 210: transistor, 211: insulating layer, 212: insulating layer, 213: insulating layer, 214: insulating layer, 215: insulating layer, 216: bank, 217: bank, 218: insulating layer, 221: conductive layer, 222a: conductive layer, 222b: conductive layer, 223: conductive layer, 225: insulating layer, 228: region, 231: semiconductor layer, 300: pixel, 310: unit, 310a: unit, 310b: unit, 320: target pixel, 320a: target pixel, 320b: target pixel, 330a: pixel, 330b: pixel, 330c: pixel, 330d: pixel, 340 finger, 231i: channel formation region, 231n: low-resistance region, 242: connection layer, 6500: electronic device, 6501: housing, 6502: display portion, 6503: power button, 6504: button, 6505: speaker, 6506: microphone, 6507: camera, 6508: light source, 6510: protection member, 6511: display panel, 6512:

optical member, 6513: touch sensor panel, 6515: FPC, 6516: IC, 6517: printed circuit board, 6518: battery, 7000: display portion, 7100: television device, 7101: housing, 7103: stand, 7111: remote controller, 7200: laptop personal computer, 7211: housing, 7212: keyboard, 7213: pointing device, 7214: external connection port, 7300: digital signage, 7301: housing, 7303: speaker, 7311: information terminal, 7400: digital signage, 7401: pillar, 7411: information terminal, 9000: housing, 9001: display portion, 9003: speaker, 9005: operation key, 9006: connection terminal, 9007: sensor, 9008: microphone, 9050: icon, 9051: information, 9052: information, 9053: information, 9054: information, 9055: hinge, 9101: portable information terminal, 9102: portable information terminal, 9200: portable information terminal, 9201: portable information terminal This application is based on Japanese Patent Application Serial No. 2019-006569 filed on Jan. 18, 2019 and Japanese Patent Application Serial No. 2019-132202 filed on Jul. 17, 2019, the entire contents of which are hereby incorporated herein by reference.

The invention claimed is:

1. A display device comprising a display portion,
    wherein the display portion comprises a light-receiving element, a first light-emitting element, and a second light-emitting element,
    wherein the light-receiving element comprises a first pixel electrode, a first light-emitting layer, an active layer, and a common electrode,
    wherein the first light-emitting layer and the active layer are positioned between the first pixel electrode and the common electrode,
    wherein the first light-emitting element comprises a second pixel electrode, the first light-emitting layer, the active layer, and the common electrode,
    wherein the first light-emitting layer and the active layer are positioned between the second pixel electrode and the common electrode,
    wherein the second light-emitting element comprises a third pixel electrode, a second light-emitting layer, and the common electrode,
    wherein the second light-emitting layer is positioned between the third pixel electrode and the common electrode,
    wherein the first light-emitting layer emits light of a first color, and
    wherein the active layer comprises an organic compound which absorbs light with a wavelength shorter than a wavelength of the light of the first color.

2. The display device according to claim 1,
    wherein the light-receiving element and the first light-emitting element further comprise a common layer, and
    wherein the common layer is positioned between the first pixel electrode and the common electrode and between the second pixel electrode and the common electrode.

3. The display device according to claim 1,
    wherein the display portion further comprises a lens,
    wherein the lens comprises a portion overlapping with the light-receiving element, and
    wherein light transmitted through the lens enters the light-receiving element.

4. The display device according to claim 1,
    wherein the display portion further comprises a bank,
    wherein the bank covers an end portion of the first pixel electrode and an end portion of the second pixel electrode, and
    wherein the bank is configured to electrically isolate the first pixel electrode and the second pixel electrode.

5. The display device according to claim 4,
    wherein the bank is configured to absorb at least part of light emitted by the first light-emitting element.

6. The display device according to claim 5,
    wherein the display portion further comprises a colored layer, and
    wherein the colored layer comprises a portion in contact with one or both of a top surface and a side surface of the bank.

7. The display device according to claim 6,
    wherein the colored layer comprises a color filter or a black matrix.

8. The display device according to claim 4,
    wherein the display portion further comprises a lens,
    wherein the lens comprises a portion overlapping with the light-receiving element, and
    wherein light transmitted through the lens enters the light-receiving element.

9. The display device according to claim 8,
    wherein the display portion further comprises a light-blocking layer,
    wherein an end portion of the light-blocking layer overlaps with an end portion of the lens, and
    wherein the light-blocking layer overlaps with the bank.

10. The display device according to claim 1,
    wherein the display portion has flexibility.

11. A display module comprising:
    the display device according to claim 1; and
    a connector or an integrated circuit.

12. An electronic device comprising:
    the display module according to claim 11; and
    at least one of an antenna, a battery, a housing, a camera, a speaker, a microphone, and an operation button.

13. A display device comprising a display portion,
    wherein the display portion comprises a light-receiving element, a first light-emitting element, a second light-emitting element, a first coloring layer, and a second coloring layer,
    wherein the light-receiving element comprises a first pixel electrode, a first light-emitting layer, an active layer, and a common electrode,
    wherein the first light-emitting layer and the active layer are positioned between the first pixel electrode and the common electrode,
    wherein the first light-emitting element comprises a second pixel electrode, the first light-emitting layer, the active layer, and the common electrode,
    wherein the first light-emitting layer and the active layer are positioned between the second pixel electrode and the common electrode,
    wherein the second light-emitting element comprises a third pixel electrode, a second light-emitting layer, and the common electrode,
    wherein the second light-emitting layer is positioned between the third pixel electrode and the common electrode,
    wherein light emitted by the first light-emitting element is extracted from the display portion through the first coloring layer as light of a first color,
    wherein light emitted by the second light-emitting element is extracted from the display portion through the second coloring layer as light of a second color, and
    wherein the active layer comprises an organic compound which absorbs light with a wavelength shorter than a wavelength of the light of the first color.

14. The display device according to claim 13,
wherein the display portion further comprises a third light-emitting element and a third coloring layer,
wherein the third light-emitting element comprises a fourth pixel electrode, a third light-emitting layer, and the common electrode,
wherein the third light-emitting layer is positioned between the second pixel electrode and the common electrode, between the third pixel electrode and the common electrode, and between the fourth pixel electrode and the common electrode, and
wherein light emitted by the third light-emitting element is extracted from the display portion through the third coloring layer as light of a third color.

15. The display device according to claim 13, wherein the display portion has flexibility.

16. The display device according to claim 13,
wherein the light-receiving element and the first light-emitting element further comprise a common layer, and
wherein the common layer is positioned between the first pixel electrode and the common electrode and between the second pixel electrode and the common electrode.

17. The display device according to claim 13,
wherein the display portion further comprises a lens,
wherein the lens comprises a portion overlapping with the light-receiving element, and
wherein light transmitted through the lens enters the light-receiving element.

18. The display device according to claim 13,
wherein the display portion further comprises a bank,
wherein the bank covers an end portion of the first pixel electrode and an end portion of the second pixel electrode, and
wherein the bank is configured to electrically isolate the first pixel electrode and the second pixel electrode.

19. The display device according to claim 18,
wherein the bank is configured to absorb at least part of light emitted by the first light-emitting element.

20. The display device according to claim 19,
wherein the bank is configured to absorb at least part of light emitted by the first light-emitting element.

\* \* \* \* \*